(12) United States Patent
Miyama et al.

(10) Patent No.: US 10,628,356 B2
(45) Date of Patent: Apr. 21, 2020

(54) TRANSMISSION APPARATUS AND TRANSMISSION METHOD

(71) Applicant: FUJITSU LIMITED, Kawasaki-shi, Kanagawa (JP)

(72) Inventors: Kenichi Miyama, Ashikaga (JP); Masato Hori, Oyama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/193,621

(22) Filed: Nov. 16, 2018

(65) Prior Publication Data

US 2019/0155776 A1 May 23, 2019

(30) Foreign Application Priority Data

Nov. 20, 2017 (JP) ................................ 2017-222840

(51) Int. Cl.
| | |
|---|---|
| *G06F 13/36* | (2006.01) |
| *H03K 19/003* | (2006.01) |
| *H03K 19/0175* | (2006.01) |
| *G06F 11/00* | (2006.01) |

(52) U.S. Cl.
CPC .............. *G06F 13/36* (2013.01); *G06F 11/00* (2013.01); *H03K 19/003* (2013.01); *H03K 19/017545* (2013.01); *G06F 2213/0016* (2013.01)

(58) Field of Classification Search
None
See application file for complete search history.

(56) References Cited

U.S. PATENT DOCUMENTS

| | | | | |
|---|---|---|---|---|
| 6,081,473 | A | * | 6/2000 | Agrawal .......... H03K 19/17736 326/38 |
| 6,211,695 | B1 | * | 4/2001 | Agrawal .......... H03K 19/17728 326/38 |
| 7,111,183 | B1 | * | 9/2006 | Klein ........................ G06F 1/26 713/1 |
| 10,204,066 | B2 | * | 2/2019 | Miluzzi ................. G06F 13/364 |
| 2002/0176009 | A1 | * | 11/2002 | Johnson ................. H04N 5/335 348/229.1 |

(Continued)

FOREIGN PATENT DOCUMENTS

JP 09-034749 2/1997

*Primary Examiner* — Ilwoo Park
*Assistant Examiner* — Aurangzeb Hassan
(74) *Attorney, Agent, or Firm* — Fujitsu Patent Center

(57) ABSTRACT

A transmission apparatus includes a logic circuit for performing a predetermined process, and outputting a logic output signal depending on the process, an open-drain signal generation circuit, connectable at an input terminal to the logic circuit and at an output terminal to a pull-up resistor, and a transmission path failure determination circuit for determining whether there is a failure in a transmission path which transmits a signal outputted from the logic circuit via the open-drain signal generation circuit, wherein the transmission path failure determination circuit includes an edge waveform information obtaining circuit for obtaining edge waveform information indicating a waveform of at least one of a rising edge and a falling edge of an application signal, and a failure determination circuit for determining whether the edge waveform information satisfies a predetermined condition, and outputting a failure signal indicating that there is a failure in the transmission path.

10 Claims, 48 Drawing Sheets

(56) References Cited

U.S. PATENT DOCUMENTS

| | | | |
|---|---|---|---|
| 2003/0093607 A1* | 5/2003 | Main | G06F 13/4045 710/306 |
| 2006/0020350 A1* | 1/2006 | Khanchin | G05B 19/41845 700/11 |
| 2008/0046624 A1* | 2/2008 | Rubin | G06F 13/4072 710/302 |
| 2008/0136256 A1* | 6/2008 | Gattani | H04L 12/66 307/2 |
| 2011/0227605 A1* | 9/2011 | Watanabe | H03K 19/00 326/38 |
| 2013/0322462 A1* | 12/2013 | Poulsen | H04J 3/06 370/458 |

* cited by examiner

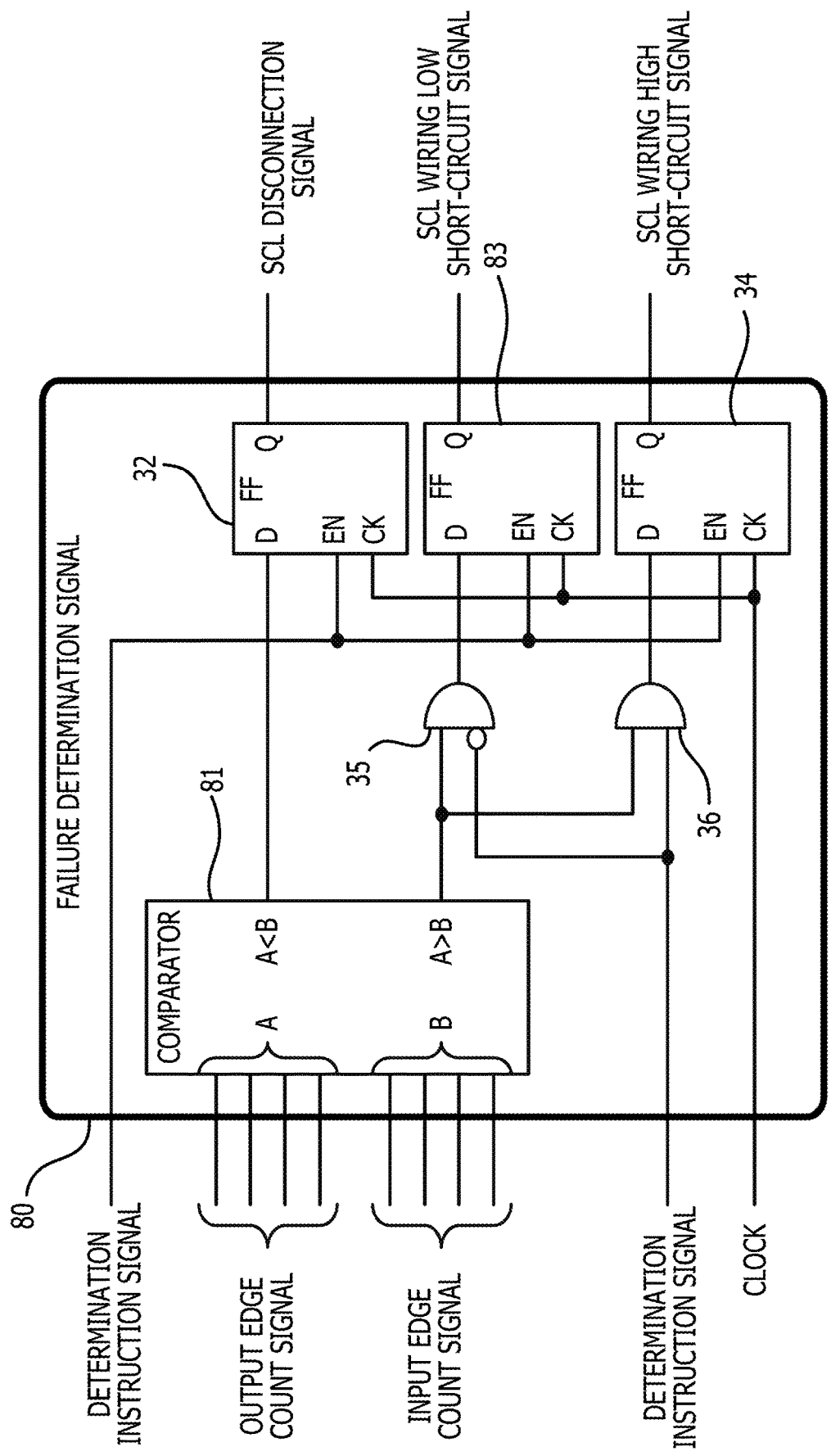

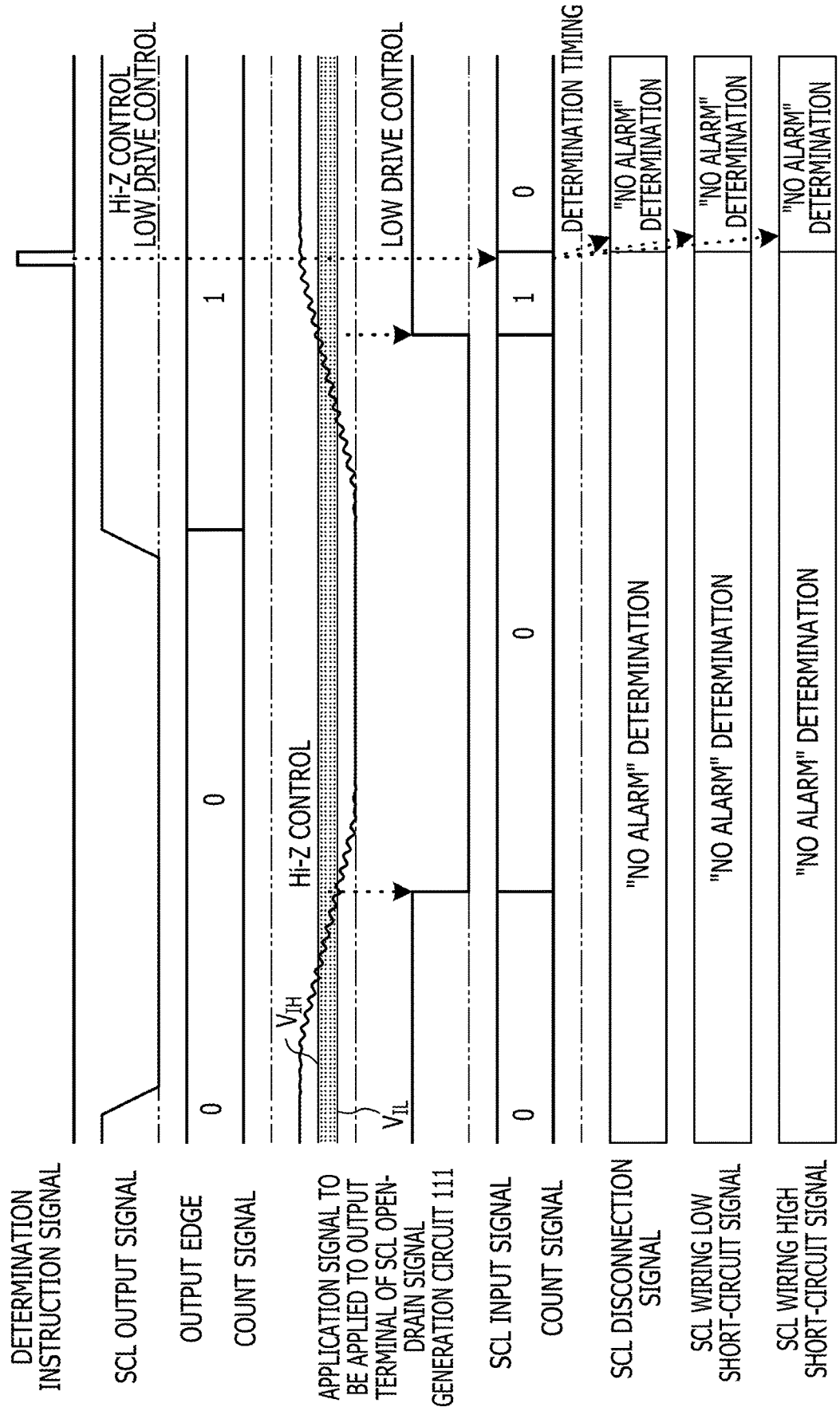

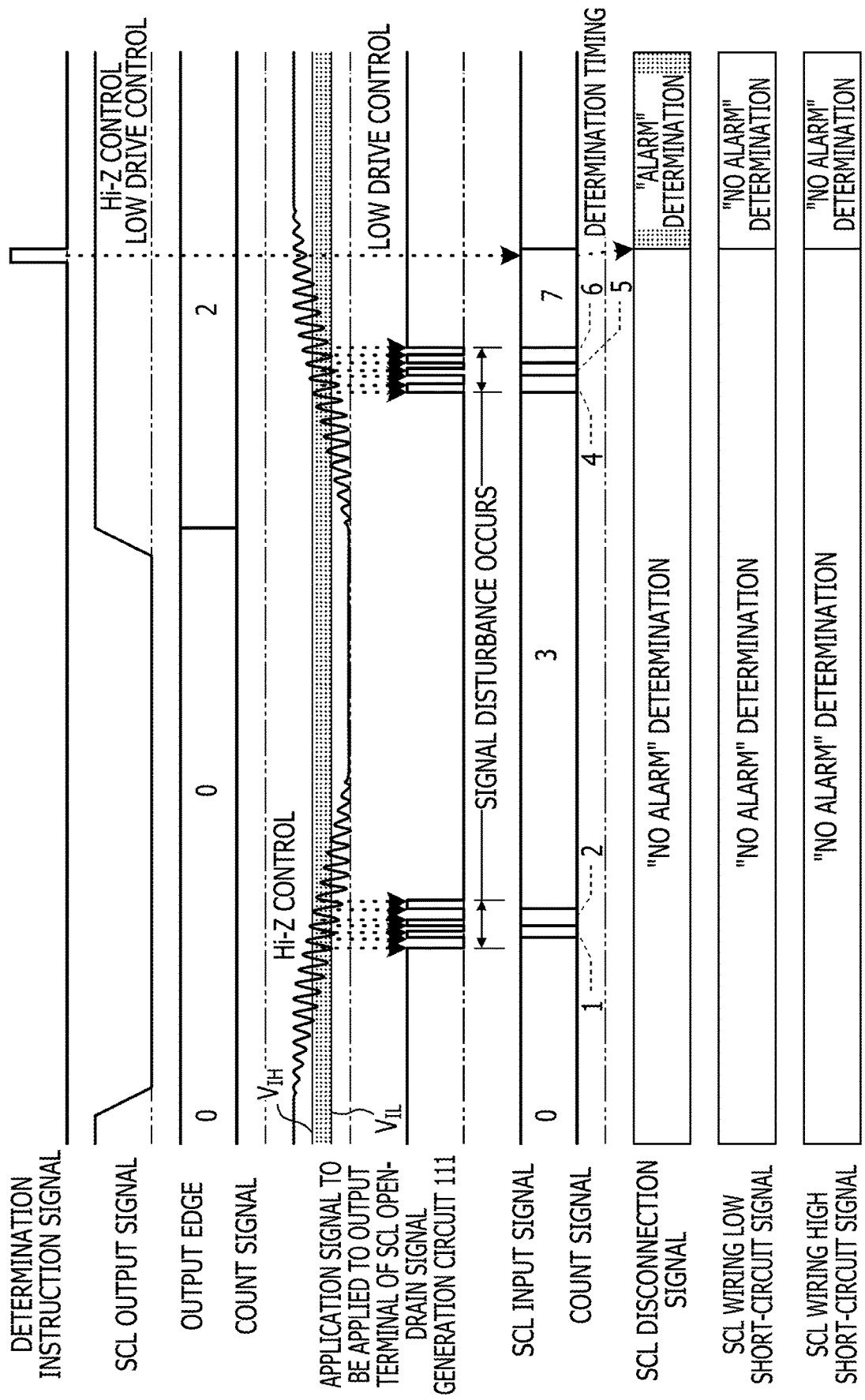

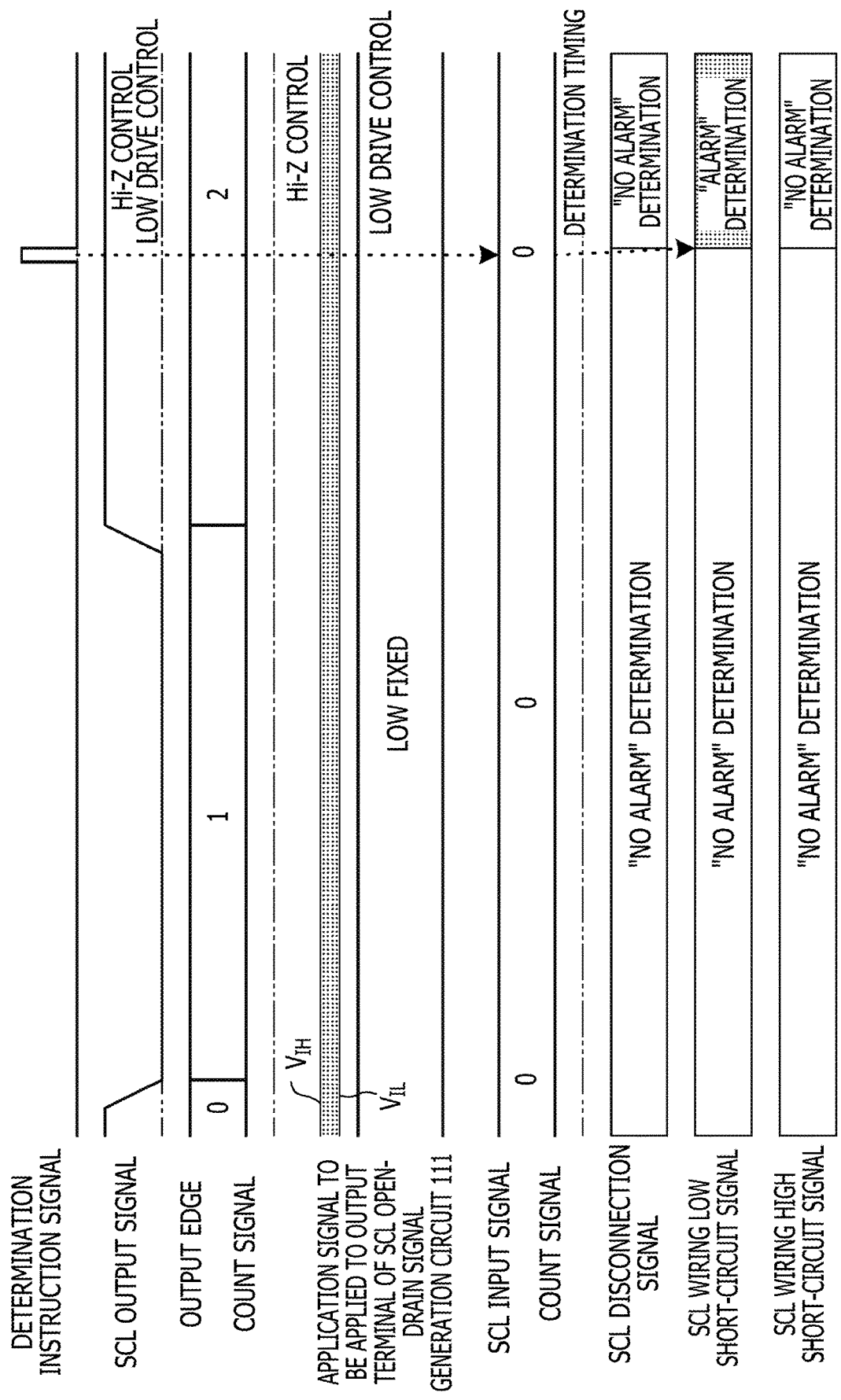

TRANSMISSION APPARATUS AND TRANSMISSION METHOD

CROSS-REFERENCE TO RELATED APPLICATION

This application is based upon and claims the benefit of priority of the prior Japanese Patent Application No. 2017-222840, filed on Nov. 20, 2017, the entire contents of which are incorporated herein by reference.

FIELD

The embodiments discussed herein are related to a transmission apparatus and a transmission method.

BACKGROUND

There are various known technologies which detect failure in transmission paths for signal transmission in a transmission apparatus built using a semiconductor device such as a field-programmable logic array (Field-Programmable Gate Array, FPGA). For example, among such technologies is a failure diagnosis method known as diagnosing a failure location based on a result of comparison between output signals respectively from a pair of bidirectional buffers after test data are inputted into the buffers.

Another example of such technologies is a communication system known as using a serial bus called an inter-integrated circuit (I²C).

FIG. 1 is a diagram illustrating a communication system which uses an I2C.

A communication system 900 includes a master device 901 as a control device, a slave device 102 as a peripheral device, a serial clock (SCL) bus 103, a serial data (SDA) bus 104, and an SCL pull-up resistor 105, and an SDA pull-up resistor 106. The SCL bus 103 is a transmission path for transmitting SCL as a clock signal between the master device 901 and the slave device 102. The SDA bus 104 is a transmission path for transmitting SDA as a data signal between the master device 901 and the slave device 102.

The SCL pull-up resistor 105 is connected to the SCL bus 103, and raises the signal level of the SCL bus 103 to the power supply level when both the master device 901 and the slave device 102 output Hi-Z on the SCL bus 103. The SDA pull-up resistor 106 is connected to the SDA bus 104, and raises the signal level of the SDA bus 104 to the power supply level when both the master device 901 and the slave device 102 output Hi-Z to the SDA bus 104.

The master device 901 includes an I2C master circuit 910, an SCL open-drain signal generation circuit 111, an SCL input buffer 112, an SDA open-drain signal generation circuit 113, and an SDA input buffer 114. The I2C master circuit 910 is a logic circuit for performing predetermined processes. The I2C master circuit 910 outputs an SCL output signal and an SDA output signal as logic output signals, and receives an SCL input signal and an SDA input signal as logic input signals.

The SCL open-drain signal generation circuit 111 has an input terminal connected to the I2C master circuit 910 and an output terminal connected to the SCL pull-up resistor 105 via the SCL bus 103. When the I2C master circuit 910 inputs an SCL output signal representing "0" to the input terminal of the SCL open-drain signal generation circuit 111, the SCL open-drain signal generation circuit 111 outputs SCL representing "0". When the I2C master circuit 910 inputs an SCL output signal representing "1" to the input terminal of the SCL open-drain signal generation circuit 111, the SCL open-drain signal generation circuit 111 outputs Hi-Z. The SCL open-drain signal generation circuit 111 includes, for example, a tri-state element whose data input terminal is grounded, and to whose control terminal SCL is inputted.

The SCL input buffer 112 buffers SCL inputted to the SCL input buffer 112 via the SCL bus 103, and inputs the buffered SCL signal, serving as an SCL input signal, into the I2C master circuit 910. In outputting Hi-Z, the SCL input buffer 112 buffers an application signal which is applied to the output terminal of the SCL input buffer 112, and inputs the buffered application signal, serving as the as an SCL input signal, into the I2C master circuit 910. For example, the SCL input buffer 112 outputs the SCL input signal depending on the application signal which is applied to the output terminal of the SCL open-drain signal generation circuit 111.

In response to a rise transition of the application signal applied to the output terminal of the SCL open-drain signal generation circuit 111, when the signal level of the application signal becomes higher than a predetermined rise threshold $V_{IH}$, the SCL input buffer 112 outputs "1". In a fall transition of the application signal applied to the output terminal of the SCL open-drain signal generation circuit 111, when the signal level of the application signal becomes lower than a predetermined fall threshold $V_{IL}$, the SCL input buffer 112 outputs "0".

The configurations and functions of the SDA open-drain signal generation circuit 113 and the SDA input buffer 114 are the same as those of the SCL open-drain signal generation circuit 111 and the SCL input buffer 112, except for inputting and outputting SDA instead of SCL. For this reason, detailed descriptions for the configurations and functions of the SDA open-drain signal generation circuit 113 and the SDA input buffer 114 are omitted herein.

The slave device 102 includes an I2C slave circuit 120, an SCL open-drain signal generation circuit 121, an SCL input buffer 122, an SDA open-drain signal generation circuit 123, and an SDA input buffer 124. Examples of the slave device 102 include an optical module, a delay adjustment device, a temperature monitor device, a clock device, and a power supply device, as communication devices.

The I2C slave circuit 120 is a logic circuit which performs predetermined processes such as detecting various physical quantities. The I2C slave circuit 120 outputs an SCL output signal and an SDA output signal as logic output signals, and receives an SCL input signal and an SDA input signal as logic input signals. The slave device 102 is the logic circuit which performs predetermined processes depending on instructions from the master device 901, and outputs logic output signals, that is to say, SCL as the clock signal and SDA as the data signal, like the master device 901.

The configurations and functions of the SCL open-drain signal generation circuit 121 to the SDA input buffer 124 are the same as those of the SCL open-drain signal generation circuit 111 to the SDA input buffer 114. For this reason, detailed descriptions for the configurations and functions are omitted herein.

I2C defines control signals such as an ACK or NACK bit and clock stretching. When the master device 901 transmits an address signal, a data signal and the like to the slave device 102 via the SDA bus, the slave device 102 indicates its busy state. When the slave device 102 transmits a data signal to the master device 901 via the SDA bus, the master device 901 indicates its busy state.

While the master device 901 and the slave device 102 are being manufactured, and while the communication system 900 is in operation, wiring failure may occur in wiring, or signal transmission paths, in the master device 901 and the slave device 102. The wiring failure includes: a disconnection failure, sometimes referred to as a wiring open failure; and a wiring short-circuit failure. The disconnection failure is a failure in which either the SCL bus 103 or the SDA bus 104 breaks somewhere, and the electrical connection between the master device 901 and the slave device 102 is cut off.

The wiring short-circuit failure is a failure in which the voltage level of either the SCL bus 103 or the SDA bus 104 is fixed to a certain value. The wiring short-circuit failure includes a wiring low short-circuit failure in which the voltage is fixed to the ground level, and a wiring high short-circuit failure in which the voltage level is fixed to the power supply level. The wiring low short-circuit failure occurs, for example, when a failure in either the SCL open-drain signal generation circuit 111 or the SDA open-drain signal generation circuit 113 fixes the voltage level of either the SCL bus 103 or the SDA bus 104 to the ground level. The wiring low short-circuit failure also occurs, for example, when either the SCL bus 103 or the SDA bus 104 is connected to the ground line via conductive matter such as solder scraps, and the voltage level of either the SCL bus 103 or the SDA bus 104 is fixed to the ground level.

The wiring high short-circuit failure occurs, for example, when a failure in either the SCL open-drain signal generation circuit 111 or the SDA open-drain signal generation circuit 113 fixes the voltage level of either the SCL bus 103 or the SDA bus 104 to the power supply level. The wiring high short-circuit failure also occurs, for example, when either the SCL bus 103 or the SDA bus 104 is connected to the power supply line via conductive matter such solder scraps, and the voltage level of either the SCL bus 103 or the SDA bus 104 fixed to the power supply level.

In an electronic system, such as a digital communication system, in which the transmission apparatus is installed, communications between the master device 901 and the slave device 102 are cut off when the I2C fails. Once the communications between the master device 901 and the slave device 102 are cut off, the host controller, such as a Central Processing Unit (CPU), of the master device 901 becomes unable to control the slave device 102, and the operation of the electronic system goes into trouble. For the purpose of quickly detecting the failure in the communications between the master device 901 and the slave device 102, it is desirable that the communication system 900 monitor whether a wiring failure occurs in the I2C, and output a warning signal when detecting a wiring failure.

For example, the master device 901 monitors how long the slave device 102 is in a busy state, based on an NACK state indicated by an ACK or NACK bit in the signal inputted into the master device 901 from the slave device 102 and clock stretching. When the length of time for which the slave device is in the busy state exceeds a certain time, the master device 901 outputs a warning signal indicating the abnormal interface state to the host controller.

The abnormal interface state detected based on the NACK state and the clock stretching, however, means the state where the slave device 102 is not responding. It is not easy for the master device 901 to determine whether the abnormal interface state is a busy state which occurs while the slave device 102 is in normal operation, a failure in the slave device 102, or a wiring failure.

The following is a reference document.
[Document 1] Japanese Laid-open Patent Publication No. 9-34749.

SUMMARY

According to an aspect of the embodiments, a transmission apparatus includes a logic circuit for performing a predetermined process, and outputting a logic output signal depending on the process, an open-drain signal generation circuit, connectable at an input terminal to the logic circuit and at an output terminal to a pull-up resistor, for outputting an output signal representing "0" when the logic output signal representing "0" is inputted into the input terminal from the logic circuit, and outputting Hi-Z when the logic output signal representing "1" is inputted into the input terminal from the logic circuit, and a transmission path failure determination circuit for determining whether there is a failure in a transmission path which transmits a signal outputted from the logic circuit via the open-drain signal generation circuit, wherein the transmission path failure determination circuit includes an edge waveform information obtaining circuit for obtaining edge waveform information indicating a waveform of at least one of a rising edge and a falling edge of an application signal which is applied to the output terminal of the open-drain signal generation circuit, and a failure determination circuit for determining whether the edge waveform information satisfies a predetermined condition, and outputting a failure signal indicating that there is a failure in the transmission path when determining that the edge waveform information does not satisfy the predetermined condition.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 29C is a diagram illustrating a failure determination circuit illustrated in FIG. 28;

FIG. 37 is a diagram illustrating a timing chart of how signals change over time in a case where no failure occurs in an SCL transmission path in the sixth embodiment;

FIG. 38 is a diagram illustrating a timing chart of how the signals change over time in a case where a disconnection failure occurs in the SCL transmission path in the sixth embodiment;

FIG. 39 is a diagram illustrating a timing chart of how the signals change over time in a case where a low short-circuit failure occurs in the SCL transmission path in the sixth embodiment;

DESCRIPTION OF EMBODIMENTS

Figure 1:
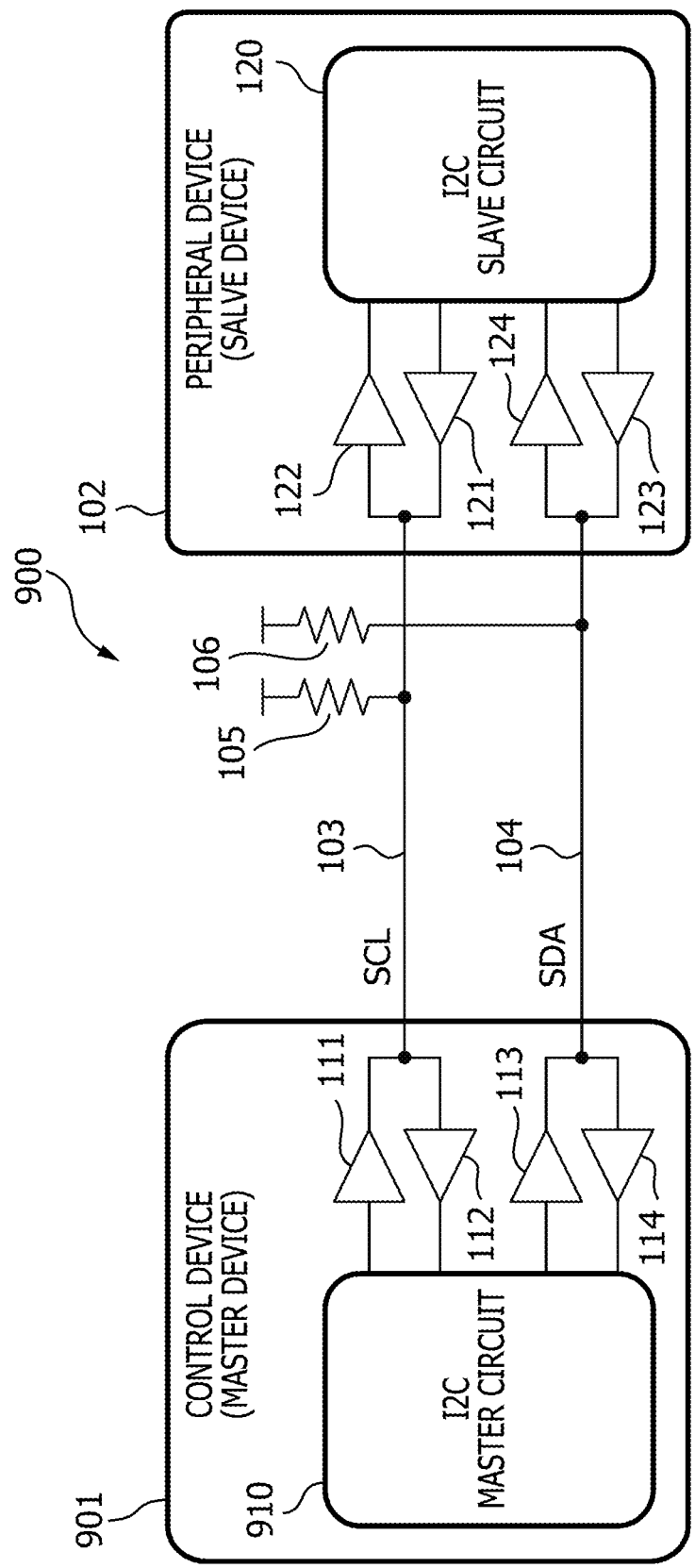
FIG. 1 is a diagram illustrating a communication system for making communications by use of I2C.

Hereinafter, referring to the drawings, descriptions will be provided for transmission apparatuses and transmission methods according to embodiments. Incidentally, the technical scope of the present disclosure is not limited to the embodiments.

(Outlines of Transmission Apparatuses According to Embodiments)

The transmission apparatuses according to the embodiments are each capable of detecting a failure in each transmission path by determining whether the transmission path fails based on a state of an open-drain output signal in the transmission path in a communication method of transmitting and receiving the open-drain output signal.

(Transmission Apparatus According to First Embodiment)

Figure 2:
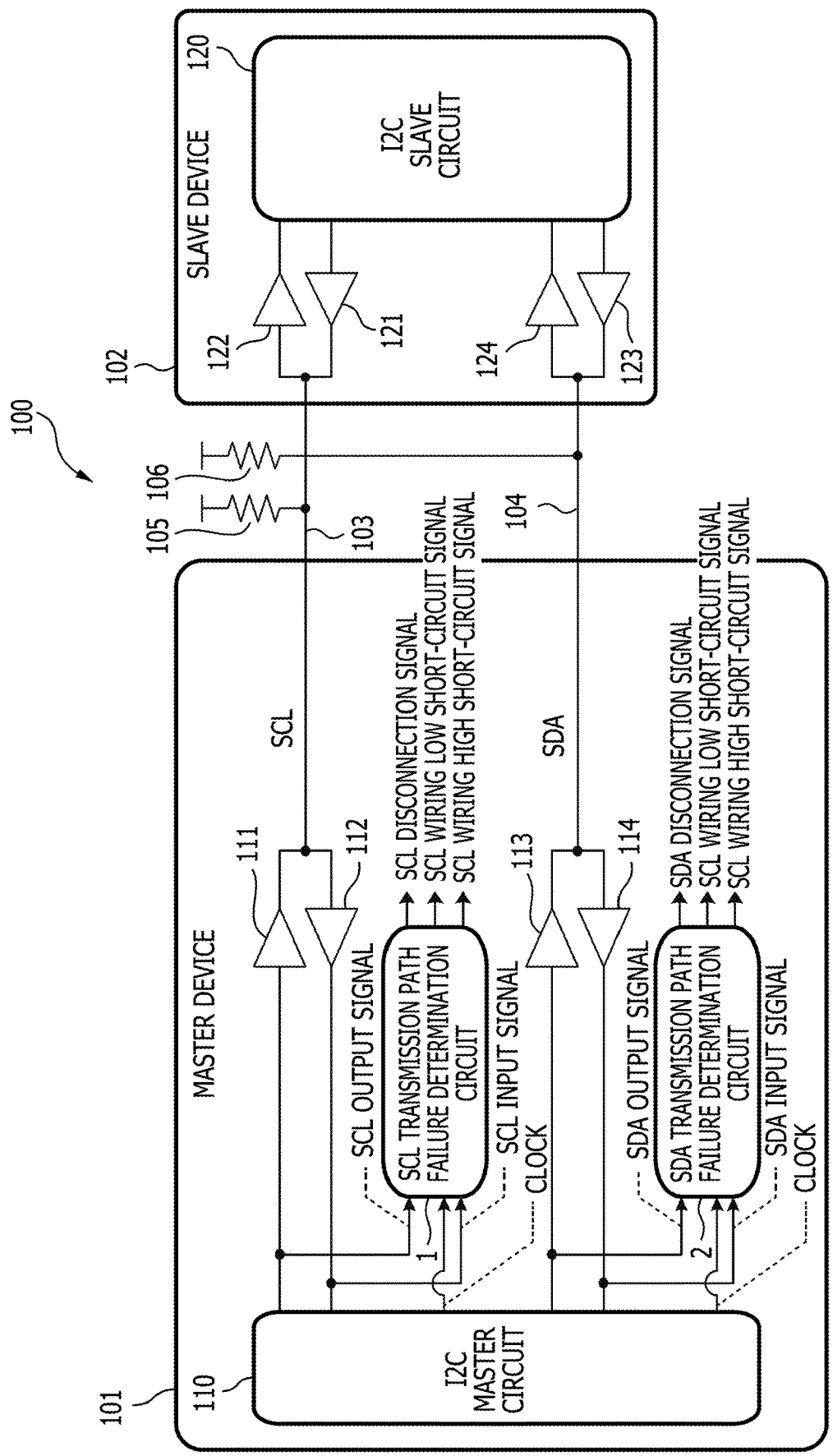
FIG. 2 is a diagram illustrating a communication system which includes a transmission apparatus according to a first embodiment.

FIG. 2 is a diagram illustrating a communication system which includes a transmission apparatus according to a first embodiment.

A communication system 100 is different from the communication system 900 in that the communication system 100 includes a master device 101 instead of the master device 901. The master device 101 is different from the master device 901 in that the master device 101 includes an I2C master circuit 110 instead of the I2C master circuit 910. The master device 101 is further different from the master device 901 in that the master device 101 includes an SCL transmission path failure determination circuit 1 and an SDA transmission path failure determination circuit 2. Except for the I2C master circuit 110, the SCL transmission path failure determination circuit 1 and the SDA transmission path failure determination circuit 2, components of the communication system 100 which have the same configurations and functions as those of the communication system 900 which are denoted by the same reference signs. Detailed descriptions for such components will be omitted.

The I2C master circuit 110 is different from the I2C master circuit 910 in that the I2C master circuit 110 outputs a clock to the SCL transmission path failure determination circuit 1 and the SDA transmission path failure determination circuit 2. The frequency of the clock outputted from the I2C master circuit 110 is sufficiently higher than that of SCL. The SCL transmission path failure determination circuit 1 is connected to the I2C master circuit 110 and the SCL input buffer 112, and determines whether there is a failure in a transmission path including the SCL bus 103. The SDA transmission path failure determination circuit 2 is connected to the I2C master circuit 110 and the SDA input buffer 114, and determines whether there is a failure in a transmission path including the SDA bus 104.

Figure 3:
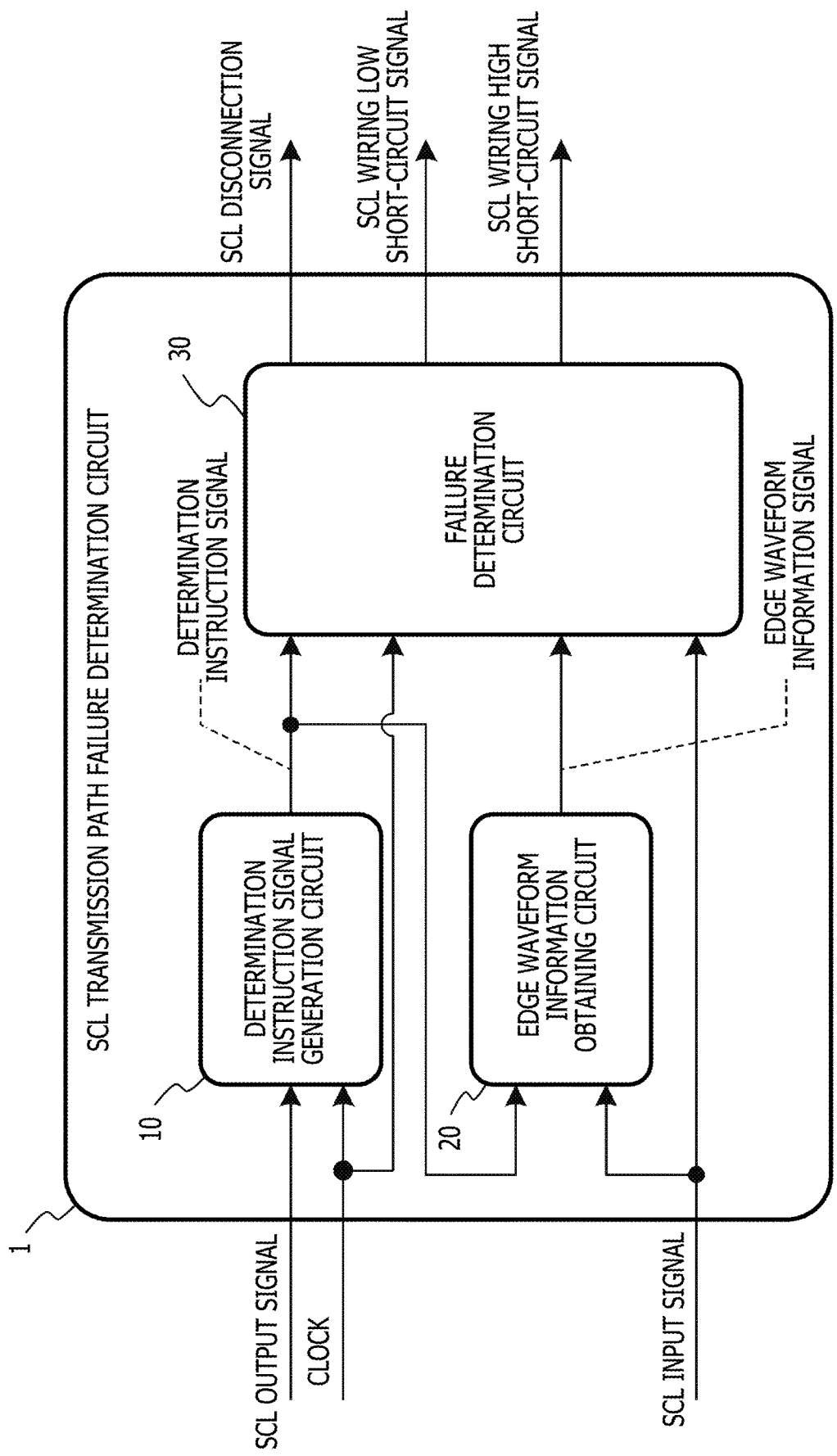
FIG. 3 is a diagram illustrating an SCL transmission path failure determination circuit illustrated in FIG. 2.

FIG. 3 is a diagram illustrating the SCL transmission path failure determination circuit 1.

The SCL transmission path failure determination circuit 1 includes a determination instruction signal generation circuit 10, an edge waveform information obtaining circuit 20, and a failure determination circuit 30. The SCL transmission path failure determination circuit 1 determines whether there is a failure in the SCL transmission path, based on edge waveform information about waveforms of rising and falling edges of the SCL input signal, that is to say, the application signal applied to the output terminal of the SCL open-drain signal generation circuit 111. To put it more specifically, the SCL transmission path failure determination circuit 1 detects waveform disturbance in the rising and falling edges of the SCL input signal which occurs when a failure occurs in the SCL bus 103, and determines whether there is a failure in the SCL transmission path based on the detected waveform disturbance.

The SCL transmission path failure determination circuit 1 determines that no failure occurs in the SCL transmission path, when the counted number of rising and falling edges of the SCL input signal in response to the rise and fall of the SCL output signal is "1".

The SCL transmission path failure determination circuit 1 determines that a disconnection occurs in the SCL transmission path, when the counted number of rising and falling edges of the SCL input signal depending on the rise and fall of the SCL output signal is greater than "1". When the waveform of the SCL input signal is disturbed due to the occurrence of a disconnection in the SCL transmission path, the counted number of rising and falling edges of the SCL input signal increases. Using this increase, the SCL transmission path failure determination circuit 1 detects a disconnection in the SCL transmission path.

The SCL transmission path failure determination circuit 1 determines that the SCL transmission path is short-circuited, when the counted number of rising and falling edges of the SCL input signal depending on the rise and fall of the SCL output signal is less than "1", that is to say, "0". The SCL transmission path failure determination circuit 1 determines that the SCL transmission path is low short-circuited, when the counted number of rising and falling edges of the SCL input signal in responses to the rise and fall of the SCL output signal is "0", and concurrently when the signal level of the SCL input signal is at "0". The SCL transmission path failure determination circuit 1 determines that the SCL transmission path is high short-circuited, when the counted number of rising and falling edges of the SCL input signal in response to the rise and fall of the SCL output signal is "0", and concurrently when the signal level of the SCL input signal is at "1".

The determination instruction signal generation circuit 10 generates a determination instruction signal from the rising and falling edges of the SCL output signal outputted from the I2C master circuit 110, and outputs the generated determination instruction signal to the failure determination circuit 30. The edge waveform information obtaining circuit 20 obtains the edge waveform information about the waveforms of the rising and falling edges of the SCL input signal, that is to say, the application signal applied to the output terminal of the SCL open-drain signal generation circuit 111, and outputs the edge waveform information to the failure determination circuit 30.

The failure determination circuit 30 determines whether the edge waveform information satisfies a predetermined condition. When the failure determination circuit 30 determines that the edge waveform information does not satisfy the predetermined condition, the failure determination circuit 30 outputs a failure signal indicating a failure in the SCL transmission path. The failure signal includes an SCL disconnection signal, an SCL wiring low short-circuit signal, an SCL wiring high short-circuit signal. The SCL disconnection signal indicates that a disconnection occurs in the SCL transmission path including the SCL bus 103. The SCL wiring low short-circuit signal indicates that a wiring low short-circuit failure occurs in the SCL transmission path. The SCL wiring high short-circuit signal indicates that a wiring high short-circuit failure occurs in the SCL transmission path.

Figure 4A:
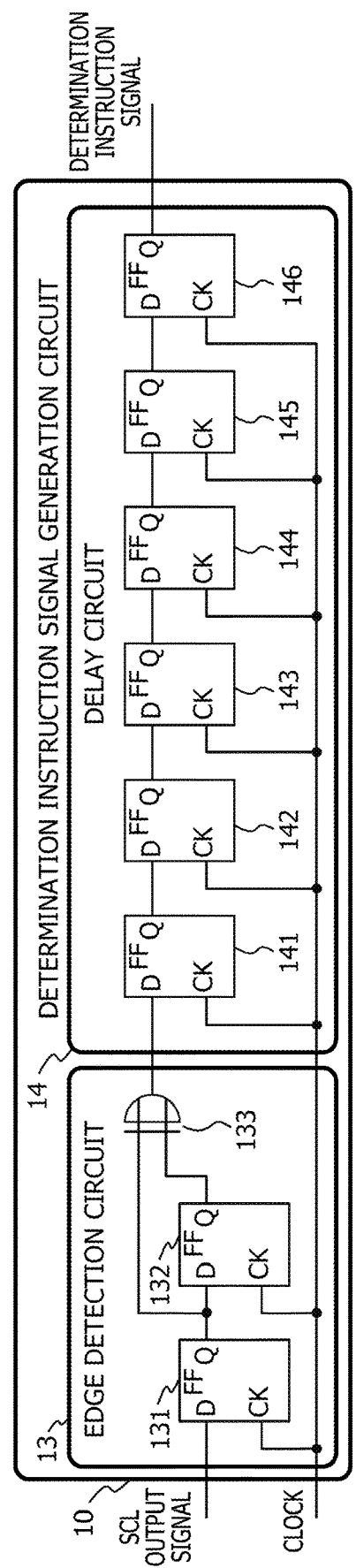
FIG. 4A is a diagram illustrating a determination instruction signal generation circuit illustrated in FIG. 3.
Figure 4B:
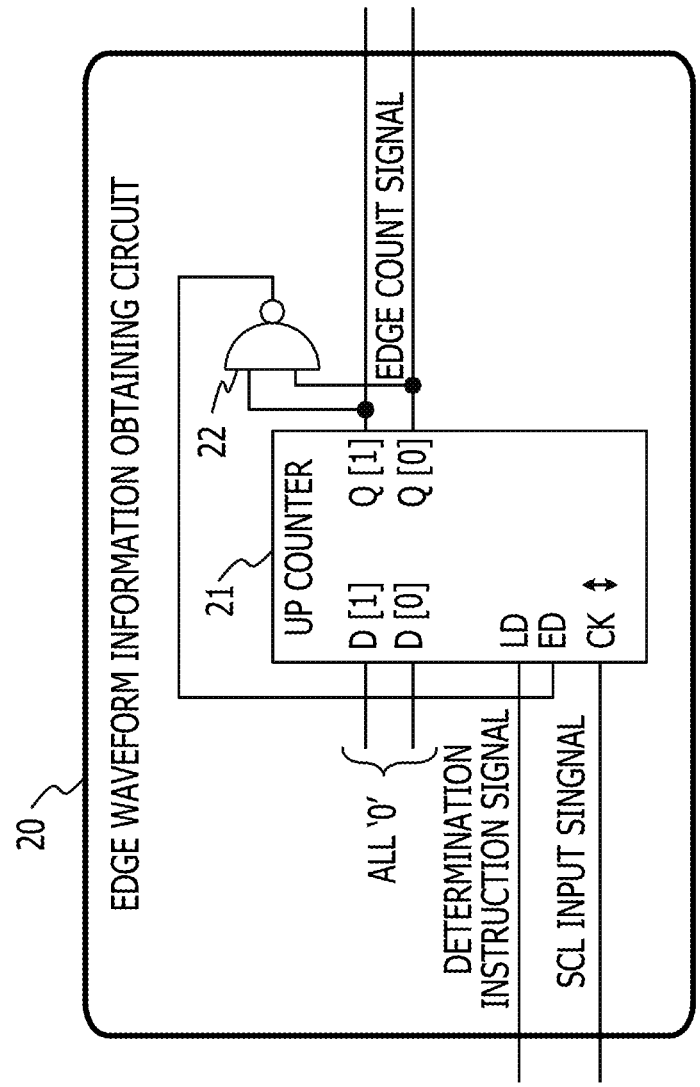
FIG. 4B is a diagram illustrating an edge waveform information obtaining circuit illustrated in FIG. 3.
Figure 4C:
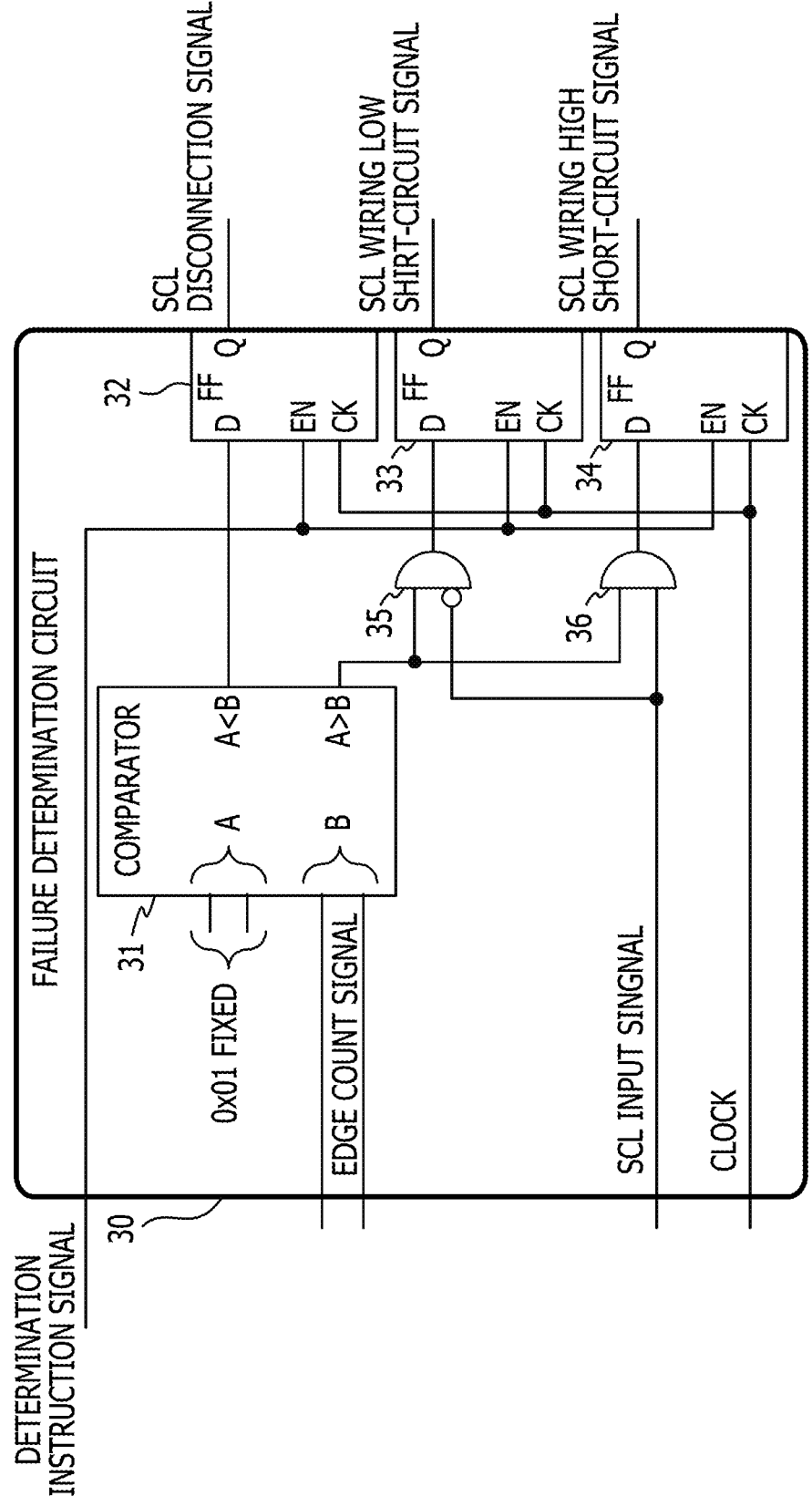
FIG. 4C is a diagram illustrating a failure determination circuit illustrated in FIG. 3.

FIG. 4A is a diagram illustrating the determination instruction signal generation circuit 10; FIG. 4B is a diagram illustrating the edge waveform information obtaining circuit 20; and FIG. 4C is a diagram illustrating the failure determination circuit 30.

The determination instruction signal generation circuit 10 includes an edge detection circuit 13, and a delay circuit 14. The edge detection circuit 13 includes a first edge flip-flop 131, a second edge flip-flop 132, and an edge EOR element 133. The edge detection circuit 13 detects the rising and falling edges of the SCL output signal, and outputs an edge detection signal. The delay circuit 14 is a shift register which includes a first delay flip-flop 141 to a sixth delay flip-flop 146. The delay circuit 14 delays the edge detection signal outputted from the edge detection circuit 13, and thereby outputs the delayed edge detection signal as a determination instruction signal.

The edge waveform information obtaining circuit 20 includes a 2-bit up-counter 21, and a waveform NAND element 22. The edge waveform information obtaining circuit 20 counts the number of rising and falling edges of the waveform of the SCL input signal outputted from the SCL input buffer 112, and outputs an edge count signal representing the counted number.

The failure determination circuit 30 includes a comparator 31, a first determination flip-flop 32 to a third determination flip-flop 34, and a first determination AND element 35 to a second determination AND element 36. The comparator 31 is a 2-bit comparator. The comparator 31 outputs a comparison result signal depending on a result of comparison between the counted number corresponding to the edge count signal inputted from the edge waveform information obtaining circuit 20 and "1". When the counted number corresponding to the edge count signal is greater than "1", the comparator 31 outputs a comparison result signal with a signal level of "1" to the first determination flip-flop 32. When the first determination flip-flop 32 receives the comparison result signal with a signal level of "1", and further receives the determination instruction signal, the first determination flip-flop 32 outputs an SCL disconnection signal corresponding to the rising edge of the clock.

When the counted number corresponding to the edge count signal is less than "1", that is to say, when the counted number is "0", the comparator 31 outputs a comparison result signal with a signal level of "1" to the first determination AND element 35 and the second determination AND element 36. When the signal level of the SCL input signal is at "0", the first determination AND element 35 outputs a comparison result signal with a signal level of "1" to the second determination flip-flop 33. When the second determination flip-flop 33 receives the comparison result signal with a signal level of "1", and further receives the determination instruction signal, the second determination flip-flop 33 outputs the SCL wiring low short-circuit signal corresponding to the rising edge of the clock. When the signal level of the SCL input signal is at "1", the second determination AND element 36 outputs a comparison result signal with a signal level of "1" to the third determination flip-flop 34. When the third determination flip-flop 34 receives the comparison result signal with a signal level of "1", and further receives the determination instruction signal, the third determination flip-flop 34 outputs the SCL wiring high short-circuit signal corresponding to the rising edge of the clock.

Figure 5:
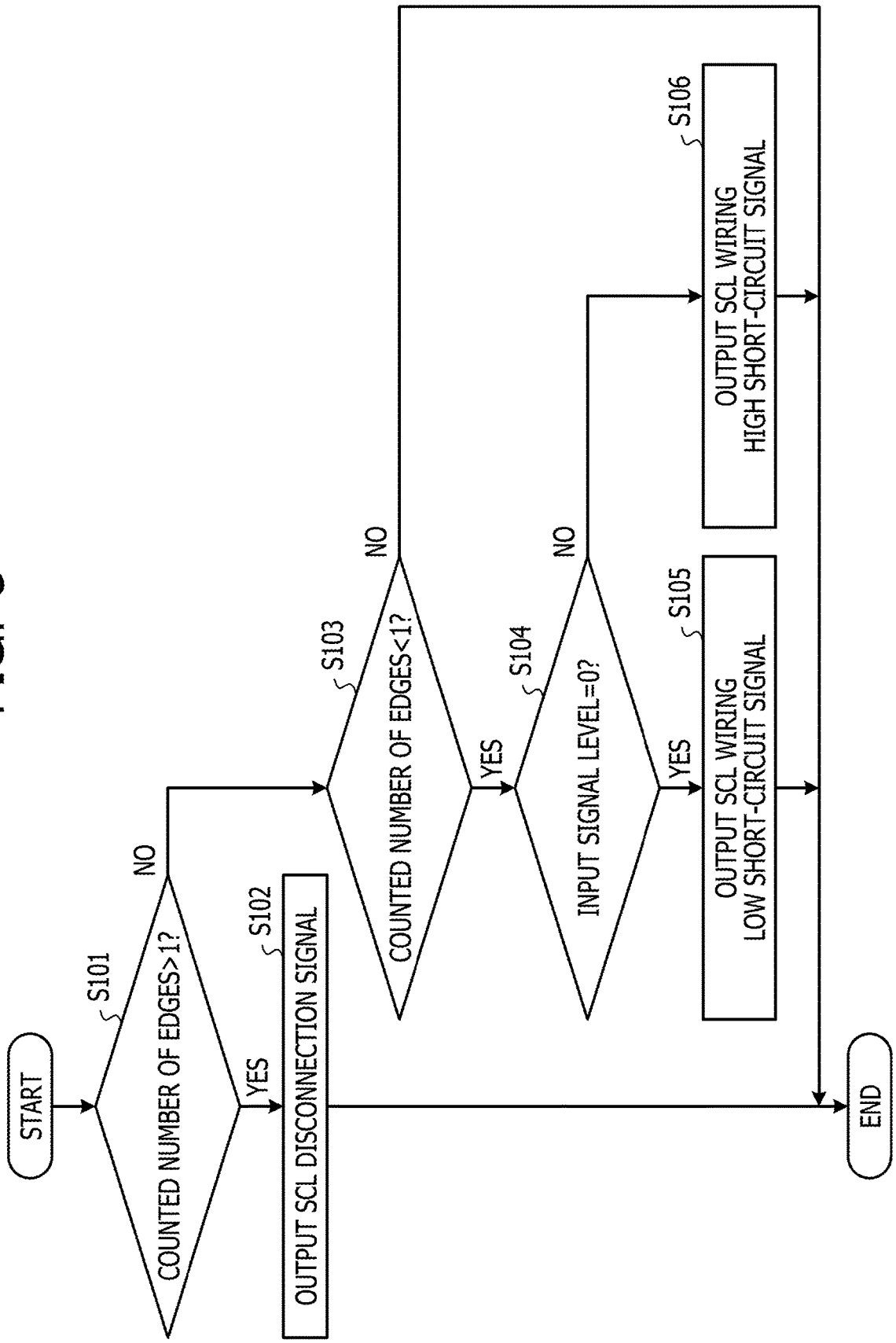
FIG. 5 is a flowchart illustrating a failure determination process to be performed by the failure determination circuit illustrated in FIG. 3.

FIG. 5 is a flowchart illustrating a failure determination process to be performed by the failure determination circuit 30.

If the counted number of edges of the SCL input signal, that is to say, the application signal applied to the output terminal of the SCL open-drain signal generation circuit 111, is greater than "1" (YES in step S101), the failure determination circuit 30 outputs the SCL disconnection signal (step S102). If the counted number of edges of the SCL input signal is "1" (NO in step S101 and NO in step S103), the failure determination circuit 30 outputs no warning signal.

If the counted number of edges of the SCL input signal is greater than "1" (YES in step S103), and if the signal level of the SCL input signal is "0" (YES in step S104), the failure determination circuit 30 outputs the SCL wiring low short-circuit signal. If the counted number of edges of the SCL input signal is greater than "1" (YES in step S103), and if the signal level of the SCL input signal is at "1" (NO in step S104), the failure determination circuit 30 outputs the SCL wiring high short-circuit signal.

Figure 6:
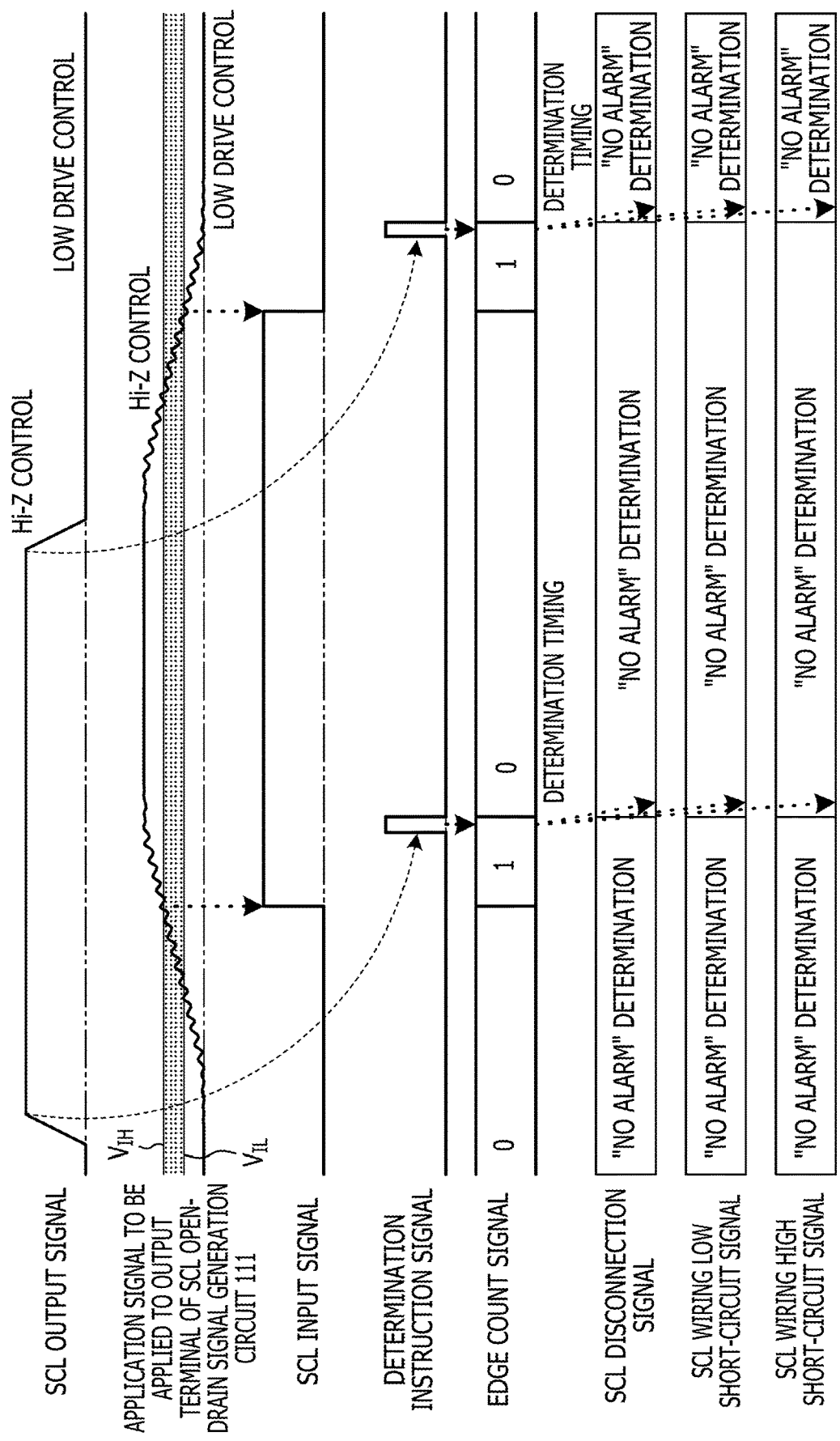
FIG. 6 is a diagram illustrating a timing chart of how signals change over time in a case where no failure occurs in an SCL transmission path in the first embodiment.

FIG. 6 is a diagram illustrating a timing chart of how signals change over time in a case where no failure occurs in the SCL transmission path in the first embodiment.

While no failure occurs in the SCL transmission path, the SCL input buffer 112 outputs Hi-Z in response to a rise transition of the SCL output signal, and the SCL pull-up resistor 105 raises the voltage of the SCL bus 103. Since the SCL pull-up resistor 105 raises the voltage of the SCL bus 103, the application signal applied to the output terminal of the SCL input buffer 112 enters a rise transition. In response to the rise transition of the application signal, the SCL input buffer 112 makes the SCL input signal transit from "0" to "1", and the failure determination circuit 30 sets the edge count signal representing the counted number of rising edges of the SCL input signal at "1". When the determination instruction signal is inputted into the failure determination circuit 30 from the determination instruction signal generation circuit 10, the failure determination circuit 30 determines that no failure occurs in the SCL transmission path since the counted number of edges is "1".

Similarly, the failure determination circuit 30 determines that no failure occurs in the SCL transmission path since the counted number of edges in response to the fall transition of the SCL output signal is "1".

Figure 7:
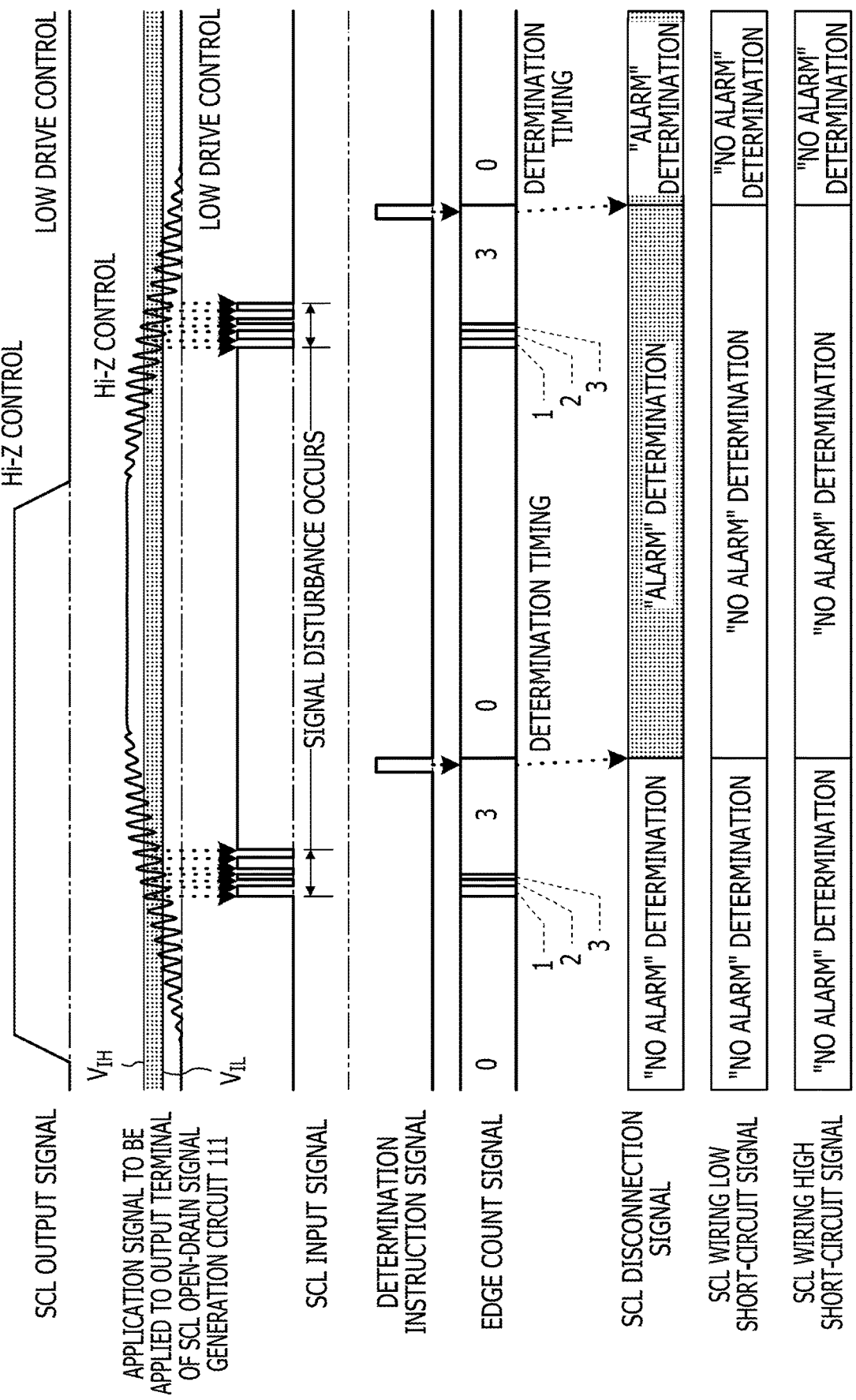
FIG. 7 is a diagram illustrating a timing chart of how the signals change over time in a case where a disconnection failure occurs in the SCL transmission path in the first embodiment.

FIG. 7 is a diagram illustrating a timing chart of how the signals change over time in a case where a disconnection failure occurs in the SCL transmission path in the first embodiment.

The SCL input buffer 112 outputs Hi-Z in response to the rise transition of the SCL output signal. Once the SCL input buffer 112 outputs Hi-Z, the signal level in the SCL bus 103 becomes unstable, and the waveform of the application signal applied to the output terminal of the SCL input buffer 112 is disturbed. In response to the disturbance in the waveform of the application signal, the SCL output signal transits back and forth between "0" and "1" several times, and the failure determination circuit 30 sets the edge count signal representing the counted number of rising edges of the SCL input signal at "3". Once the determination instruction signal is inputted into the failure determination circuit 30 from the determination instruction signal generation circuit 10, the failure determination circuit 30 determines that a disconnection failure occurs in the SCL transmission path since the counted number of edges is "3", and outputs the SCL disconnection signal.

Similarly, the failure determination circuit 30 determines that a disconnection failure occurs in the SCL transmission path since the counted number of edge in response to the fall transition of the SCL output signal is "3", and outputs the SCL disconnection signal.

Figure 8:
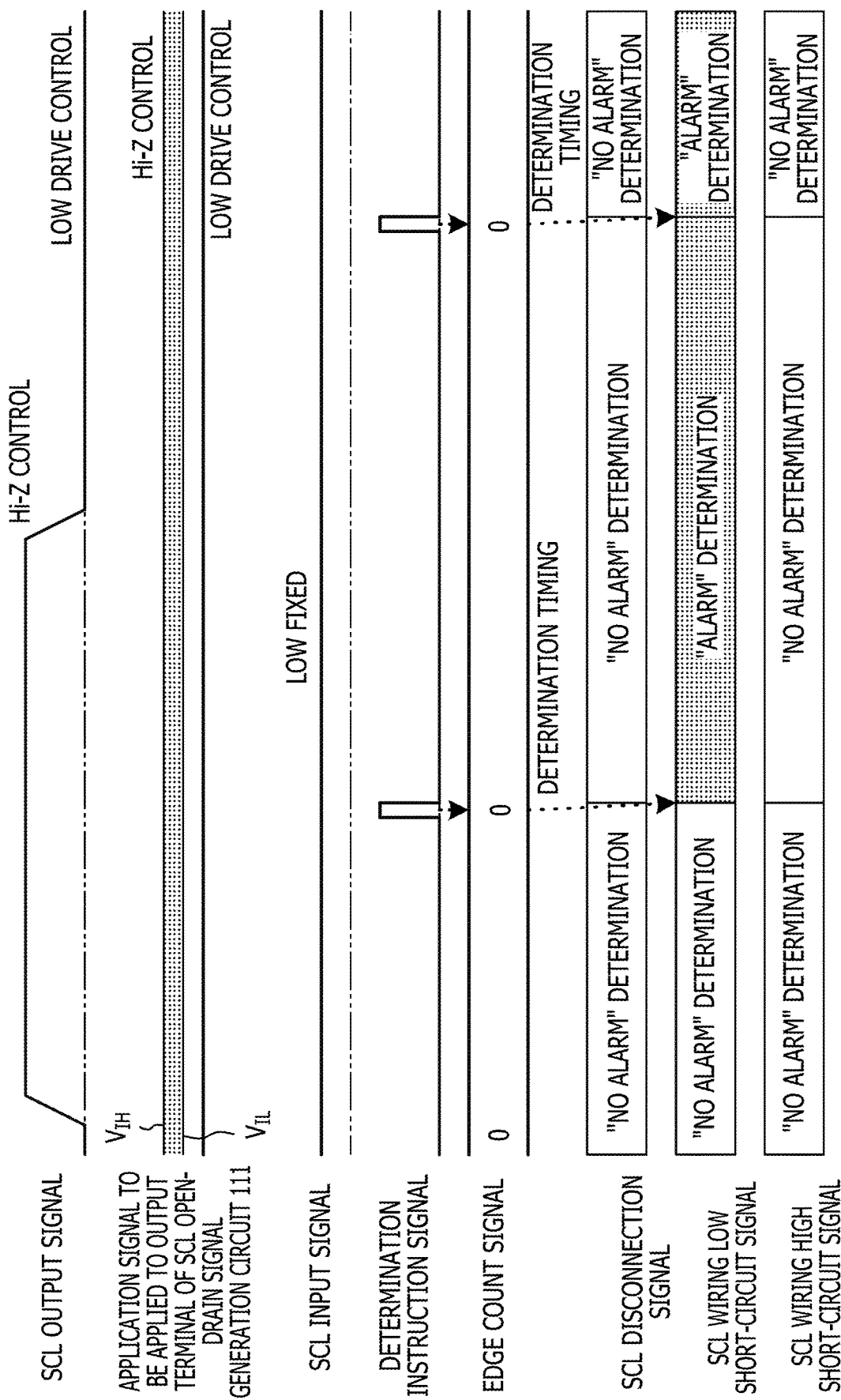
FIG. 8 is a diagram illustrating a timing chart of how the signals change over time in a case where a low short-circuit failure occurs in the SCL transmission path in the first embodiment.

FIG. 8 is a diagram illustrating a timing chart of how the signals change over time in a case where a low short-circuit failure occurs in the SCL transmission path in the first embodiment.

Although the SCL input buffer 112 outputs Hi-Z in response to the rise transition of the SCL output signal, the application signal applied to the output terminal of the SCL input buffer 112 is held at "0" since a low short-circuit failure occurs in the SCL transmission path. Since the application signal is held at "0", the edge count signal remains at "0". Since the counted number of edges is "0" and the SCL input signal is at "0", the failure determination circuit 30 determines that a low short-circuit failure occurs in the SCL transmission path. Thus, the failure determination circuit 30 outputs an SCL wiring low short-circuit signal.

Similarly, since the counted number of edges in response to the fall transition of the SCL output signal is "0" and the SCL input signal is at "0", the failure determination circuit 30 determines that a low short-circuit failure occurs in the SCL transmission path. Thus, the failure determination circuit 30 outputs an SCL wiring low short-circuit signal.

Figure 9:
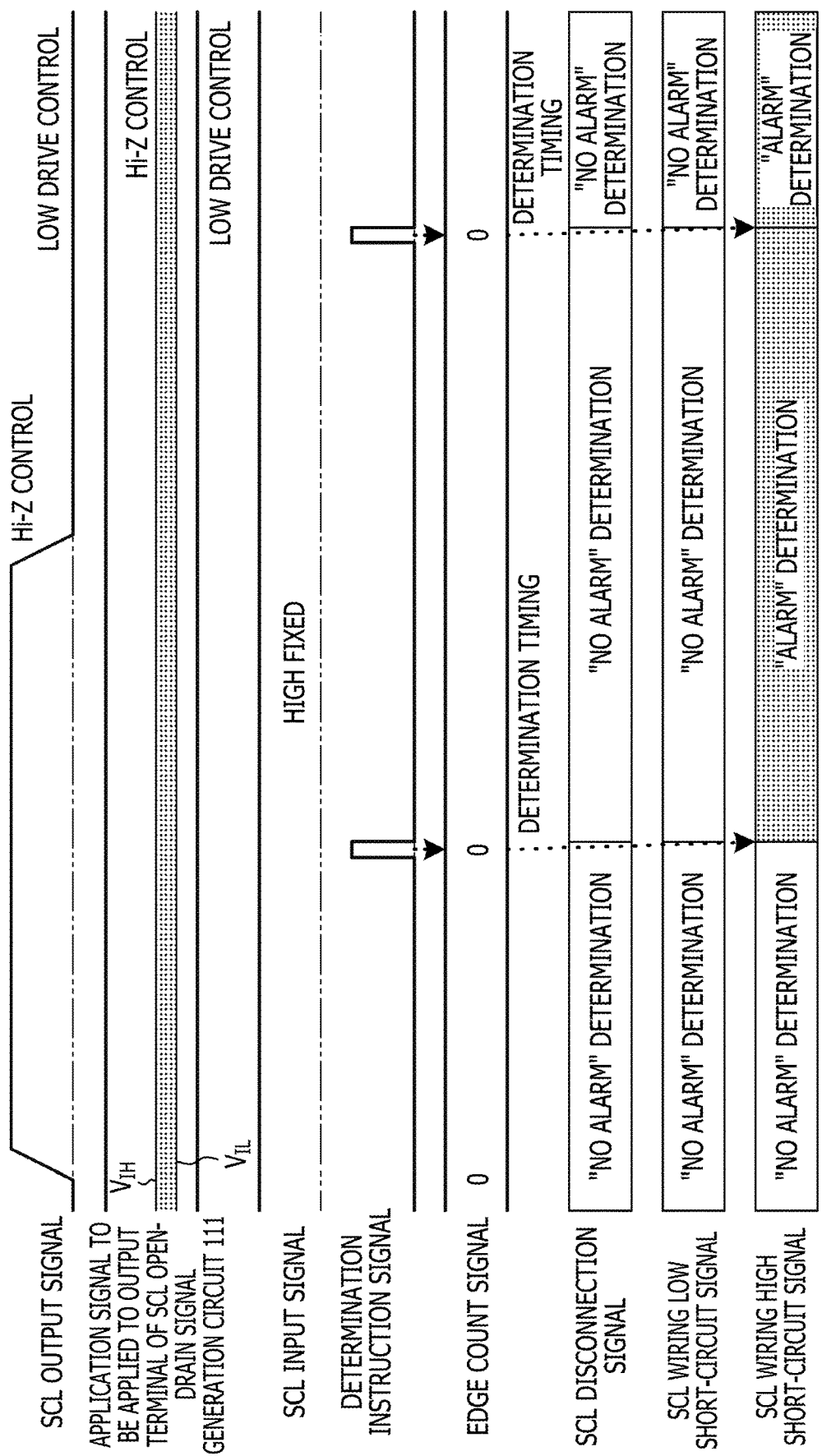
FIG. 9 is a diagram illustrating a timing chart of how the signals change over time in a case where a high short-circuit failure occurs in the SCL transmission path in the first embodiment.

FIG. 9 is a diagram illustrating a timing chart of how the signals change over time in a case where a high short-circuit failure occurs in the SCL transmission path in the first embodiment.

Although the SCL input buffer 112 outputs Hi-Z in response to the rise transition of the SCL output signal, the application signal applied to the output terminal of the SCL input buffer 112 is held at "0" since a high short-circuit failure occurs in the SCL transmission path. Since the application signal is held at "0", the edge count signal remains at "0". Since the counted number of edges is "0" and the SCL input signal is at "1", the failure determination circuit 30 determines that a high short-circuit failure occurs in the SCL transmission path. Thus, the failure determination circuit 30 outputs an SCL wiring high short-circuit signal.

Similarly, since the counted number of edges in response to the fall transition of the SCL output signal is "0" and the SCL input signal is at "1", the failure determination circuit 30 determines that a high short-circuit failure occurs in the SCL transmission path. Thus, the failure determination circuit 30 outputs an SCL wiring high short-circuit signal.

The SDA transmission path failure determination circuit 2 has the same configuration as the SCL transmission path failure determination circuit 1, and detailed descriptions are omitted herein.

(Transmission Apparatus According to Second Embodiment)

Figure 10:
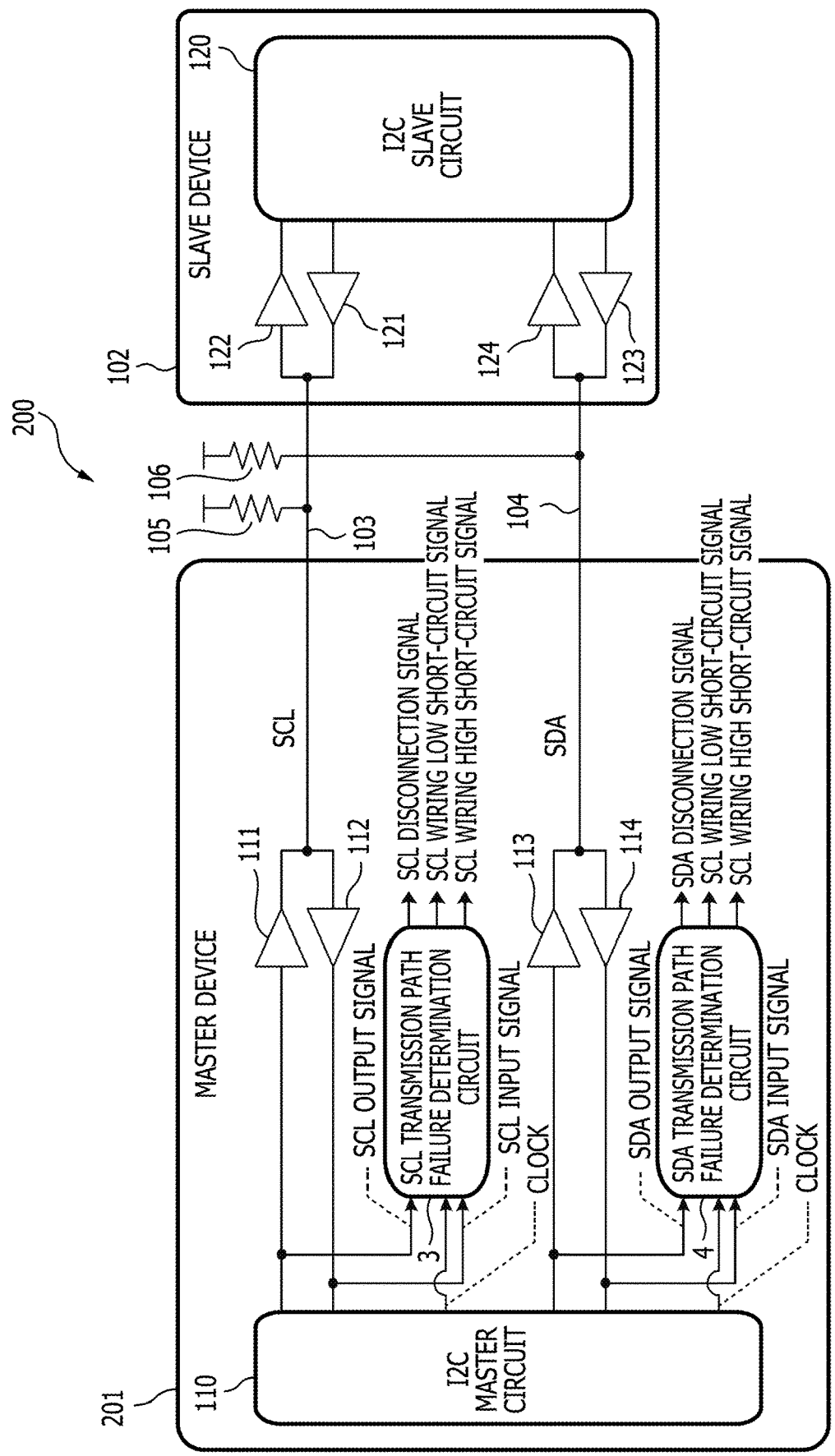
FIG. 10 is a diagram illustrating a communication system which includes a transmission apparatus according to a second embodiment.

FIG. 10 is a diagram illustrating a communication system which includes a transmission apparatus according to a second embodiment.

A communication system 200 is different from the communication system 100 in that the communication system 200 includes a master device 201 instead of the master device 101. The master device 201 is different from the master device 101 in that the master device 201 includes an SCL transmission path failure determination circuit 3 and an SDA transmission path failure determination circuit 4 instead of the SCL transmission path failure determination circuit 1 and the SDA transmission path failure determination circuit 2. Except for the SCL transmission path failure determination circuit 3 and the SDA transmission path failure determination circuit 4, the components of the communication system 200 have the same configurations and functions as those of the communication system 100 which are denoted by the same reference signs, and detailed descriptions are omitted.

Figure 11:
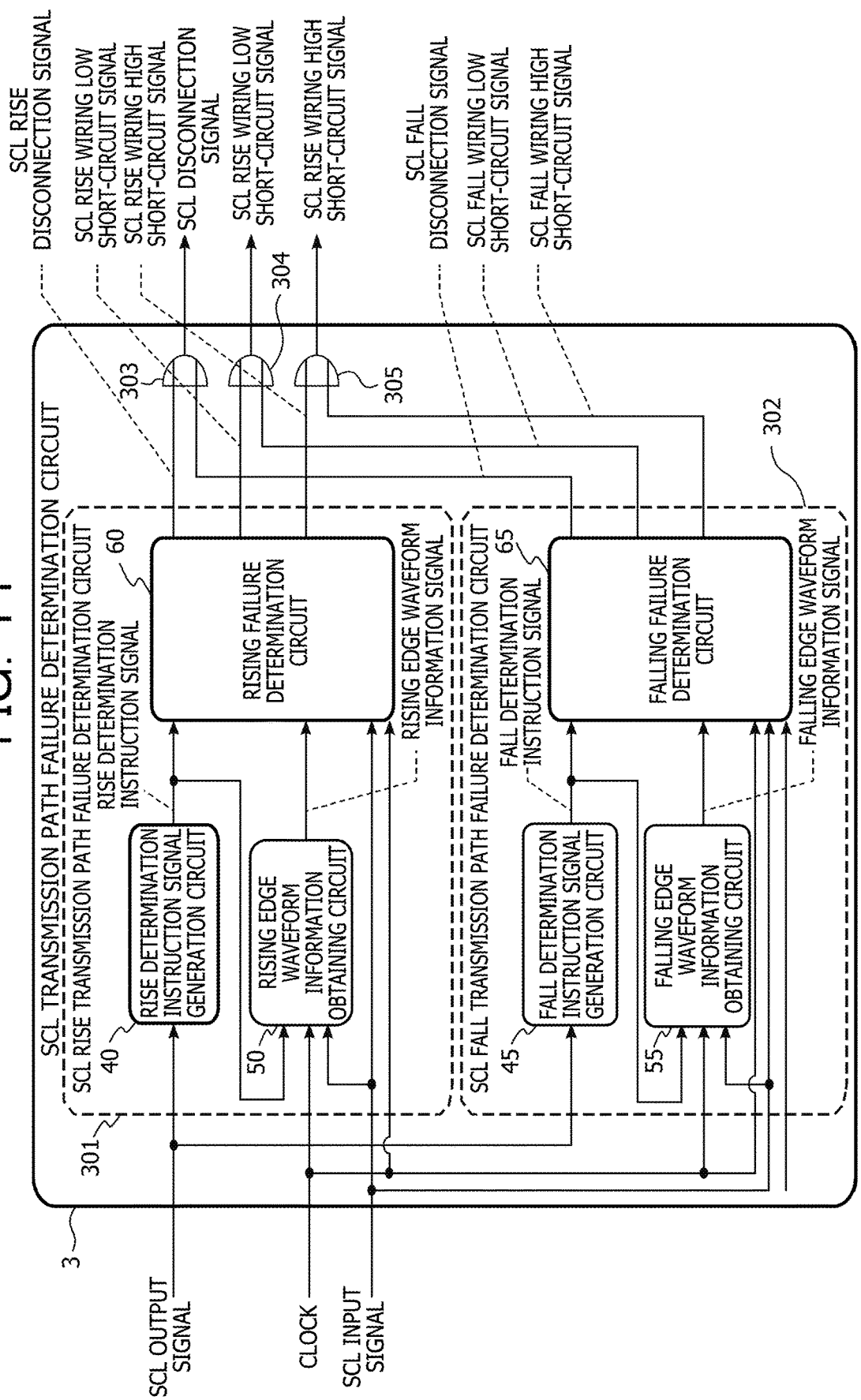
FIG. 11 is a diagram illustrating an SCL transmission path failure determination circuit illustrated in FIG. 10.

FIG. 11 is a diagram illustrating the SCL transmission path failure determination circuit 3.

The SCL transmission path failure determination circuit 3 includes an SCL rise transmission path failure determination circuit 301, an SCL fall transmission path failure determination circuit 302, a disconnection OR element 303, a low short-circuit OR element 304, and a high short-circuit OR element 305.

The SCL rise transmission path failure determination circuit 301 includes a rise determination instruction signal generation circuit 40, a rising edge waveform information obtaining circuit 50, and a rising failure determination circuit 60. Depending on a rising edge of the SCL output signal, the SCL rise transmission path failure determination circuit 301 determines whether a failure occurs in the SCL transmission path. The SCL fall transmission path failure determination circuit 302 includes a fall determination instruction signal generation circuit 45, a falling edge waveform information obtaining circuit 55, and a falling failure determination circuit 65. Depending on a falling edge of the SCL output signal, the SCL fall transmission path failure determination circuit 302 determines whether a failure occurs in the SCL transmission path.

When either the SCL rise transmission path failure determination circuit 301 or the SCL fall transmission path failure determination circuit 302 determines that a disconnection failure occurs in the SCL transmission path, the disconnection OR element 303 outputs an SCL disconnection signal. When either the SCL rise transmission path failure determination circuit 301 or the SCL fall transmission path failure determination circuit 302 determines that a low short-circuit failure occurs in the SCL transmission path, the low short-circuit OR element 304 outputs an SCL wiring low short-circuit signal. When either the SCL rise transmission path failure determination circuit 301 or the SCL fall transmission path failure determination circuit 302 determines that a high short-circuit failure occurs in the SCL transmission path, the high short-circuit OR element 305 outputs an SCL wiring low short-circuit signal.

Figure 12A:
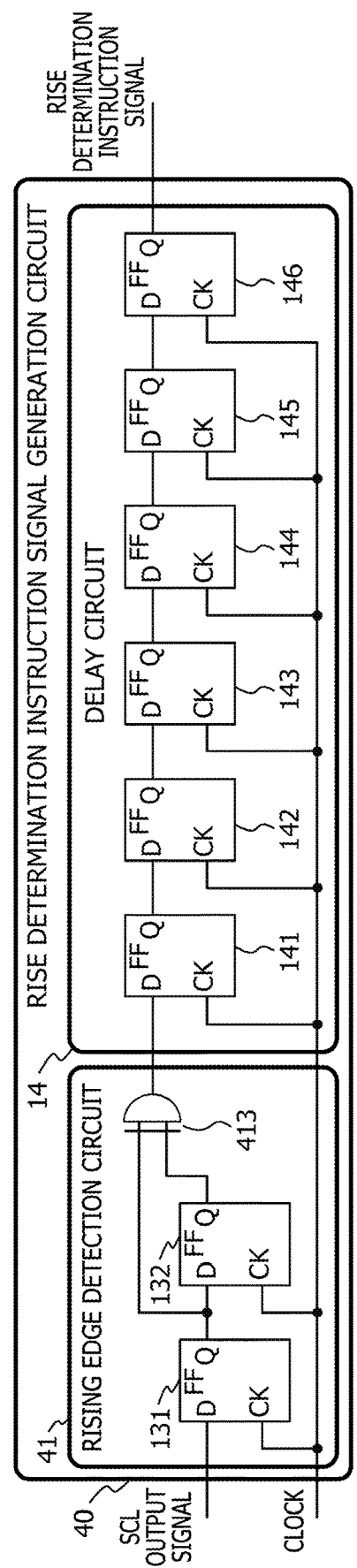
FIG. 12A is a diagram illustrating a rise determination instruction signal generation circuit illustrated in FIG. 10.
Figure 12B:
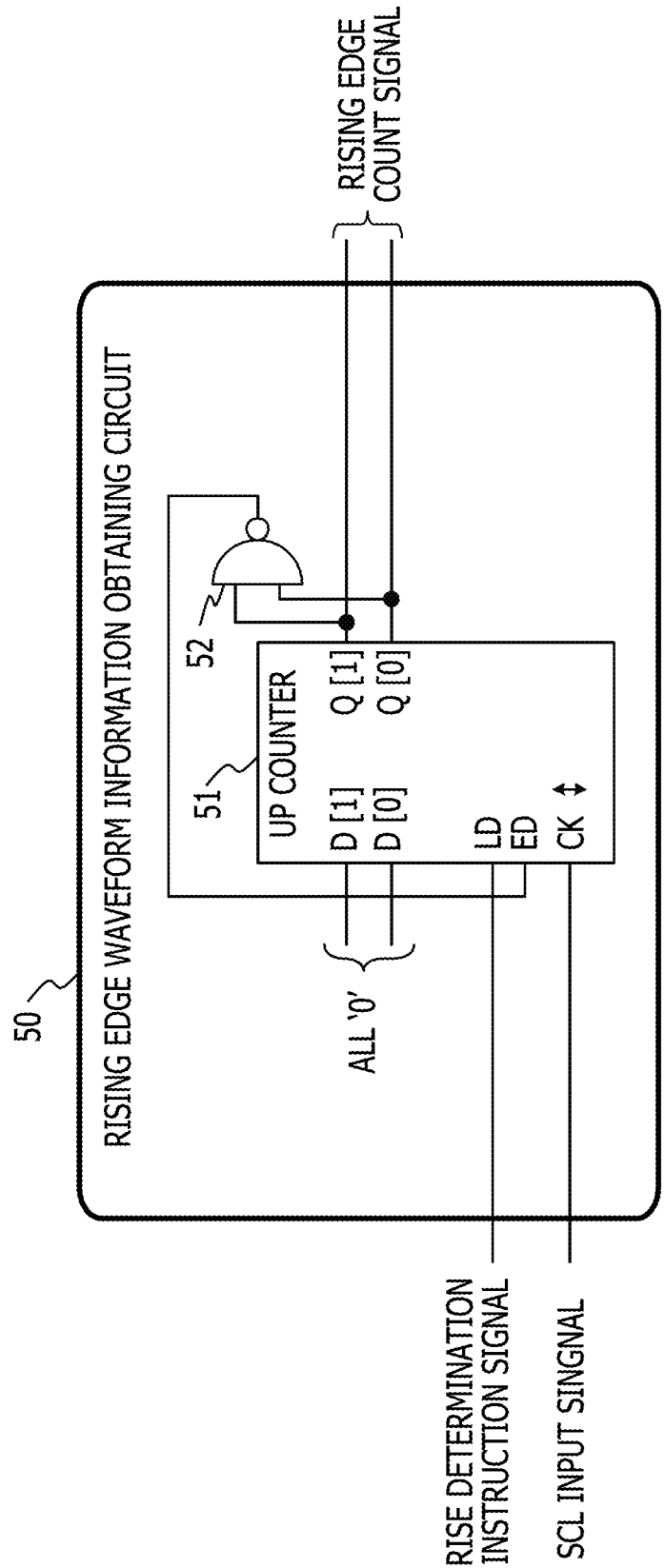
FIG. 12B is a diagram illustrating a rising edge waveform information obtaining circuit illustrated in FIG. 10.

FIG. 12A is a diagram illustrating the rise determination instruction signal generation circuit 40, and FIG. 12B is a diagram illustrating the rising edge waveform information obtaining circuit 50.

The rise determination instruction signal generation circuit 40 is different from the determination instruction signal generation circuit 10 in that the rise determination instruction signal generation circuit 40 includes a rising edge detection circuit 41 instead of the edge detection circuit 13. The rising edge detection circuit 41 is different from the edge detection circuit 13 in that the rising edge detection circuit 41 includes a rising edge AND element 413 instead of the edge EOR element 133. The rising edge detection circuit 41 detects a rising edge of the SCL output signal, and outputs an edge detection signal.

The rising edge waveform information obtaining circuit 50 is different from the edge waveform information obtaining circuit 20 in that the rising edge waveform information obtaining circuit 50 includes a 2-bit up-counter 51 instead of the up-counter 21. The rising edge waveform information obtaining circuit 50 counts the number of rising edges of the waveform of the SCL input signal outputted from the SCL input buffer 112, and outputs a rising edge count signal representing the counted number.

The rising failure determination circuit 60 has the same configuration as the failure determination circuit 30.

Figure 13A:
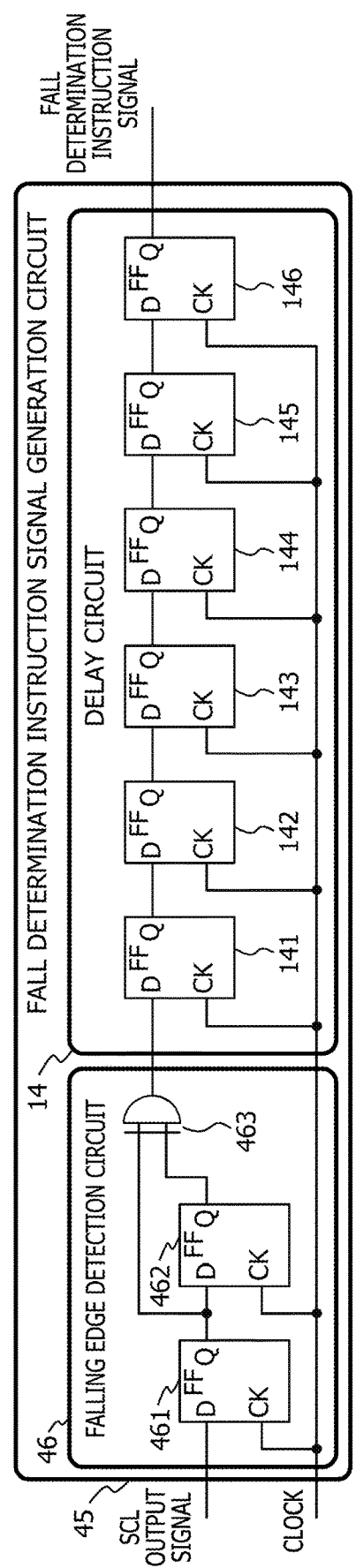
FIG. 13A is a diagram illustrating a fall determination instruction signal generation circuit illustrated in FIG. 10.
Figure 13B:
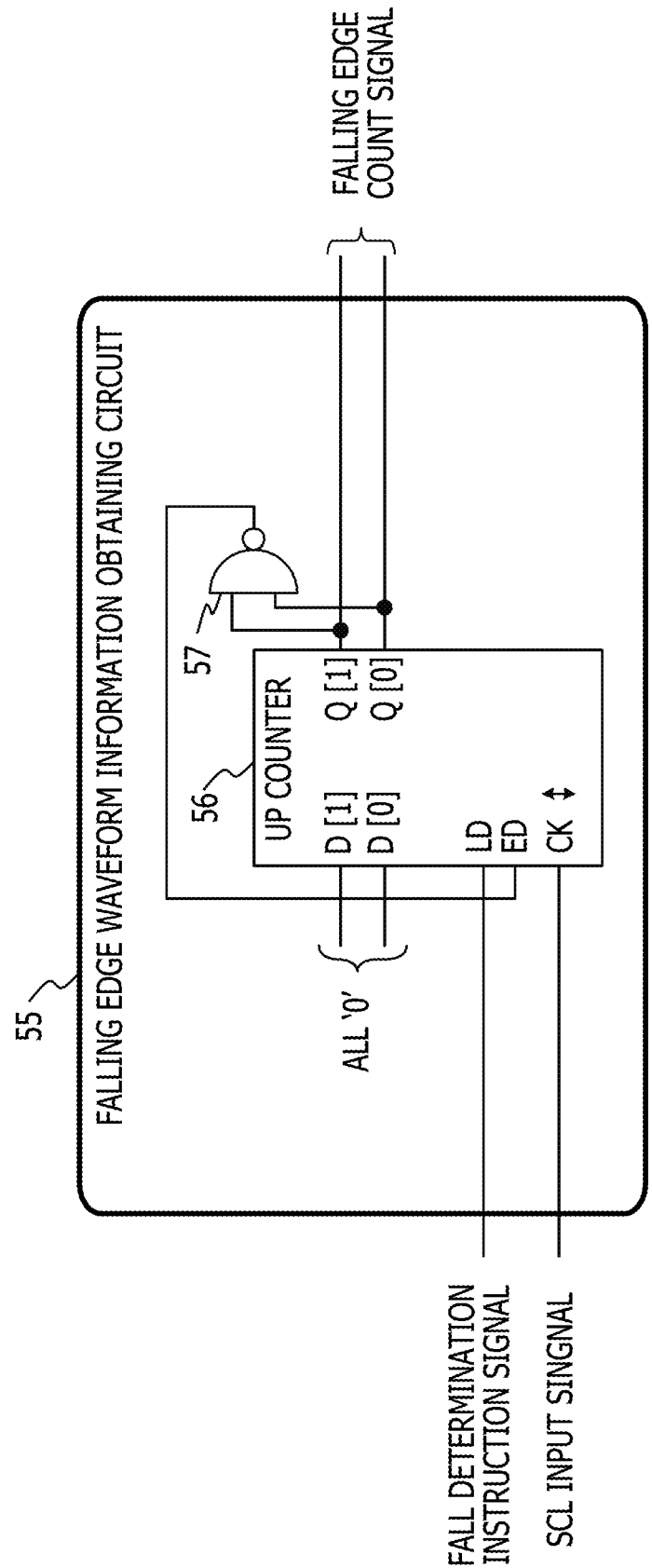
FIG. 13B is a diagram illustrating a falling edge waveform information obtaining circuit illustrated in FIG. 10.

FIG. 13A is a diagram illustrating the fall determination instruction signal generation circuit 45, and FIG. 13B is a diagram illustrating the falling edge waveform information obtaining circuit 55.

The fall determination instruction signal generation circuit 45 is different from the determination instruction signal generation circuit 10 in that the fall determination instruction signal generation circuit 45 includes a falling edge detection circuit 46 instead of the edge detection circuit 13. The falling edge detection circuit 46 includes a first edge flip-flop 461, a second edge flip-flop 462, and a falling edge AND element 463. The falling edge detection circuit 46 detects a falling edge of the SCL output signal, and outputs an edge detection signal.

The falling edge waveform information obtaining circuit 55 is different from the edge waveform information obtaining circuit 20 in that the falling edge waveform information obtaining circuit 55 includes a 2-bit up-counter 56 instead of the up-counter 21. The falling edge waveform information obtaining circuit 55 counts the number of falling edges of the waveform of the SCL input signal outputted from the SCL input buffer 112, and outputs a falling edge count signal representing the counted number.

The falling failure determination circuit 65 has the same configuration as the failure determination circuit 30.

Figure 14:
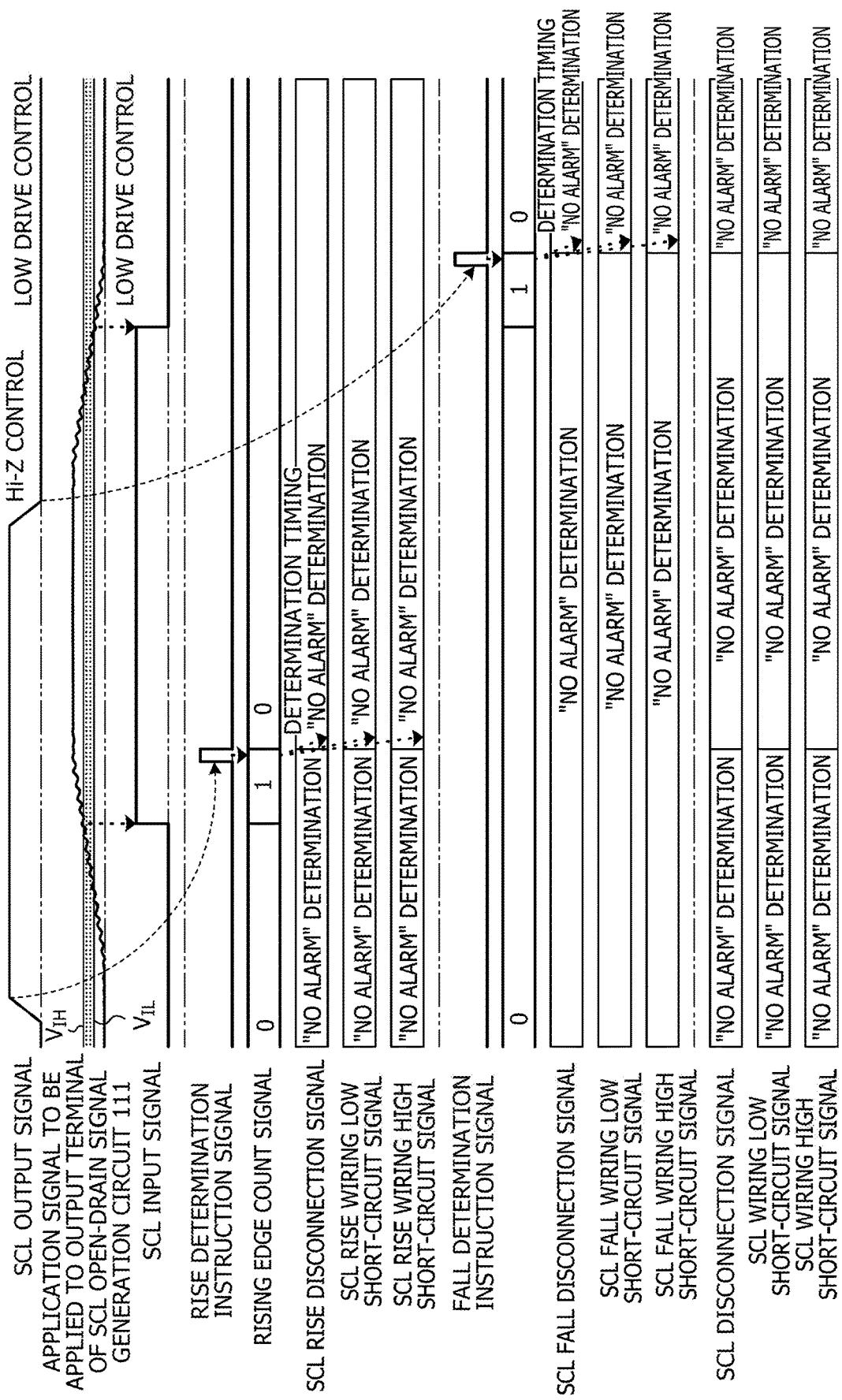
FIG. 14 is a diagram illustrating a timing chart of how signals change over time in a case where no failure occurs in an SCL transmission path in the second embodiment.

FIG. 14 is a diagram illustrating a timing chart of how the signals change over time in a case where no failure occurs in the SCL transmission path in the second embodiment.

While no failure occurs in the SCL transmission path, the rising failure determination circuit 60 sets the edge count signal representing the counted number of rising edges of the SCL input signal at "1" in response to the transition of the SCL input signal from "0" to "1". Once a determination instruction signal is inputted into the rising failure determination circuit 60 from the rise determination instruction signal generation circuit 40, the rising failure determination circuit 60 determines that no failure occurs in the SCL transmission path since the counted number of edge is "1".

While no failure occurs in the SCL transmission path, the falling failure determination circuit 65 sets the edge count signal representing the counted number of falling edges of the SCL input signal at "1" in response to the transition of the SCL input signal from "1" to "0". Once a determination instruction signal is inputted into the falling failure determination circuit 65 from the fall determination instruction signal generation circuit 45, the falling failure determination circuit 65 determines that no failure occurs in the SCL transmission path since the counted number of edge is "1".

Figure 15:
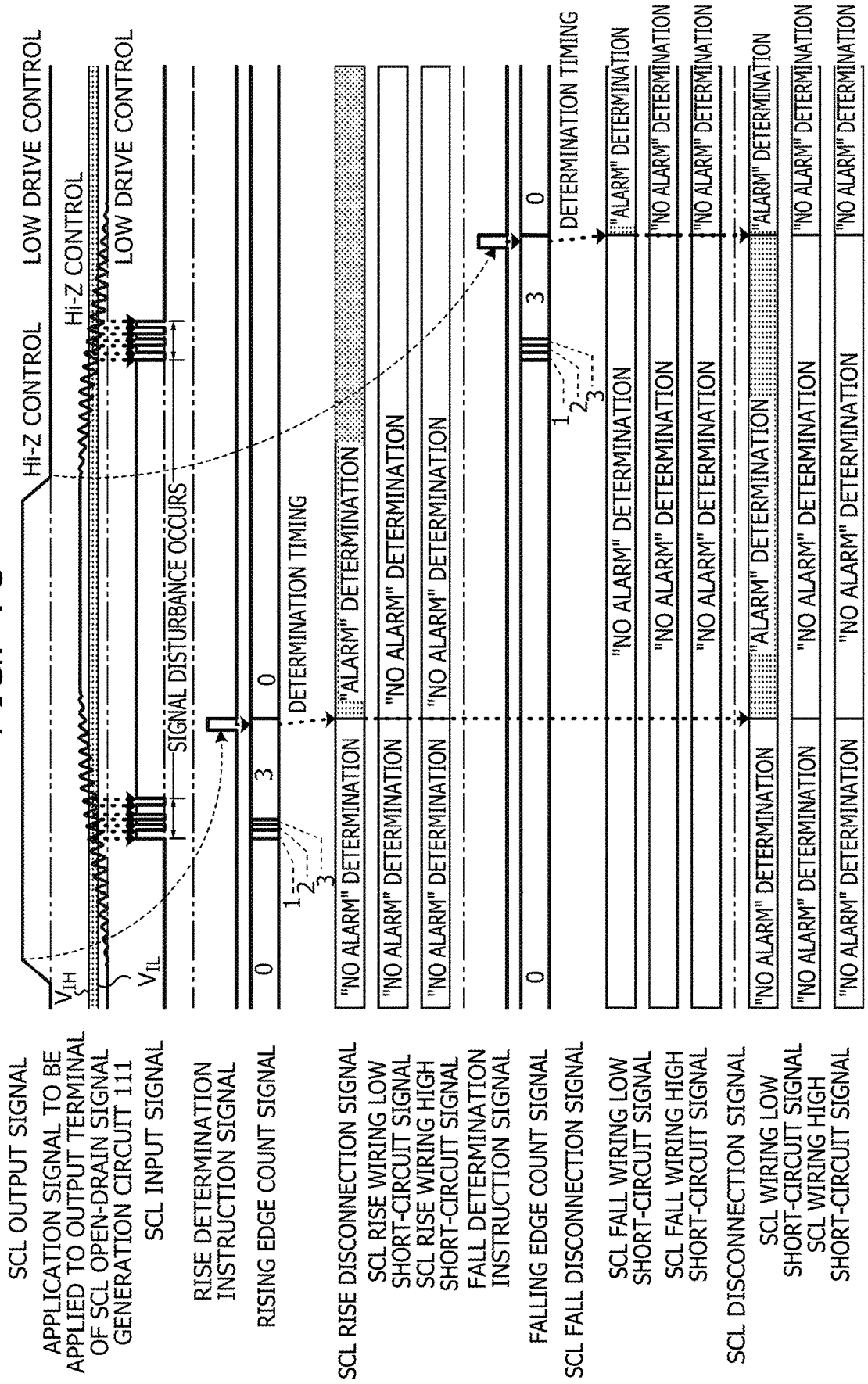
FIG. 15 is a diagram illustrating a timing chart of how the signals change over time in a case where a disconnection failure occurs in the SCL transmission path in the second embodiment.

FIG. 15 is a diagram illustrating a timing chart of how the signals change over time in a case where a disconnection failure occurs in the SCL transmission path in the second embodiment.

When a disconnection failure occurs in the SCL transmission path, the SCL input signal transits back and forth between "0" and "1" several times, and the rising failure determination circuit 60 sets the edge count signal representing the counted number of rising edges of the SCL input signal at "3". Once a determination instruction signal is inputted into the rising failure determination circuit 60 from the rise determination instruction signal generation circuit 40, the rising failure determination circuit 60 determines that a disconnection failure occurs in the SCL transmission path since the counted number of edge is "3", and outputs an SCL disconnection signal.

Similarly, since the counted number of edges in response to the fall transition of the SCL output signal is "3", the falling failure determination circuit 65 determines that a disconnection failure occurs in the SCL transmission path, and outputs an SCL disconnection signal.

Figure 16:
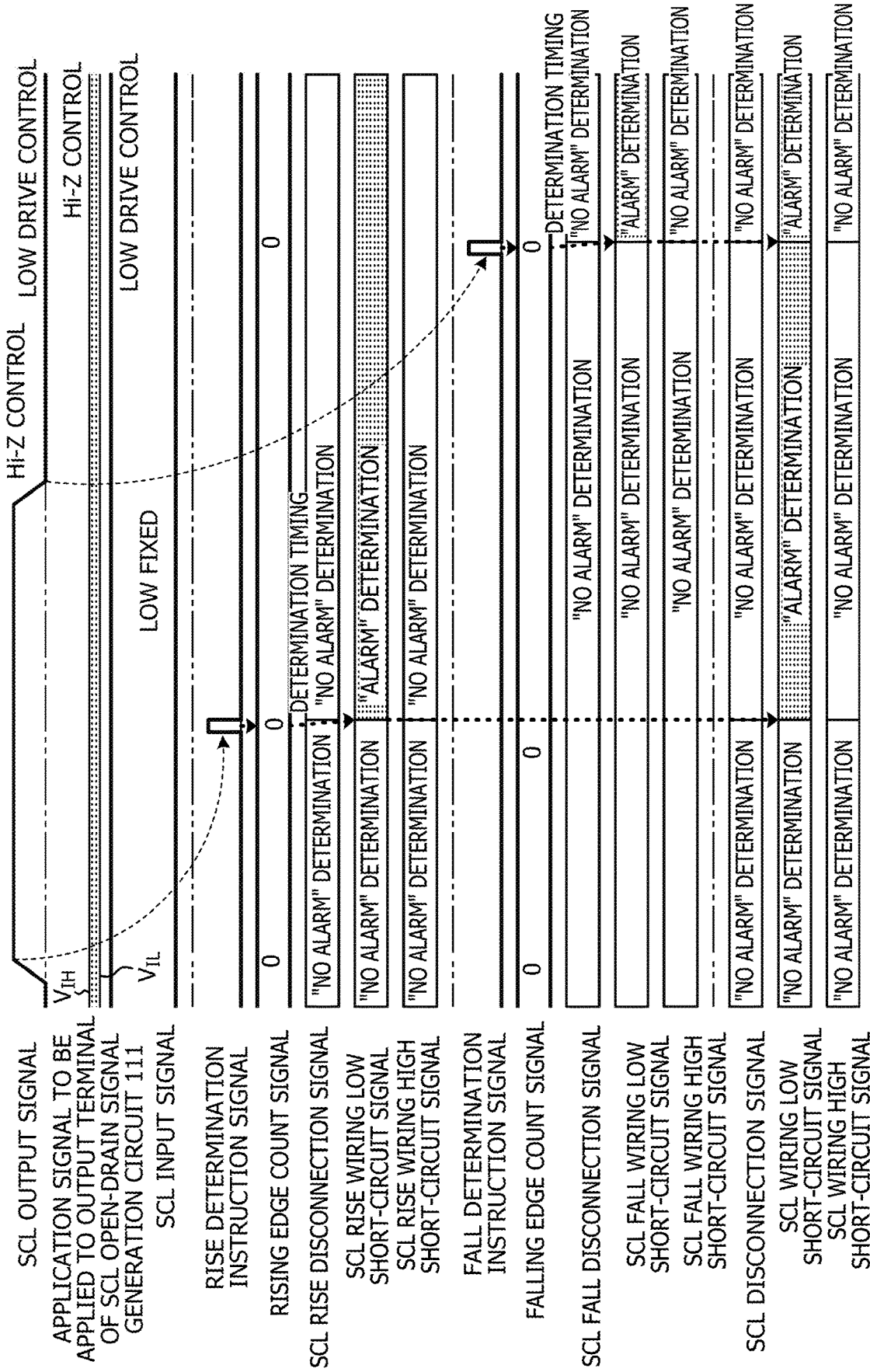
FIG. 16 is a diagram illustrating a timing chart of how the signals change over time in a case where a low short-circuit failure occurs in the SCL transmission path in the second embodiment.

FIG. 16 is a diagram illustrating a timing chart of how the signals change over time in a case where a low short-circuit failure occurs in the SCL transmission path in the second embodiment.

When a low short-circuit failure occurs in the SCL transmission path, the application signal applied to the output terminal of the SCL input buffer 112 is held at "0", and the edge count signal remains at "0". Since the counted number of edges is "0" and the SCL input signal is at "0", the rising failure determination circuit 60 determines that a low short-circuit failure occurs in the SCL transmission path. Thus, the rising failure determination circuit 60 outputs an SCL wiring low short-circuit signal.

Similarly, since the counted number of edges is "0" in response to the fall transition of the SCL output signal and the SCL input signal is at "0", the falling failure determination circuit 65 determines that a low short-circuit failure occurs in the SCL transmission path. Thus, the falling failure determination circuit 65 outputs an SCL wiring low short-circuit signal.

Figure 17:
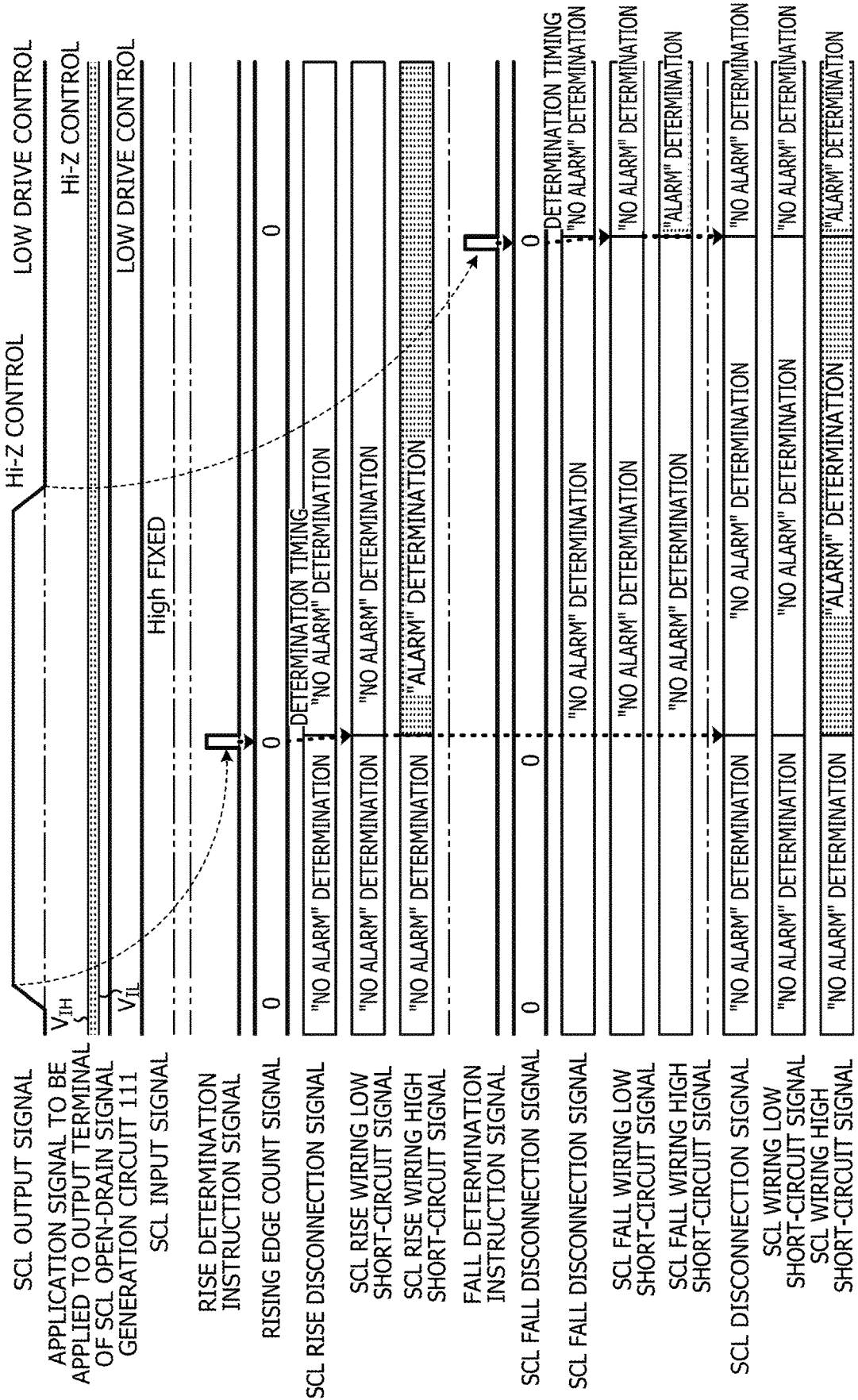
FIG. 17 is a diagram illustrating a timing chart of how the signals change over time in a case where a high short-circuit failure occurs in the SCL transmission path in the second embodiment.

FIG. 17 is a diagram illustrating a timing chart of how the signals change over time in a case where a high short-circuit failure occurs in the SCL transmission path in the second embodiment.

When a high short-circuit failure occurs in the SCL transmission path, the application signal applied to the output terminal of the SCL input buffer 112 is held at "1", and the edge count signal remains at "0". Since the counted number of edges is "0" and the SCL input signal is at "1", the rising failure determination circuit 60 determines that a high short-circuit failure occurs in the SCL transmission path. Thus, the rising failure determination circuit 60 outputs an SCL wiring high short-circuit signal.

Similarly, since the counted number of edges is "0" in response to the fall transition of the SCL output signal and the SCL input signal is at "1", the falling failure determination circuit 65 determines that a high short-circuit failure occurs in the SCL transmission path. Thus, the falling failure determination circuit 65 outputs an SCL wiring high short-circuit signal.

The SDA transmission path failure determination circuit 4 has the same configuration as the SCL transmission path failure determination circuit 3, and detailed description for the SDA transmission path failure determination circuit 4 is omitted herein.

(Transmission Apparatus According to Third Embodiment)

Figure 18:
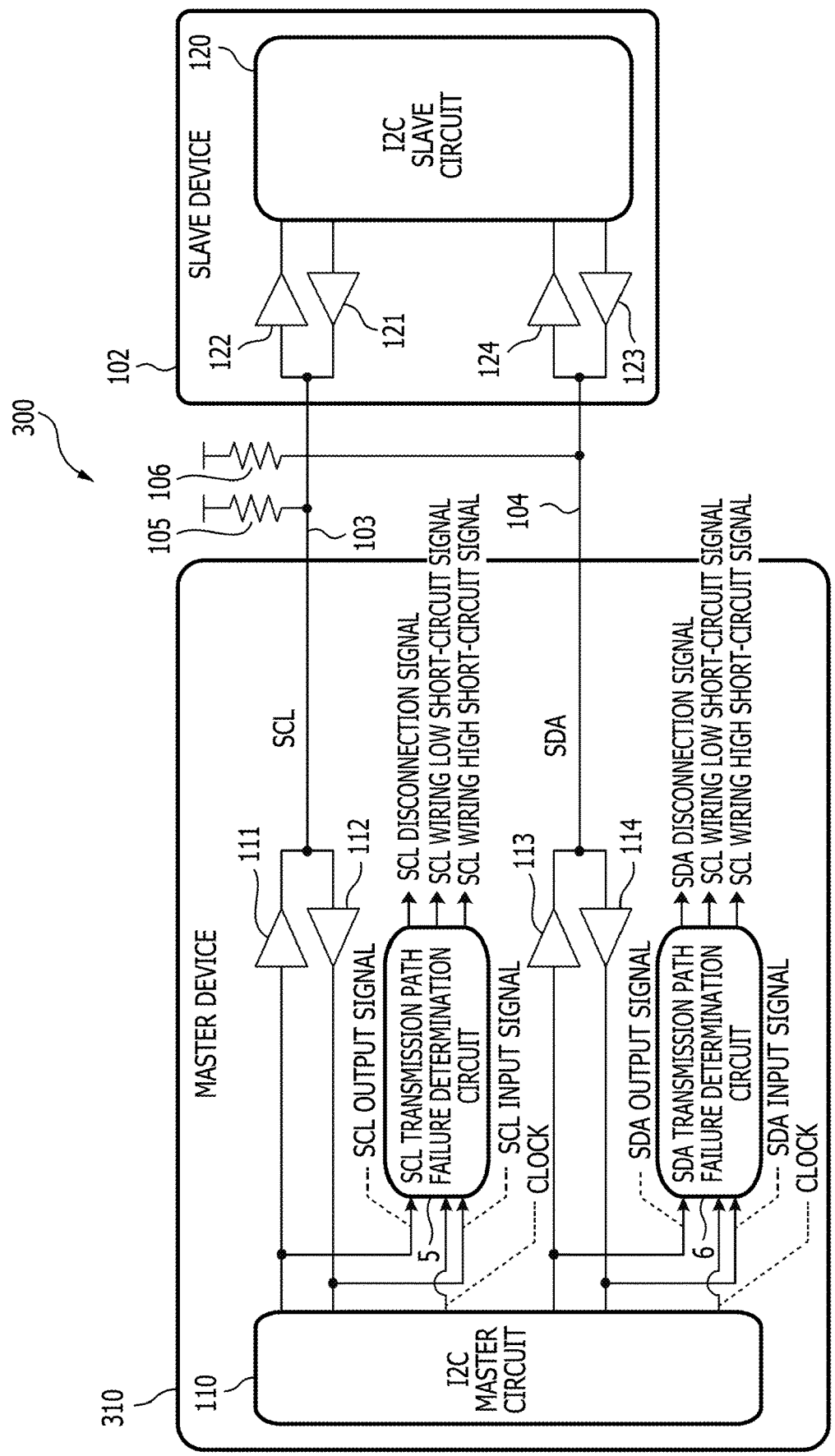
FIG. 18 is a diagram illustrating a communication system which includes a transmission apparatus according to a third embodiment.

FIG. 18 is a diagram illustrating a communication system which includes a transmission apparatus according to a third embodiment.

A communication system 300 is different from the communication system 100 in that the communication system 300 includes a master device 310 instead of the master device 101. The master device 310 is different from the master device 101 that the master device 310 includes an SCL transmission path failure determination circuit 5 and an SDA transmission path failure determination circuit 6 instead of the SCL transmission path failure determination circuit 1 and the SDA transmission path failure determination circuit 2. Except for the SCL transmission path failure determination circuit 5 and the SDA transmission path failure determination circuit 6, the components of the communication system 300 have the same configurations and functions as those of the communication system 100 which are denoted by the same reference signs, and detailed descriptions are omitted.

Figure 19:
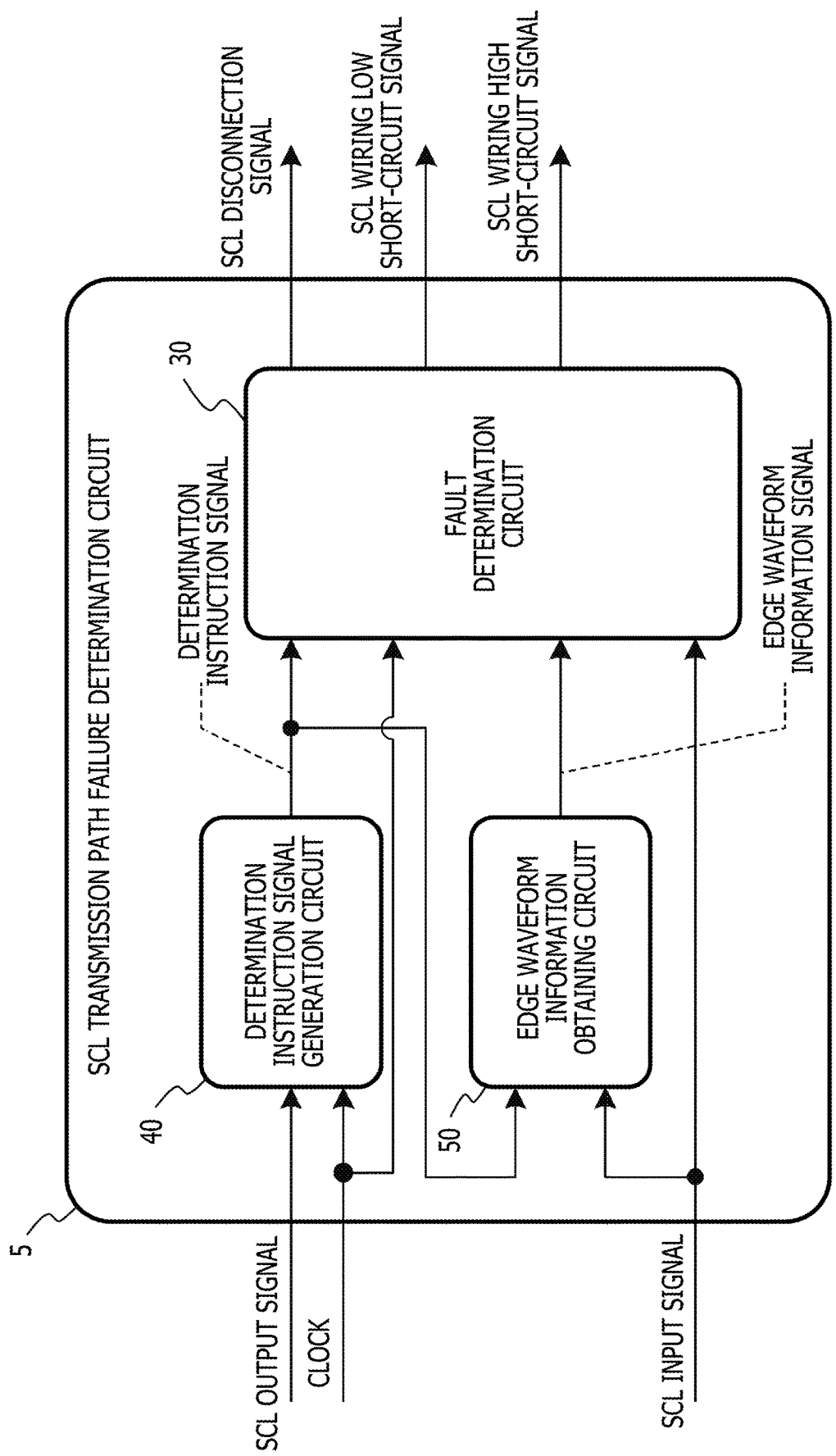
FIG. 19 is a diagram illustrating an SCL transmission path failure determination circuit illustrated in FIG. 18.

FIG. 19 is a diagram illustrating the SCL transmission path failure determination circuit 5.

The SCL transmission path failure determination circuit 5 includes the rise determination instruction signal generation circuit 40, the rising edge waveform information obtaining circuit 50, and the failure determination circuit 30. Depending on a rising edge of the SCL input signal, the SCL transmission path failure determination circuit 5 determines whether there is a failure in the SCL transmission path. The configurations and functions of the rise determination instruction signal generation circuit 40 and the rising edge waveform information obtaining circuit 50 have been discussed by referring to FIGS. 12A and 12B, and detailed descriptions are omitted herein. The configuration and function of the failure determination circuit 30 have been discussed by referring to FIG. 4C, and detailed descriptions are omitted herein.

Figure 20:
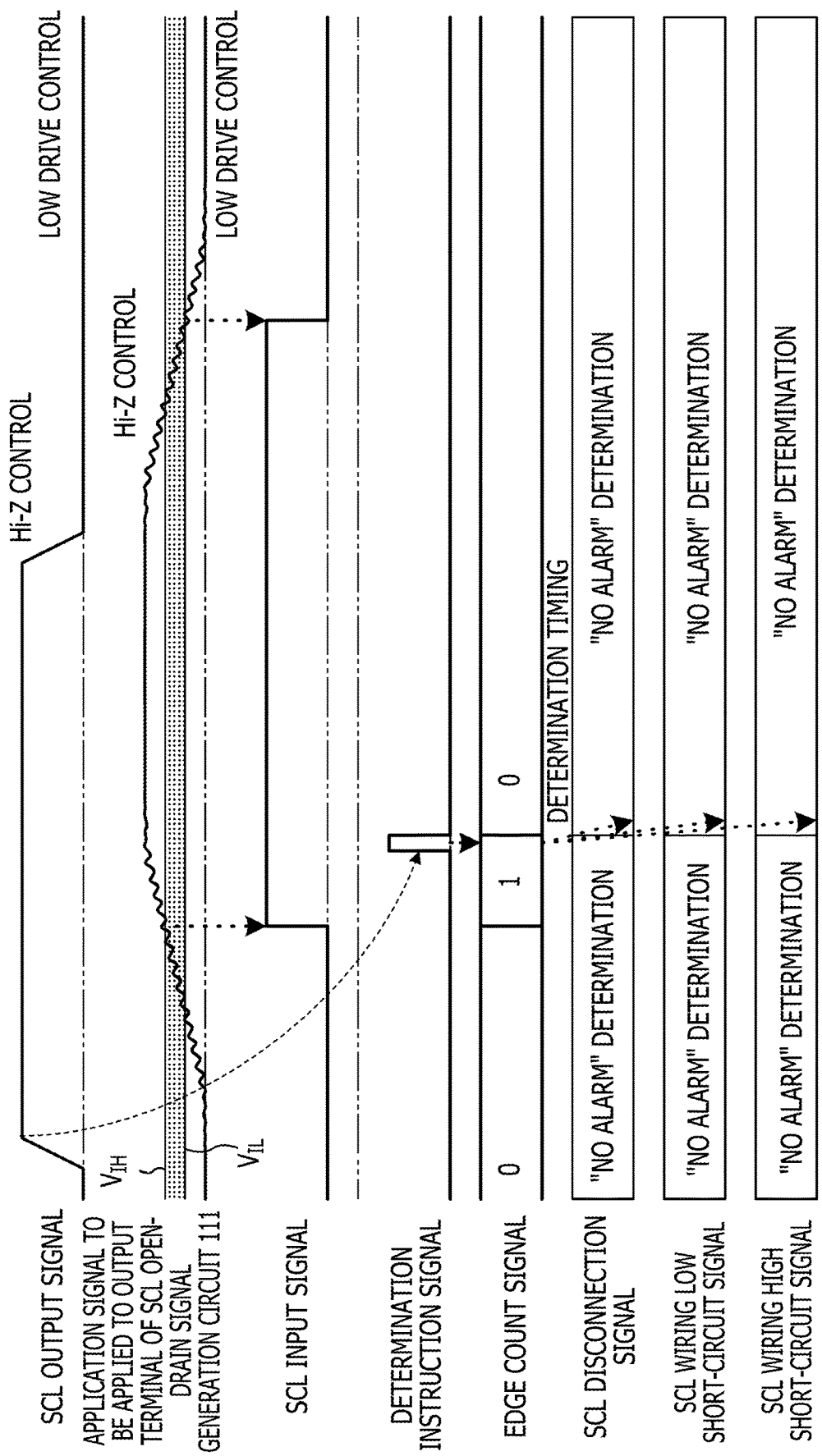
FIG. 20 is a diagram illustrating a timing chart of how signals change over time in a case where no failure occurs in an SCL transmission path in the third embodiment.

FIG. 20 is a diagram illustrating a timing chart of how the signals change over time in a case where no failure occurs in the SCL transmission path in the third embodiment.

While no failure occurs in the SCL transmission path, the failure determination circuit 30 sets the edge count signal representing the counted number of rising edges of the SCL input signal at "1" in response to the transition of the SCL input signal from "0" to "1". Once a determination instruction signal is inputted into the failure determination circuit 30 from the rise determination instruction signal generation circuit 40, the failure determination circuit 30 determines that no failure occurs in the SCL transmission path since the counted number of edge is "1". When the SCL input signal transits from "1" to "0", the failure determination circuit 30 performs no failure determination process.

Figure 21:
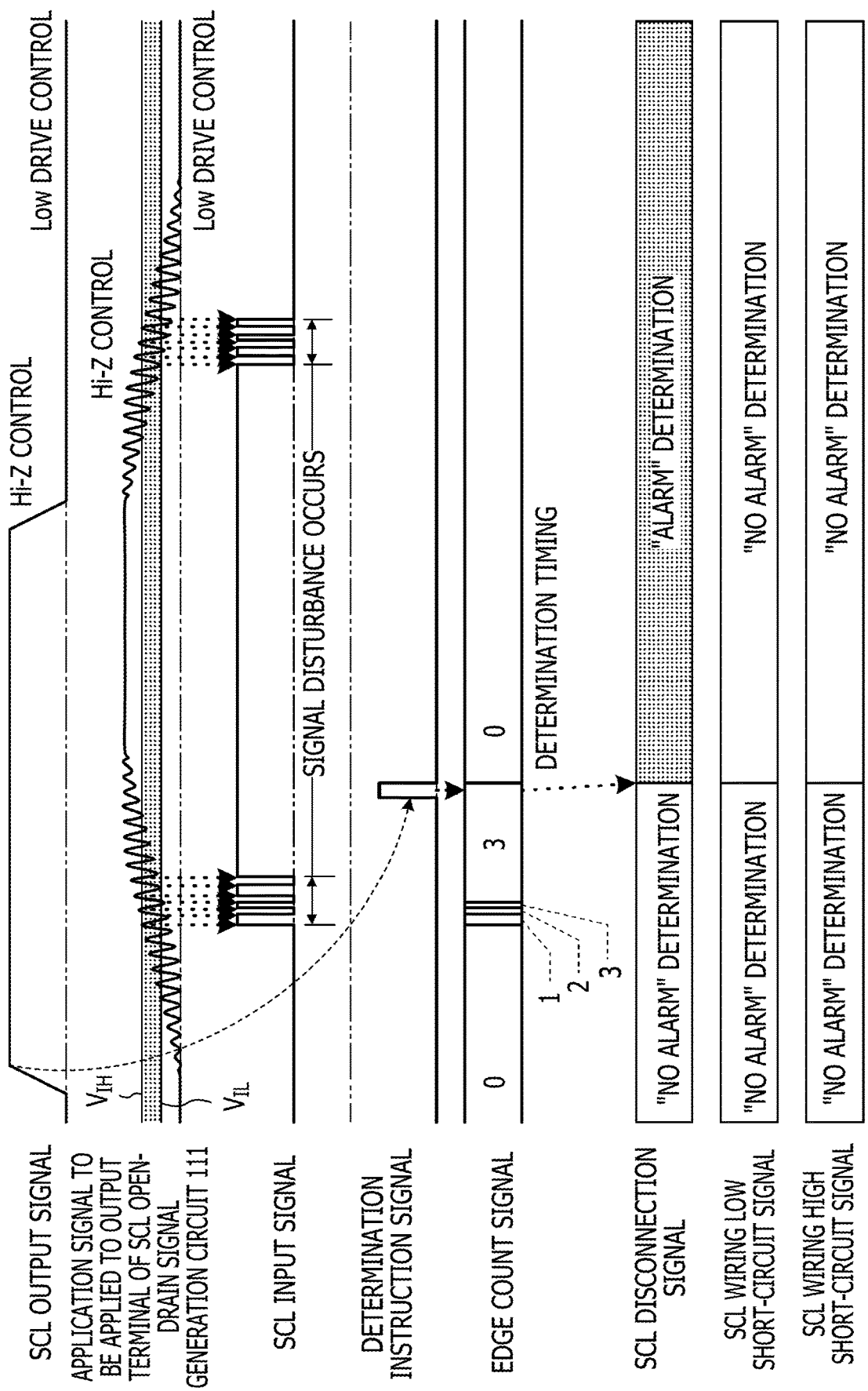
FIG. 21 is a diagram illustrating a timing chart of how the signals change over time in a case where a disconnection failure occurs in the SCL transmission path in the third embodiment.

FIG. 21 is a diagram illustrating a timing chart of how the signals change over time in a case where a disconnection failure occurs in the SCL transmission path in the third embodiment.

When a disconnection failure occurs in the SCL transmission path, the SCL input signal transits back and forth between "0" and "1" several times, and the failure determination circuit 30 sets the edge count signal representing the counted number of rising edges of the SCL input signal at "3". Once a determination instruction signal is inputted into the failure determination circuit 30 from the rise determination instruction signal generation circuit 40, the failure determination circuit 30 determines that a disconnection failure occurs in the SCL transmission path since the counted number of edge is "3", and outputs an SCL disconnection signal. When the SCL input signal transits from "1" to "0", the failure determination circuit 30 performs no failure determination process.

Figure 22:
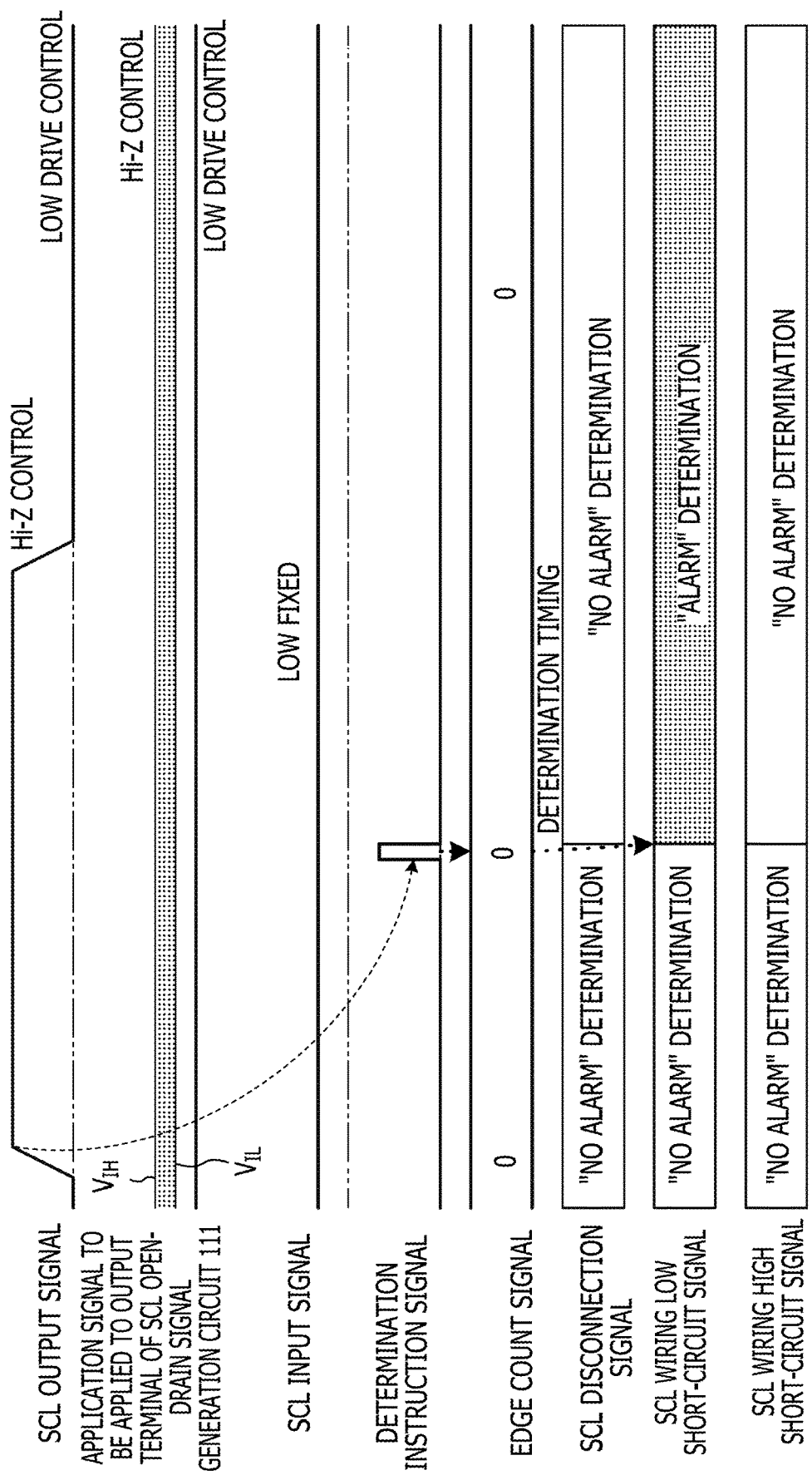
FIG. 22 is a diagram illustrating a timing chart of how the signals change over time in a case where a low short-circuit failure occurs in the SCL transmission path in the third embodiment.

FIG. 22 is a diagram illustrating a timing chart of how the signals change over time in a case where a low short-circuit failure occurs in the SCL transmission path in the third embodiment.

When a low short-circuit failure occurs in the SCL transmission path, the application signal applied to the output terminal of the SCL input buffer 112 is held at "0", and the edge count signal remains at "0". Since the counted number of edges is "0" and the SCL input signal is at "0", the failure determination circuit 30 determines that a low short-circuit failure occurs in the SCL transmission path. Thus, the failure determination circuit 30 outputs an SCL wiring low short-circuit signal. When the SCL input signal transits from "1" to "0", the failure determination circuit 30 performs no failure determination process.

Figure 23:
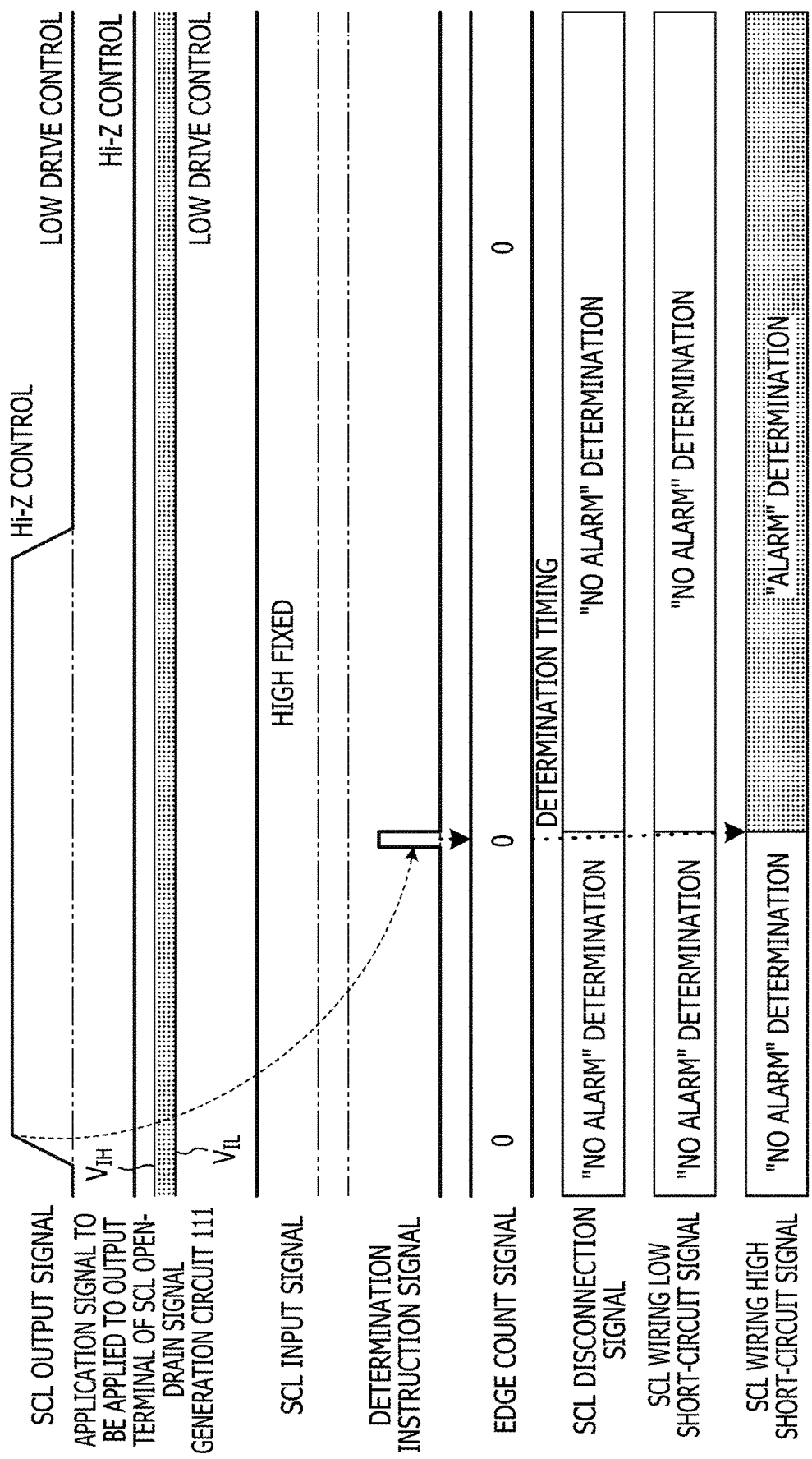
FIG. 23 is a diagram illustrating a timing chart of how the signals change over time in a case where a high short-circuit failure occurs in the SCL transmission path in the third embodiment.

FIG. 23 is a diagram illustrating a timing chart of how the signals change over time in a case where a high short-circuit failure occurs in the SCL transmission path in the third embodiment.

When a high short-circuit failure occurs in the SCL transmission path, the application signal applied to the output terminal of the SCL input buffer 112 is held at "1", and the edge count signal remains at "0". Since the counted number of edges is "0" and the SCL input signal is at "1", the failure determination circuit 30 determines that a high short-circuit failure occurs in the SCL transmission path. Thus, the failure determination circuit 30 outputs an SCL wiring high short-circuit signal. When the SCL input signal transits from "1" to "0", the failure determination circuit 30 performs no failure determination process.

The SDA transmission path failure determination circuit 6 has the same configuration as the SCL transmission path failure determination circuit 5, and detailed description for the SDA transmission path failure determination circuit 6 is omitted herein.

(Transmission Apparatus According to Fourth Embodiment)

Figure 24:
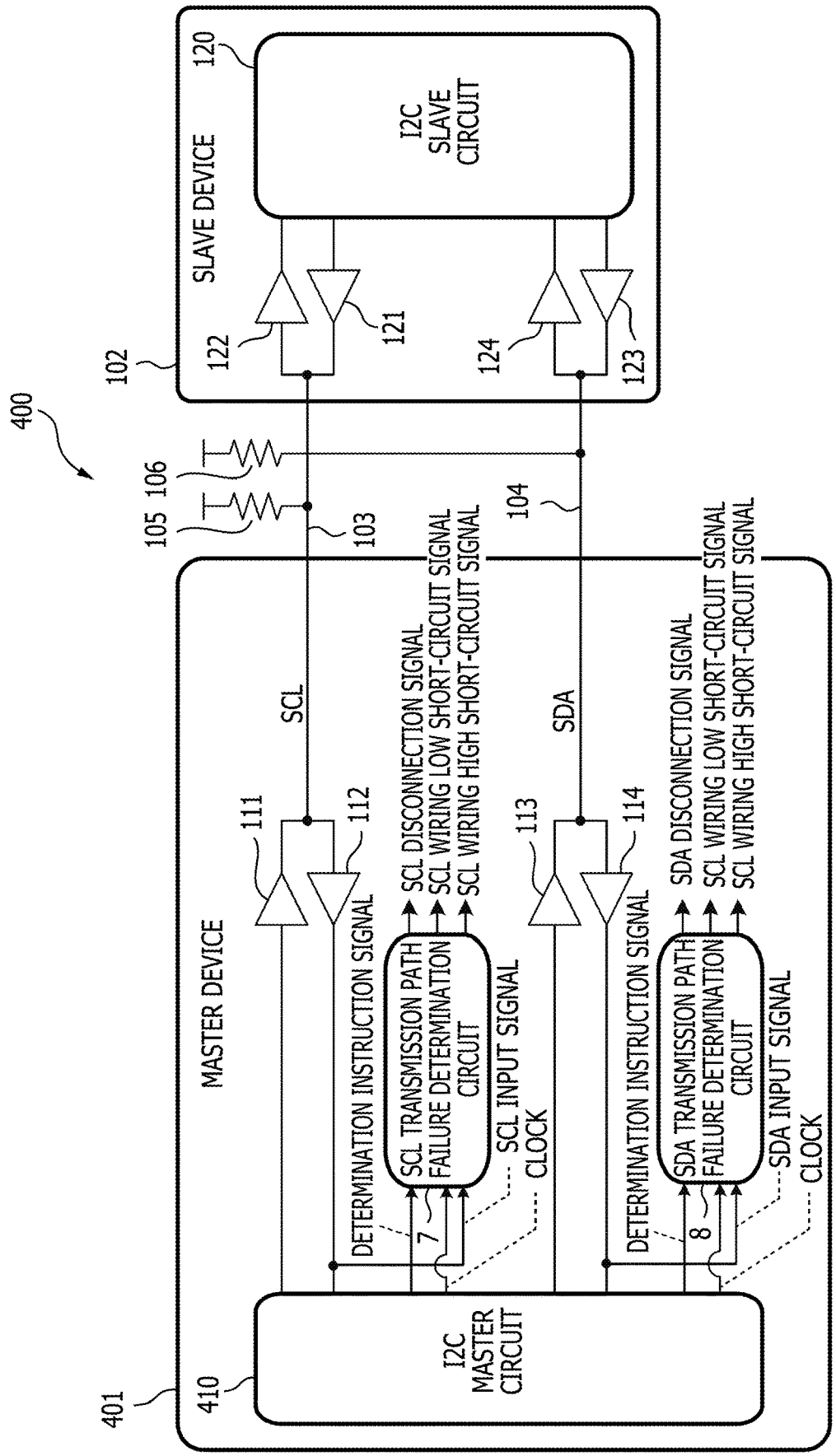
FIG. 24 is a diagram illustrating a communication system which includes a transmission apparatus according to a fourth embodiment.

FIG. 24 is a diagram illustrating a communication system which includes a transmission apparatus according to a fourth embodiment.

A communication system 400 is different from the communication system 100 in that the communication system 400 includes a master device 401 instead of the master device 101. The master device 401 is different from the master device 101 in that the master device 401 includes an I2C master circuit 410 instead of the I2C master circuit 110. The master device 401 is further different from the master device 101 in that the master device 401 includes an SCL transmission path failure determination circuit 7 and an SDA transmission path failure determination circuit 8 instead of the SCL transmission path failure determination circuit 1 and the SDA transmission path failure determination circuit 2. Except for the I2C master circuit 410, the SCL transmission path failure determination circuit 7 and the SDA transmission path failure determination circuit 8, the components of the communication system 400 have the same configurations and functions as those of the communication system 100 which are denoted by the same reference signs, and detailed descriptions are omitted.

The I2C master circuit 410 is different from the I2C master circuit 110 in that the I2C master circuit 410 generates a determination instruction signal, and outputs the generated determination instruction signal to the SCL transmission path failure determination circuit 7 and the SDA transmission path failure determination circuit 8. The I2C master circuit 410 may include the determination instruction signal generation circuit 10, for example, inside the I2C master circuit 410.

Figure 25:
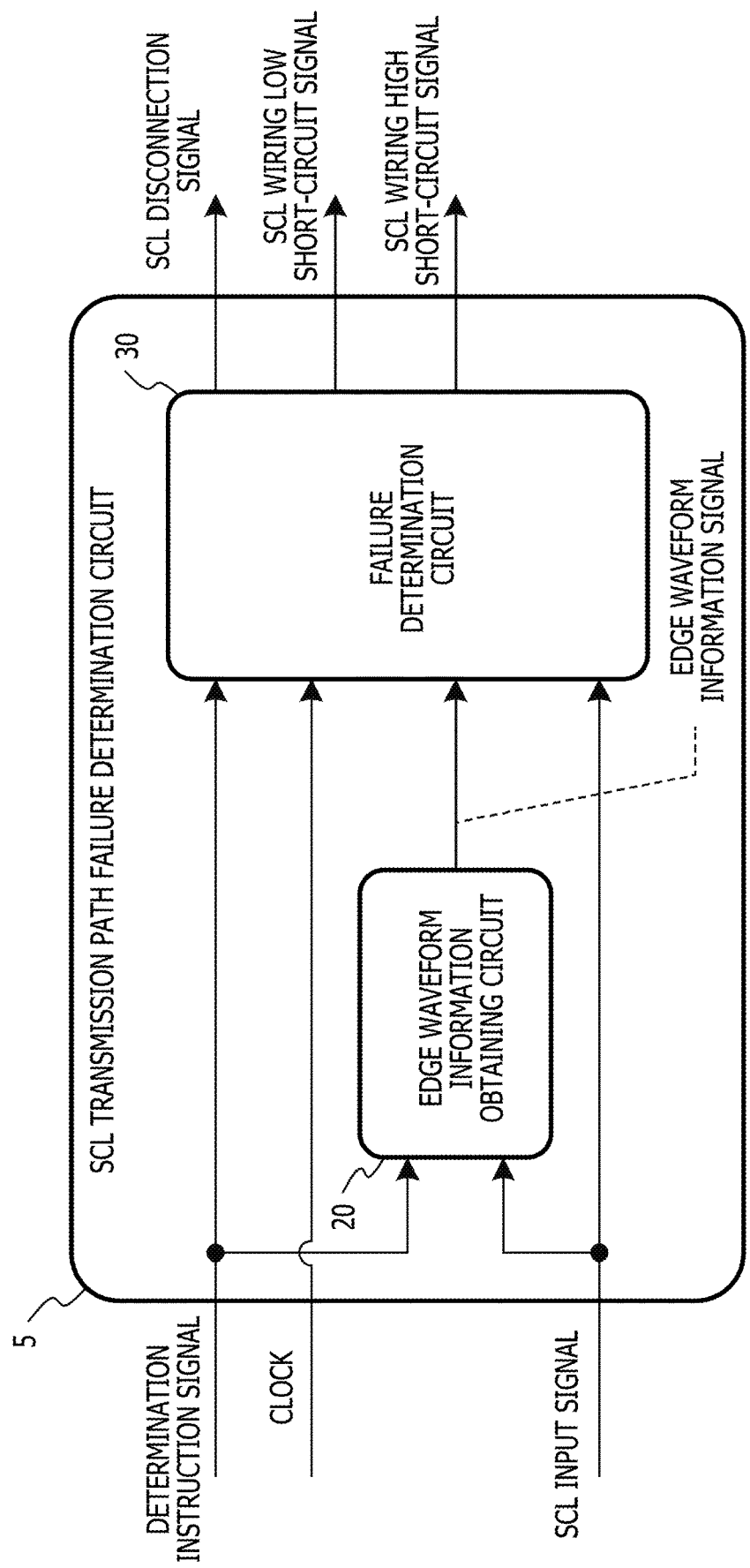
FIG. 25 is a diagram illustrating an SCL transmission path failure determination circuit illustrated in FIG. 24.

FIG. 25 is a diagram illustrating the SCL transmission path failure determination circuit 7.

The SCL transmission path failure determination circuit 7 is different from the SCL transmission path failure determination circuit 1 in that the SCL transmission path failure determination circuit 7 does not include the determination instruction signal generation circuit 10. The configuration and function of the edge waveform information obtaining circuit 20 have been discussed by referring to FIGS. 4B and 4C, and detailed descriptions are omitted herein.

(Transmission Apparatus According to Fifth Embodiment)

Figure 26:
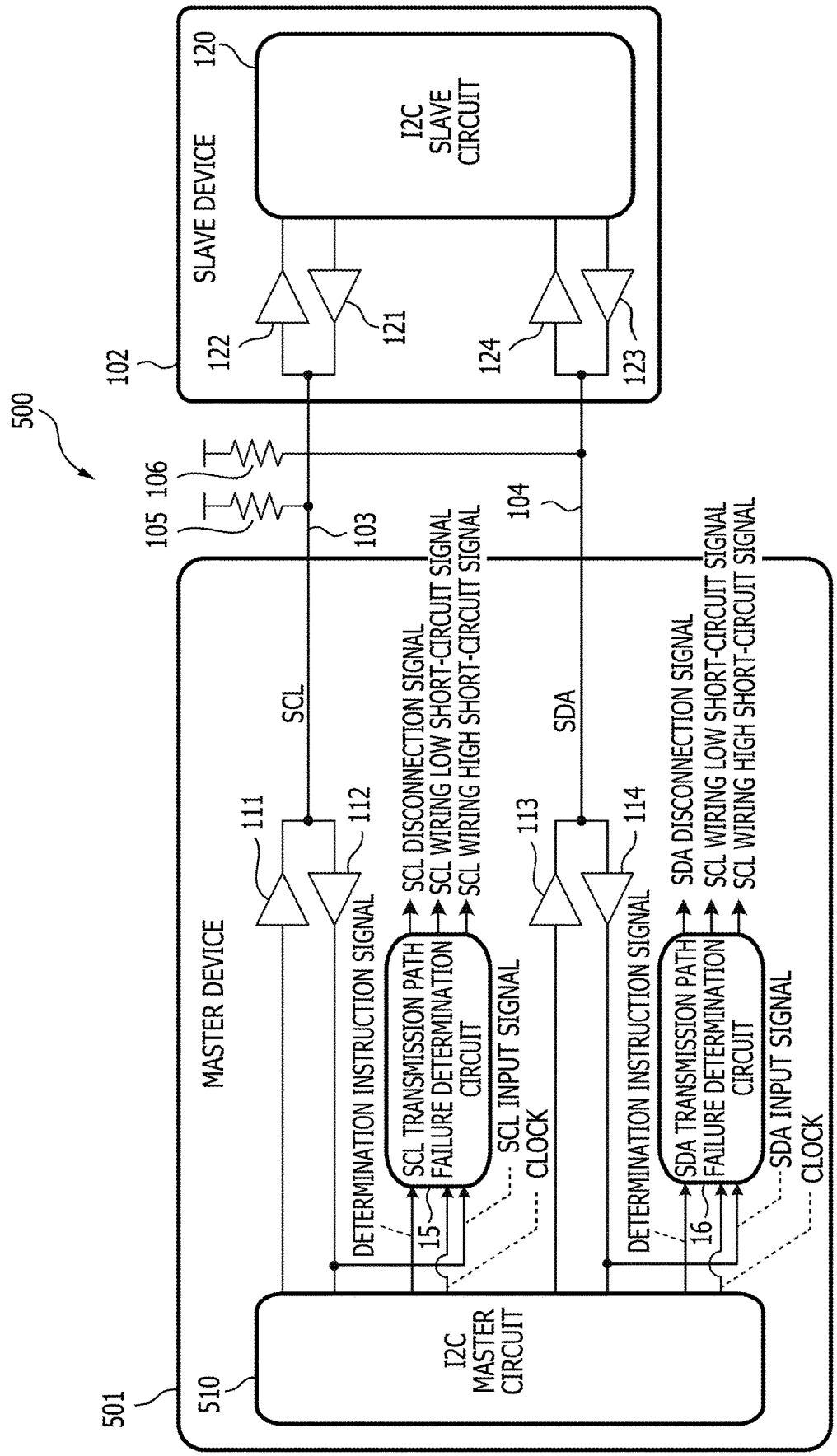
FIG. 26 is a diagram illustrating a communication system which includes a transmission apparatus according to a fifth embodiment.

FIG. 26 is a diagram illustrating a communication system which includes a transmission apparatus according to a fifth embodiment.

A communication system 500 is different from the communication system 100 in that the communication system 500 includes a master device 501 instead of the master device 101. The master device 501 is different from the master device 101 in that the master device 501 includes an I2C master circuit 510 instead of the I2C master circuit 110. The master device 501 is further different from the master device 101 in that the master device 501 includes an SCL transmission path failure determination circuit 15 and an SDA transmission path failure determination circuit 16 instead of the SCL transmission path failure determination circuit 1 and the SDA transmission path failure determination circuit 2. Except for the I2C master circuit 510, the SCL transmission path failure determination circuit 15 and the SDA transmission path failure determination circuit 16, the components of the communication system 500 have the same configurations and functions as those of the communication system 100 which are denoted by the same reference signs, and detailed descriptions are omitted.

Figure 27:
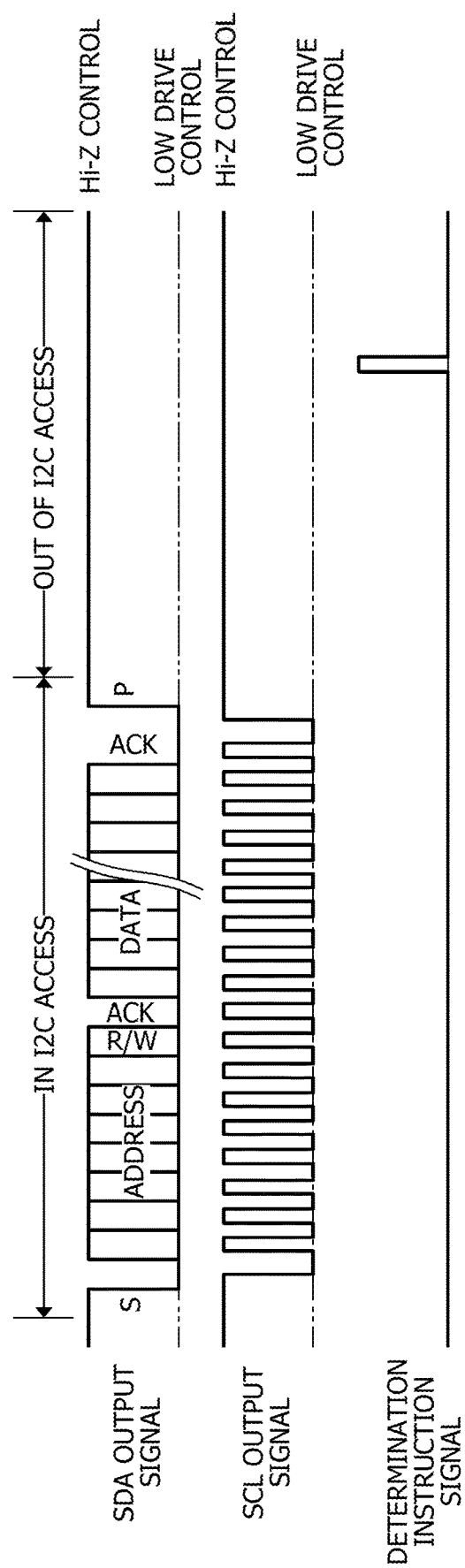
FIG. 27 is a timing chart illustrating how signals change over time while an I2C master circuit 510 is performing a process.

The I2C master circuit 510 is different from the I2C master circuit 110 in that the I2C master circuit 510 generates a determination instruction signal, and outputs the generated determination instruction signal to the SCL transmission path failure determination circuit 15 and the SDA transmission path failure determination circuit 16. The I2C master circuit 510 determines the timing at which to output the determination instruction signal, based on the SCL output signal, the SCL input signal, the SDA output signal, and the SDA input signal. As illustrated in FIG. 27, the I2C master circuit 510 may output the determination instruction signal, for example, in an inter-frame interval where no communications are made after a frame where an address signal and a data signal are transmitted and received and before an upcoming frame.

Figure 28:
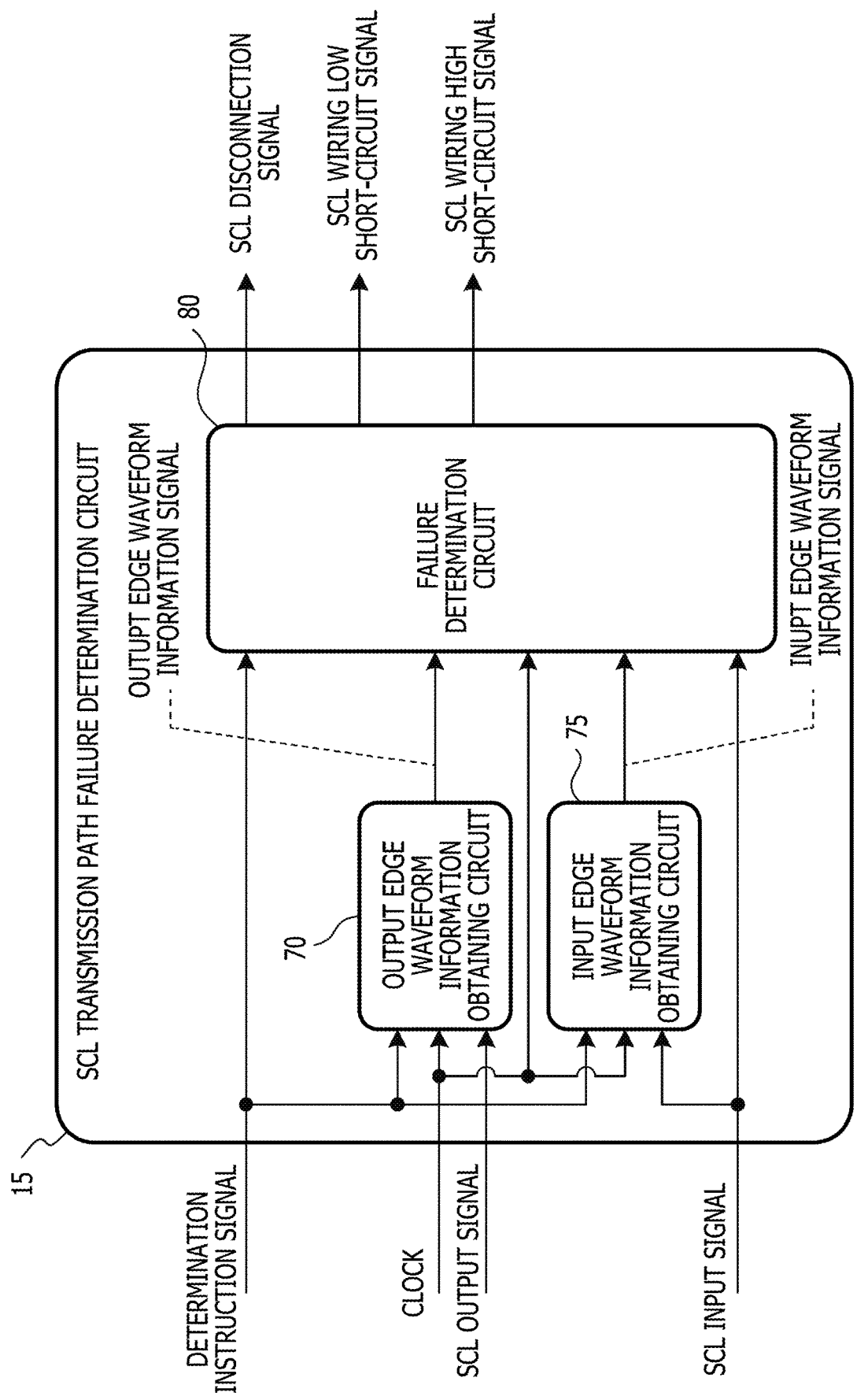
FIG. 28 is a diagram illustrating an SCL transmission path failure determination circuit illustrated in FIG. 26.

FIG. 28 is a diagram illustrating the SCL transmission path failure determination circuit 15.

The SCL transmission path failure determination circuit 15 includes an output edge waveform information obtaining circuit 70, an input edge waveform information obtaining circuit 75, and a failure determination circuit 80.

The output edge waveform information obtaining circuit 70 counts the number of rising and falling edges of the waveform of the SCL output signal outputted from the I2C master circuit 510, and outputs an output edge count signal representing the counted number. The output edge count signal is first edge waveform information representing at least one of the counted number of rising edges and the counted number of falling edges of the waveform of the output signal outputted from the I2C master circuit 510.

The input edge waveform information obtaining circuit 75 counts the number of rising and falling edges of the waveform of the SCL input signal inputted into the I2C master circuit 510, and outputs an input edge count signal representing the counted number. The input edge count signal is second edge waveform information representing at least one of the counted number of rising edges and the counted number of falling edges of the input signal inputted into the I2C master circuit 510.

The failure determination circuit 80 determines whether the counted number corresponding to the output edge count signal and the counted number corresponding to the input edge count signal are equal to each other. When the failure determination circuit 80 determines that the counted number corresponding to the output edge count signal and the counted number corresponding to the input edge count signal are not equal to each other, the failure determination circuit 80 outputs a failure signal.

Figure 29A:
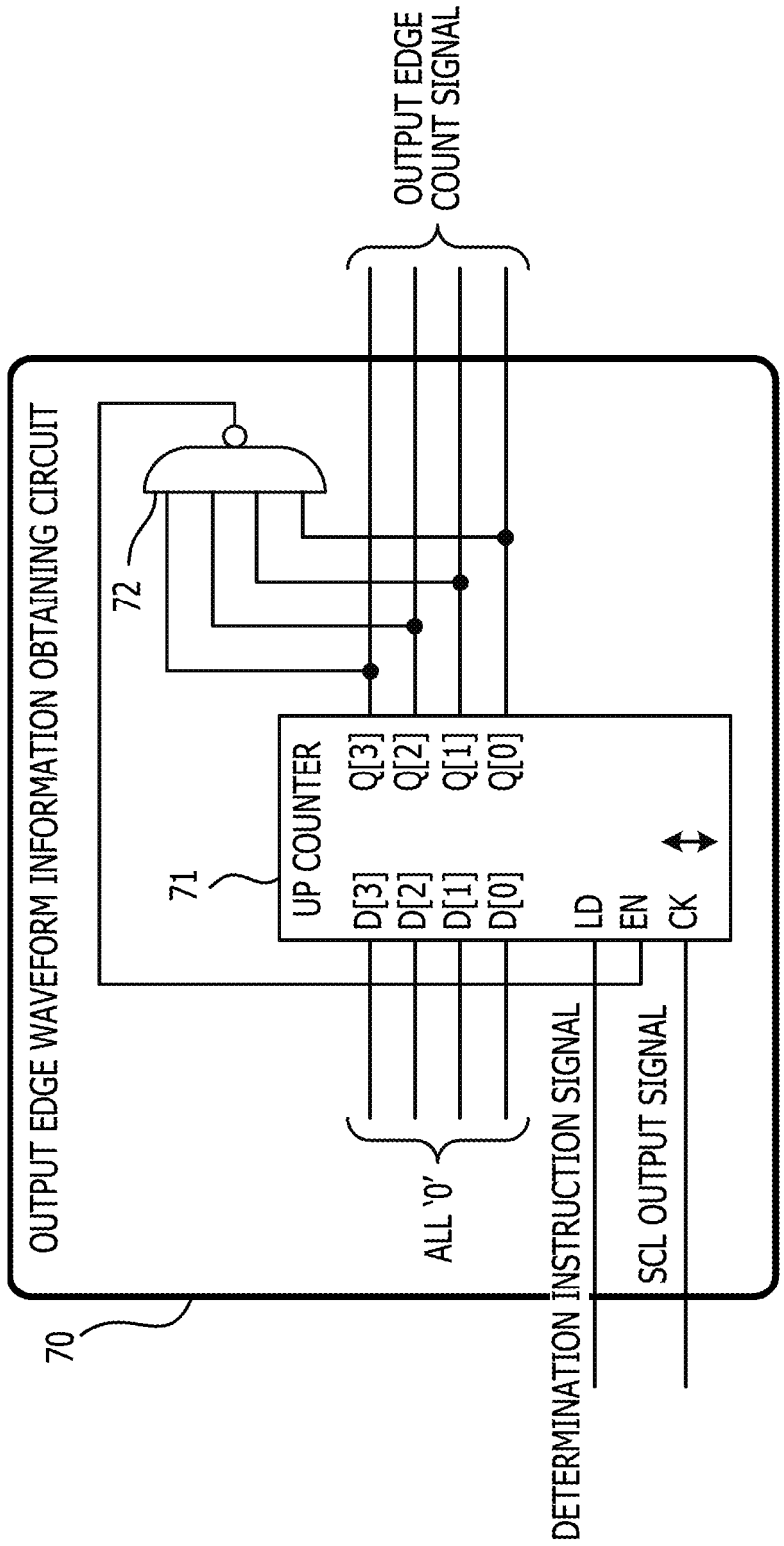
FIG. 29A is a diagram illustrating an output edge waveform information obtaining circuit illustrated in FIG. 28.
Figure 29B:
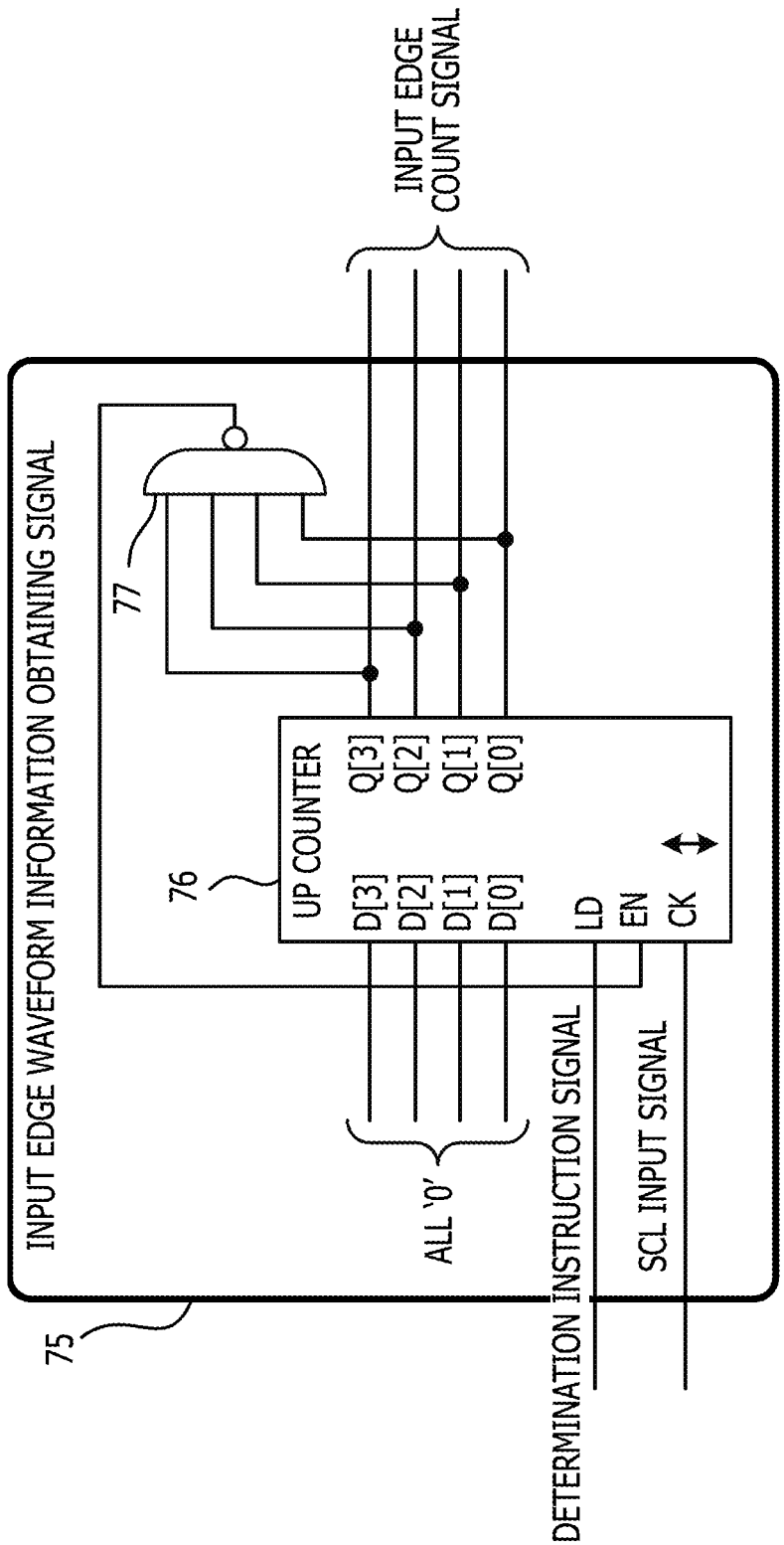
FIG. 29B is a diagram illustrating an input edge waveform information obtaining circuit illustrated in FIG. 28.

FIG. 29A is a diagram illustrating the output edge waveform information obtaining circuit 70. FIG. 29B is a diagram illustrating the input edge waveform information obtaining circuit 75. FIG. 29C is a diagram illustrating the failure determination circuit 80.

The output edge waveform information obtaining circuit 70 includes a 4-bit up-counter 71, and a waveform NAND element 72. The output edge waveform information obtaining circuit 70 counts the number of rising and falling edges of the waveform of the SCL output signal, and outputs an output edge count signal representing the counted number.

The input edge waveform information obtaining circuit 75 includes a 4-bit up-counter 76, and a waveform NAND element 77. The input edge waveform information obtaining circuit 75 counts the number of rising and falling edges of the waveform of the SCL input signal, and outputs an input edge count signal representing the counted number.

The failure determination circuit 80 is different from the failure determination circuit 30 in that the failure determination circuit 80 includes a comparator 81 instead of the comparator 31. Except for the comparator 81, the components of the failure determination circuit 80 have the same configurations and functions as those of the failure determination circuit 30 which are denoted by the same reference signs, and detailed descriptions are omitted herein. The comparator 81 is a 4-bit comparator, and outputs a comparison result signal depending on a result of comparison between the counted number corresponding to the output edge count signal and the counted number corresponding to the input edge count signal.

Figure 30:
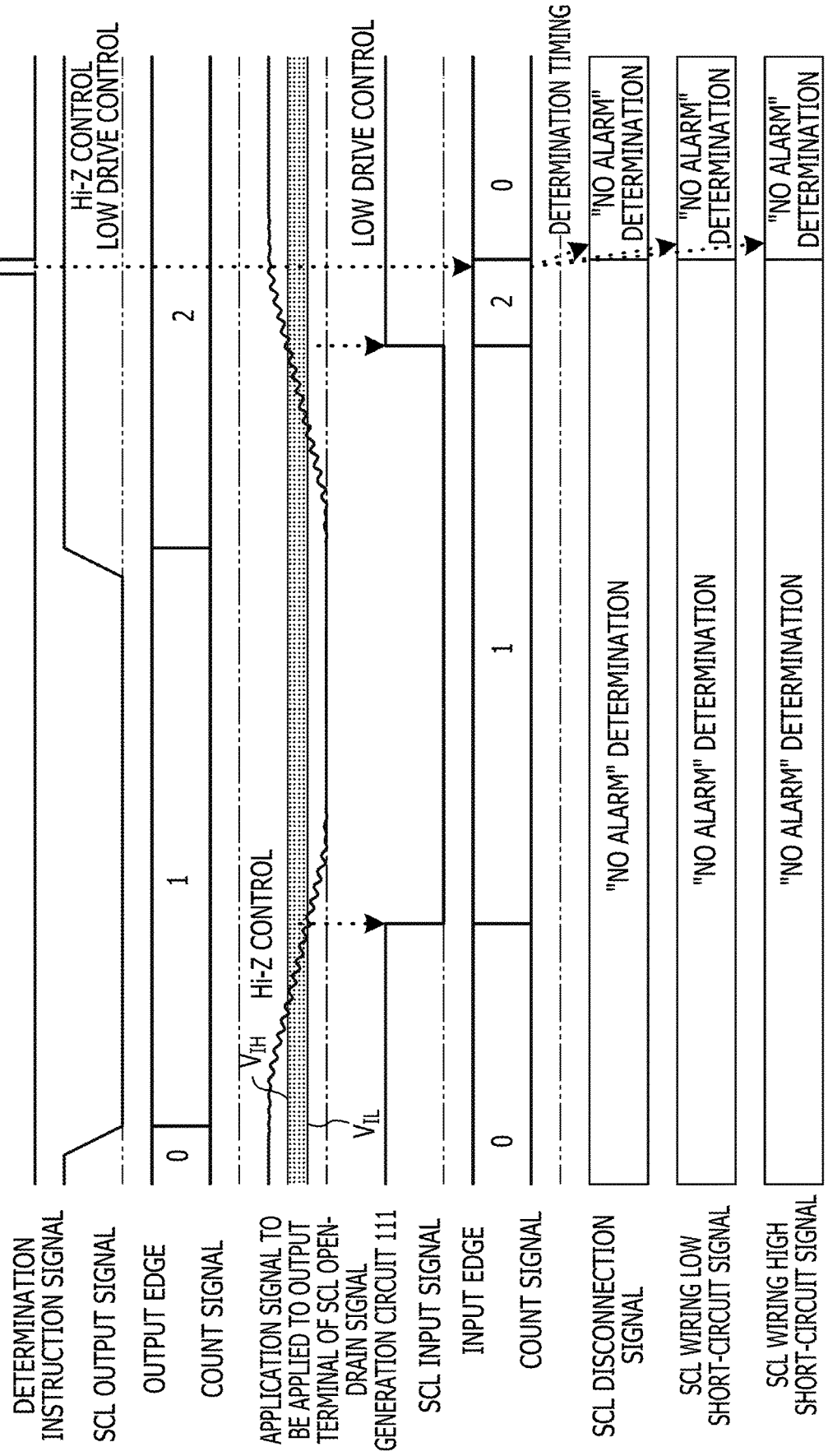
FIG. 30 is a diagram illustrating a timing chart of how signals change over time in a case where no failure occurs in an SCL transmission path in the fifth embodiment.

FIG. 30 is a diagram illustrating a timing chart of how signals change over time in a case where no failure occurs in an SCL transmission path in the fifth embodiment.

While no failure occurs in the SCL transmission path, the output edge waveform information obtaining circuit 70 sets the output edge count signal at "2" in response to a transition of the SCL output signal from "1" to "0" and thereafter from "0" to "1". Meanwhile, the input edge waveform information obtaining circuit 75 sets the input edge count signal at "2" in response of the SCL input signal from "1" to "0" and thereafter from "0" to "1". Since the counted number corresponding to the input edge count signal and the counted number corresponding to the output edge count signal are equal to each other, the failure determination circuit 80 determines that no failure occurs in the SCL transmission path.

Figure 31:
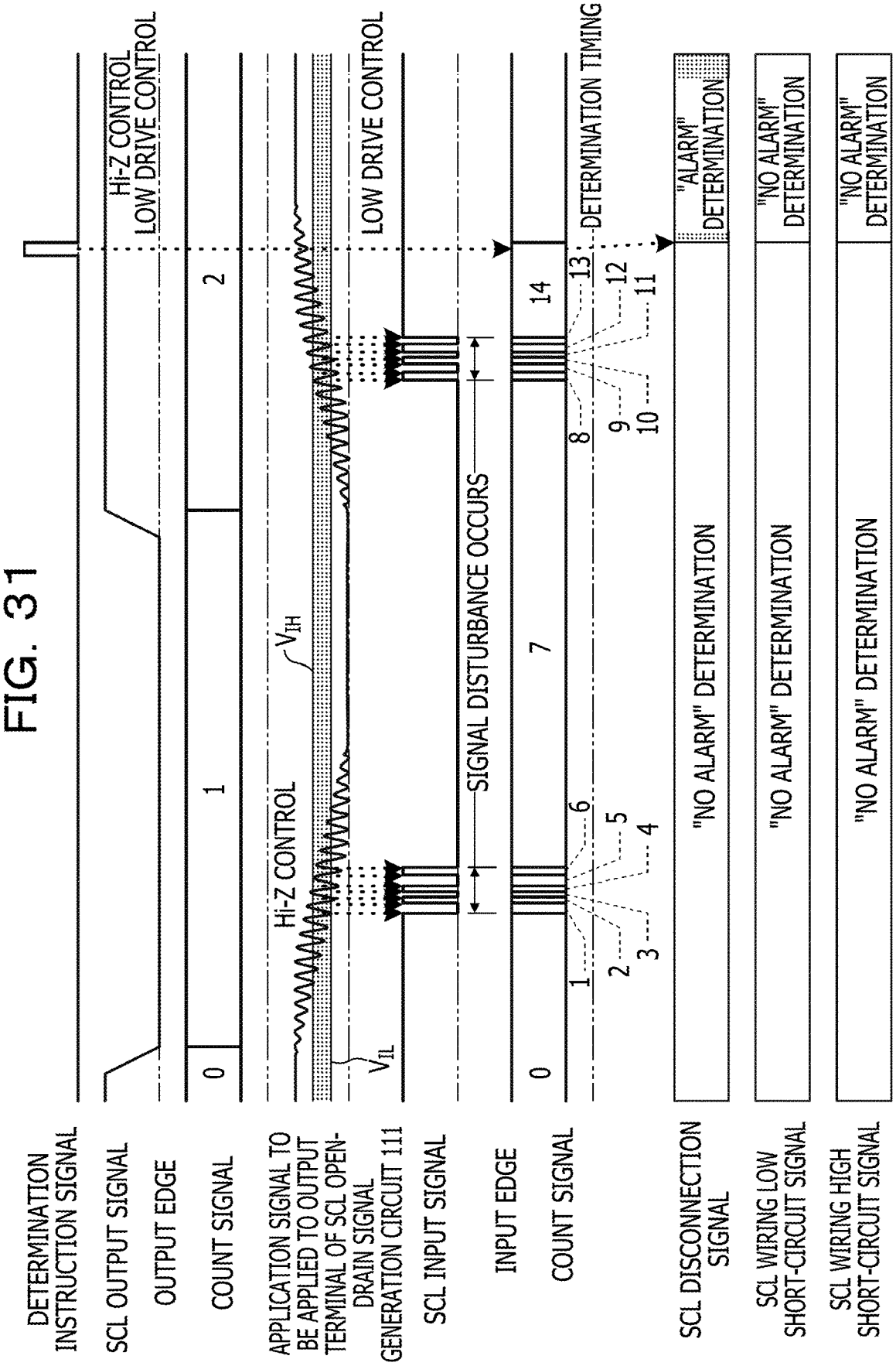
FIG. 31 is a diagram illustrating a timing chart of how the signals change over time in a case where a disconnection failure occurs in the SCL transmission path in the fifth embodiment.

FIG. 31 is a diagram illustrating a timing chart of how the signals change over time in a case where a disconnection failure occurs in the SCL transmission path in the fifth embodiment.

The output edge waveform information obtaining circuit 70 sets the output edge count signal at "2" in response to a transition of the SCL output signal from "1" to "0" and thereafter from "0" to "1". Meanwhile, the SCL input signal transits back and forth between "0" and "1" several times, the input edge waveform information obtaining circuit 75 sets the input edge count signal representing the counted number of rising edges of the SCL input signal at "14". Since the counted number corresponding to the input edge count signal is greater than the count number corresponding to the output edge count signal, the failure determination circuit 80 determines that a disconnection failure occurs in the SCL transmission path, and outputs an SCL disconnection signal.

Figure 32:
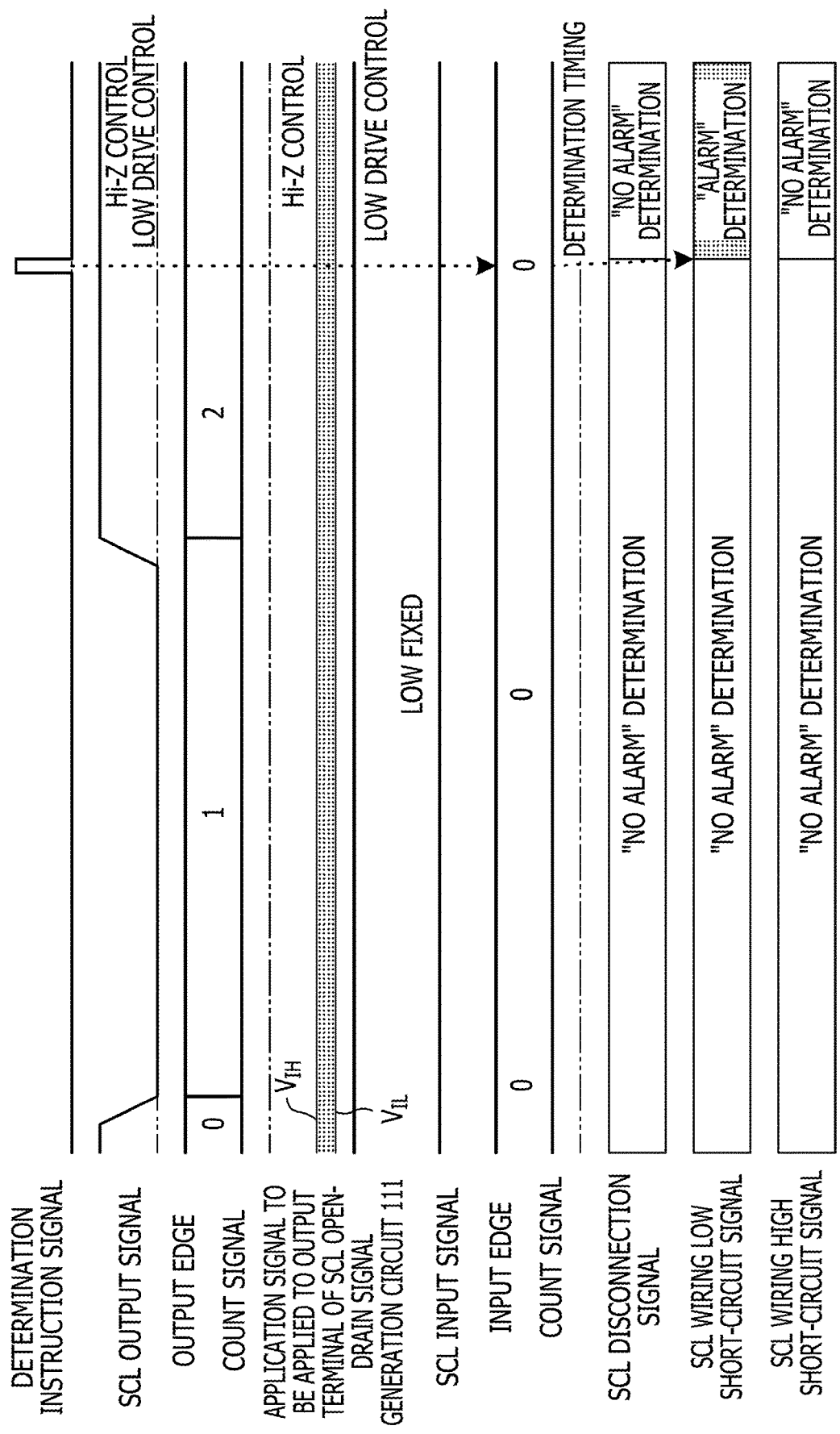
FIG. 32 is a diagram illustrating a timing chart of how the signals change over time in a case where a low short-circuit failure occurs in the SCL transmission path in the fifth embodiment.

FIG. 32 is a diagram illustrating a timing chart of how the signals change over time in a case where a low short-circuit failure occurs in the SCL transmission path in the fifth embodiment.

The output edge waveform information obtaining circuit 70 sets the output edge count signal at "2" in response to a transition of the SCL output signal from "1" to "0" and thereafter from "0" to "1". Meanwhile, since a low short-circuit failure occurs in the SCL transmission path, the input edge waveform information obtaining circuit 75 holds the input edge count signal representing the counted number of rising edges of the SCL input signal at "0". Since the counted number of edges is "0" and the SCL input signal is at "0", the failure determination circuit 80 determines that a low short-circuit failure occurs in the SCL transmission path, and outputs an SCL wiring low short-circuit signal.

Figure 33:
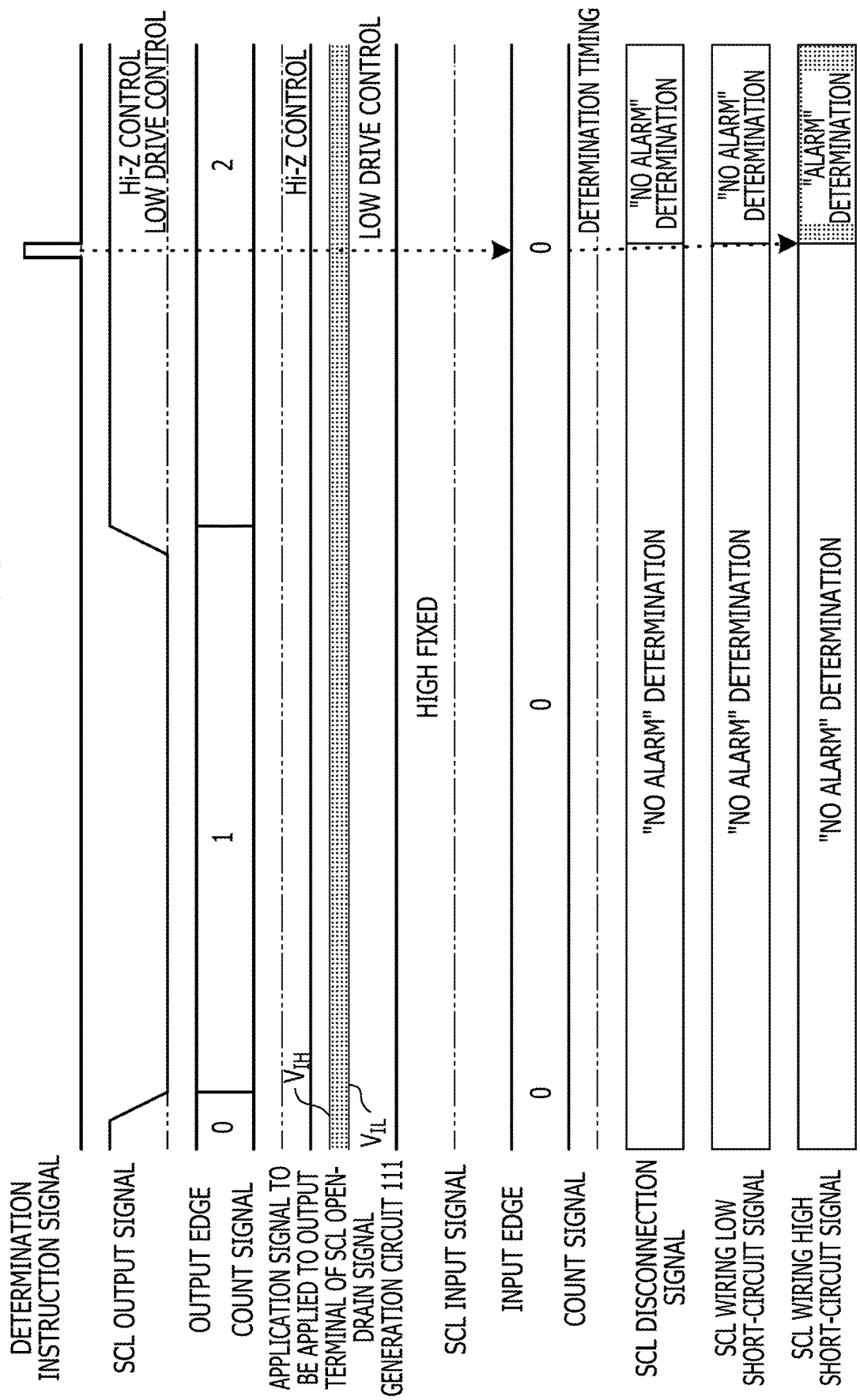
FIG. 33 is a diagram illustrating a timing chart of how the signals change over time in a case where a high short-circuit failure occurs in the SCL transmission path in the fifth embodiment.

FIG. 33 is a diagram illustrating a timing chart of how the signals change over time in a case where a high short-circuit failure occurs in the SCL transmission path in the fifth embodiment.

The output edge waveform information obtaining circuit 70 sets the output edge count signal at "2" in response to the transition of the SCL output signal from "1" to "0" and thereafter from "0" to "1". Meanwhile, since a high short-circuit failure occurs in the SCL transmission path, the input edge waveform information obtaining circuit 75 holds the input edge count signal representing the counted number of rising edges of the SCL input signal at "0". Since the counted number of edges is "0" and the SCL input signal is at "1", the failure determination circuit 80 determines that a high short-circuit failure occurs in the SCL transmission path, and outputs an SCL wiring high short-circuit signal.

The SDA transmission path failure determination circuit 16 has the same configuration as the SCL transmission path failure determination circuit 15, and detailed descriptions are omitted herein.

(Transmission Apparatus According to Six Embodiment)

Figure 34:
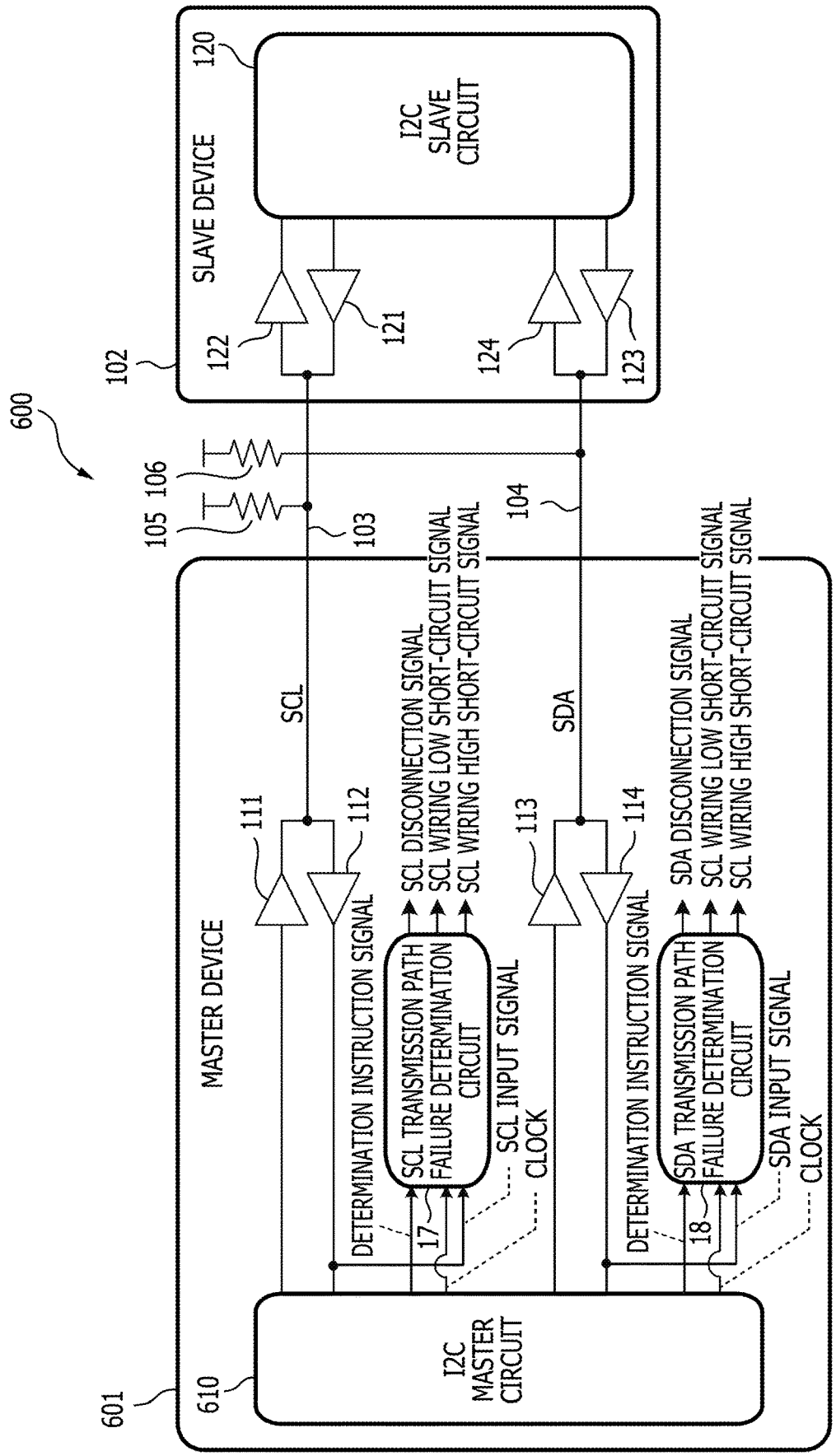
FIG. 34 is a diagram illustrating a communication system which includes a transmission apparatus according to a sixth embodiment.

FIG. 34 is a diagram illustrating a communication system which includes a transmission apparatus according to a sixth embodiment.

A communication system 600 is different from the communication system 500 in that the communication system 600 includes a master device 601 instead of the master device 501. The master device 601 is different from the master device 501 in that the master device 601 includes an SCL transmission path failure determination circuit 17 and an SDA transmission path failure determination circuit 18 instead of the SCL transmission path failure determination circuit 15 and the SDA transmission path failure determination circuit 16. Except for the SCL transmission path failure determination circuit 17 and the SDA transmission path failure determination circuit 18, the components of the communication system 600 have the same configurations and functions as those of the communication system 500 which are denoted by the same reference signs, and detailed descriptions are omitted.

Figure 35:
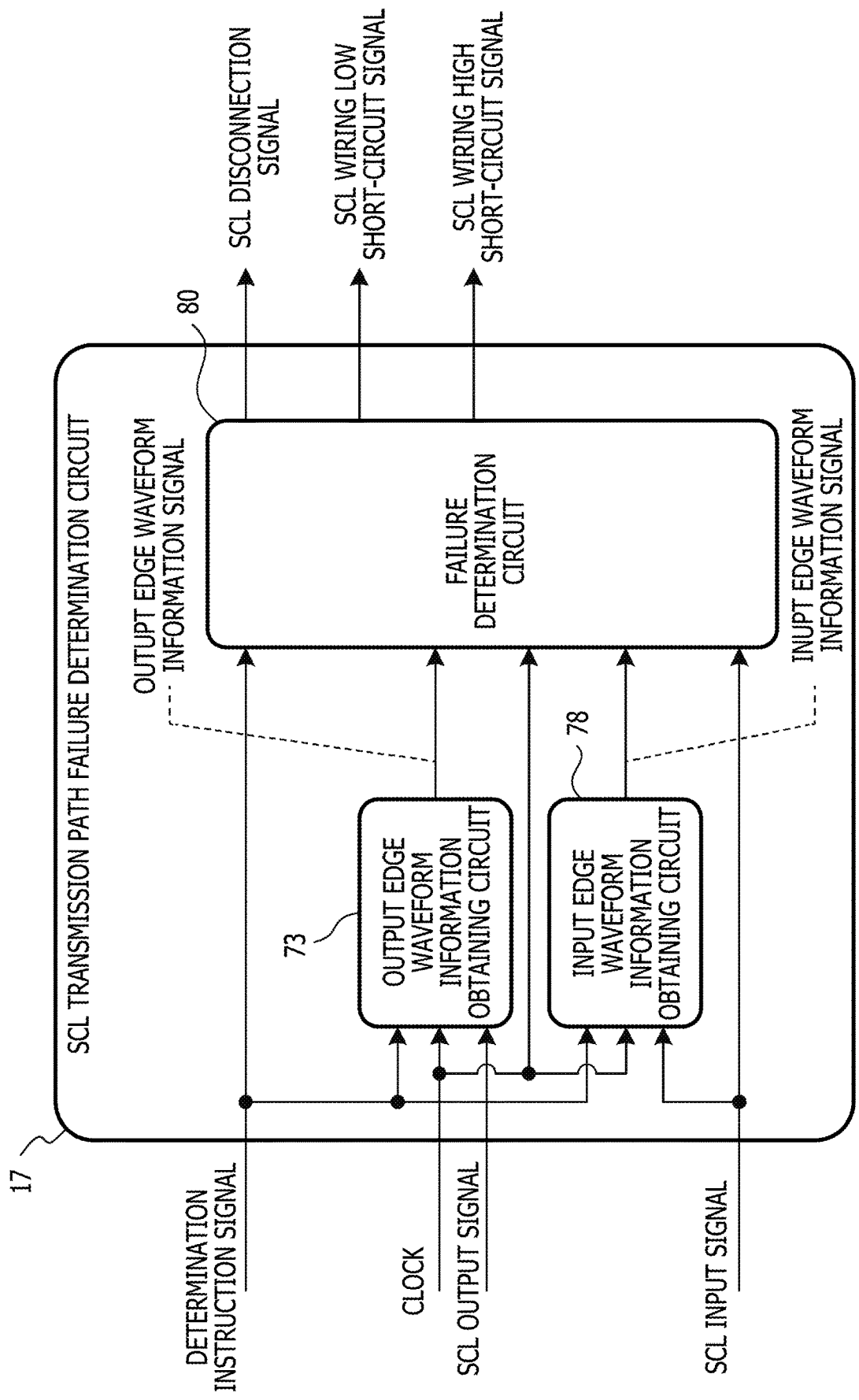
FIG. 35 is a diagram illustrating an SCL transmission path failure determination circuit illustrated in FIG. 34.

FIG. 35 is a diagram illustrating the SCL transmission path failure determination circuit 17.

The SCL transmission path failure determination circuit 17 is different from the SCL transmission path failure determination circuit 15 in that the SCL transmission path failure determination circuit 17 includes an output edge waveform information obtaining circuit 73 and an input edge waveform information obtaining circuit 78 instead of the output edge waveform information obtaining circuit 70 and the input edge waveform information obtaining circuit 75.

The output edge waveform information obtaining circuit 73 counts the number of rising edges of the waveform of the SCL output signal outputted from the I2C master circuit 510, and outputs an output edge count signal representing the counted number. The output edge count signal is first edge waveform information representing the counted number of rising edges of the output signal outputted from the I2C master circuit 510.

The input edge waveform information obtaining circuit 78 counts the number of rising edges of the waveform of the SCL input signal inputted into the I2C master circuit 510, and outputs an input edge count signal representing the counted number. The input edge count signal is second edge waveform information representing the counted number of rising edges of the input signal inputted into the I2C master circuit 510.

The failure determination circuit 80 determines whether the counted number corresponding to the output edge count signal and the counted number corresponding to the input edge count signal are equal to each other. When the failure determination circuit 80 determines that the counted number corresponding to the output edge count signal and the counted number corresponding to the input edge count signal are not equal to each other, the failure determination circuit 80 outputs a failure signal.

Figure 36A:
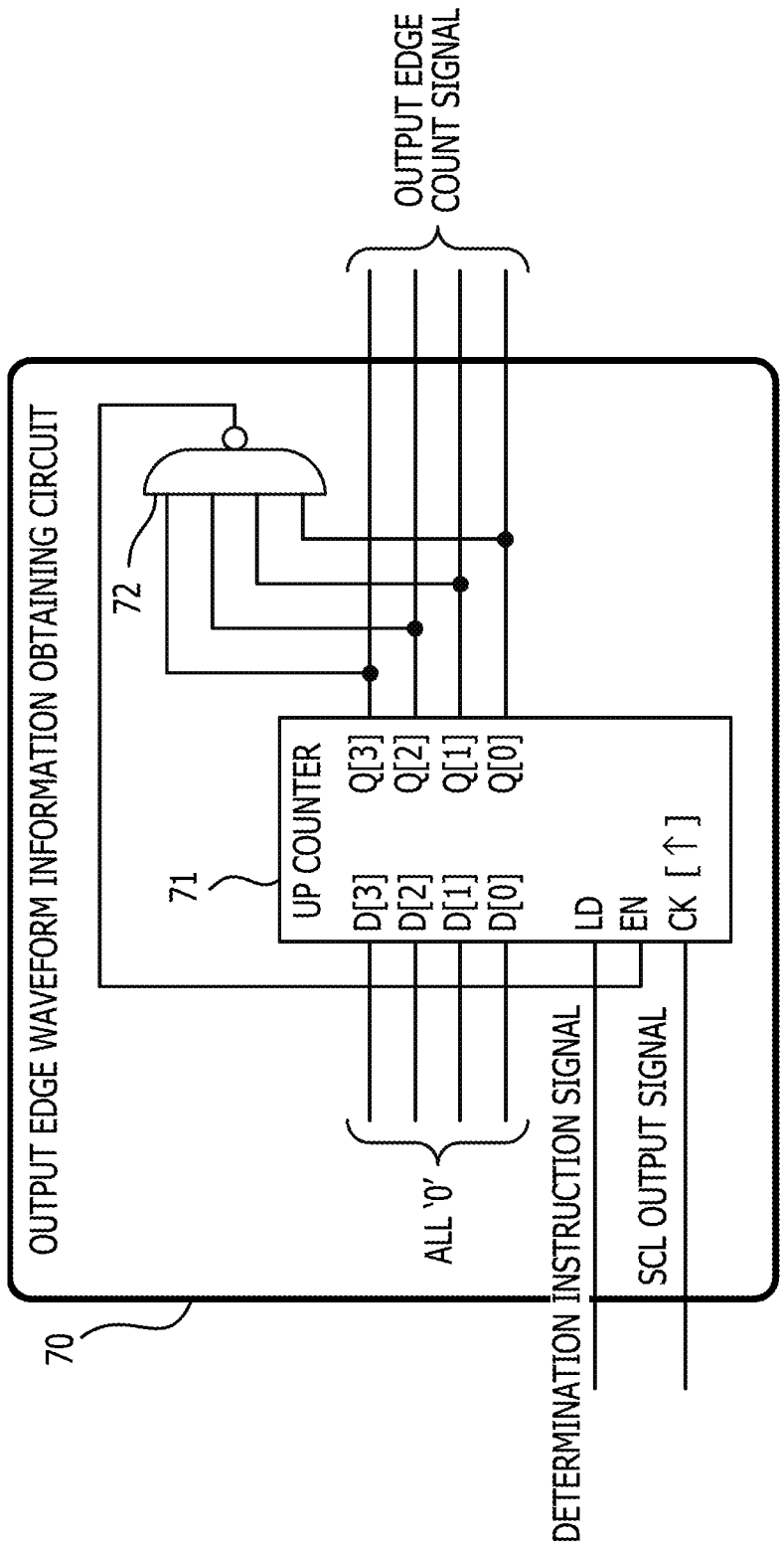
FIG. 36A is a diagram illustrating an output edge waveform information obtaining circuit illustrated in FIG. 35.
Figure 36B:
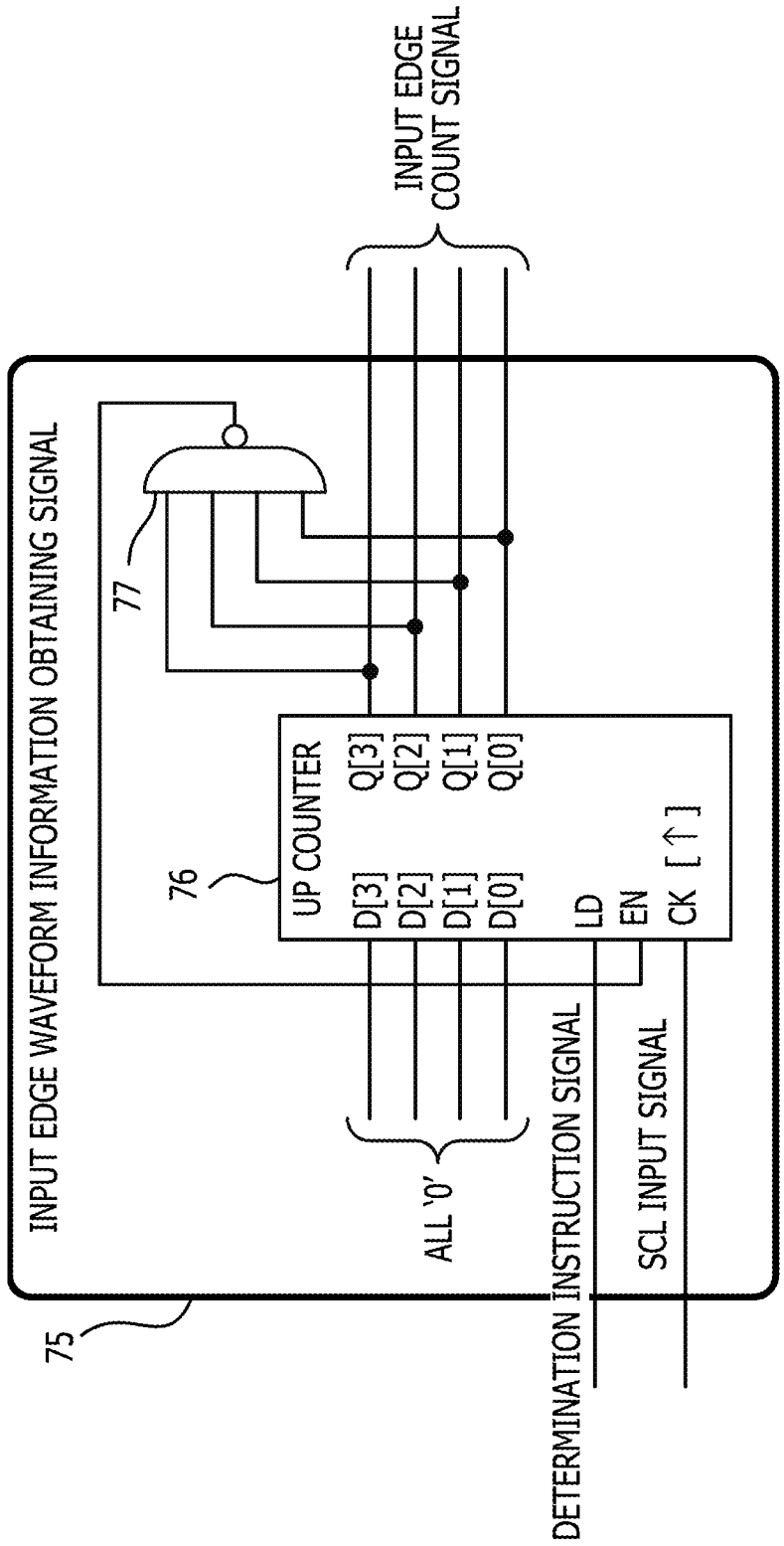
FIG. 36B is a diagram illustrating an input edge waveform information obtaining circuit illustrated in FIG. 35.

FIG. 36A is a diagram illustrating the output edge waveform information obtaining circuit 73. FIG. 36B is a diagram illustrating the input edge waveform information obtaining circuit 78.

The output edge waveform information obtaining circuit 73 is different from the output edge waveform information obtaining circuit 70 in that the output edge waveform information obtaining circuit 73 includes a 4-bit up-counter 74 instead of the up-counter 71. The output edge waveform information obtaining circuit 73 counts the number of rising edges of the waveform of the SCL output signal, and outputs an output edge count signal representing the counted number.

The input edge waveform information obtaining circuit 78 is different from the input edge waveform information obtaining circuit 75 in that the input edge waveform information obtaining circuit 78 includes a 4-bit up-counter 79 instead of the up-counter 76. The input edge waveform information obtaining circuit 78 counts the number of rising edges of the waveform of the SCL input signal, and outputs an input edge count signal representing the counted number.

FIG. 37 is a diagram illustrating a timing chart of how signals change over time in a case where no failure occurs in an SCL transmission path in the sixth embodiment.

While no failure occurs in the SCL transmission path, the output edge waveform information obtaining circuit 73 sets the output edge count signal at "1" in response to a transition of the SCL output signal from "0" to "1". Meanwhile, the input edge waveform information obtaining circuit 78 sets the input edge count signal at "1" in response of a transition of the SCL input signal from "0" to "1". Since the counted number corresponding to the input edge count signal and the counted number corresponding to the output edge count signal are equal to each other, the failure determination circuit 80 determines that no failure occurs in the SCL transmission path.

FIG. 38 is a diagram illustrating a timing chart of how the signals change over time in a case where a disconnection failure occurs in the SCL transmission path in the sixth embodiment.

The output edge waveform information obtaining circuit 73 sets the output edge count signal at "1" in response to a transition of the SCL output signal from "0" to "1". Meanwhile, the SCL input signal transits back and forth between "0" and "1" several times, the input edge waveform information obtaining circuit 78 sets the input edge count signal representing the counted number of rising edges of the SCL input signal at "7". Since the counted number corresponding to the input edge count signal is greater than the count number corresponding to the output edge count signal, the failure determination circuit 80 determines that a disconnection failure occurs in the SCL transmission path, and outputs an SCL disconnection signal.

FIG. 39 is a diagram illustrating a timing chart of how the signals change over time in a case where a low short-circuit failure occurs in the SCL transmission path in the sixth embodiment.

The output edge waveform information obtaining circuit 73 sets the output edge count signal at "1" in response to a transition of the SCL output signal from "0" to "1". Meanwhile, since a low short-circuit failure occurs in the SCL transmission path, the input edge waveform information obtaining circuit 78 holds the input edge count signal representing the counted number of rising edges of the SCL input signal at "0". Since the counted number of edges is "0" and the SCL input signal is at "0", the failure determination circuit 80 determines that a low short-circuit failure occurs in the SCL transmission path, and outputs an SCL wiring low short-circuit signal.

Figure 40:
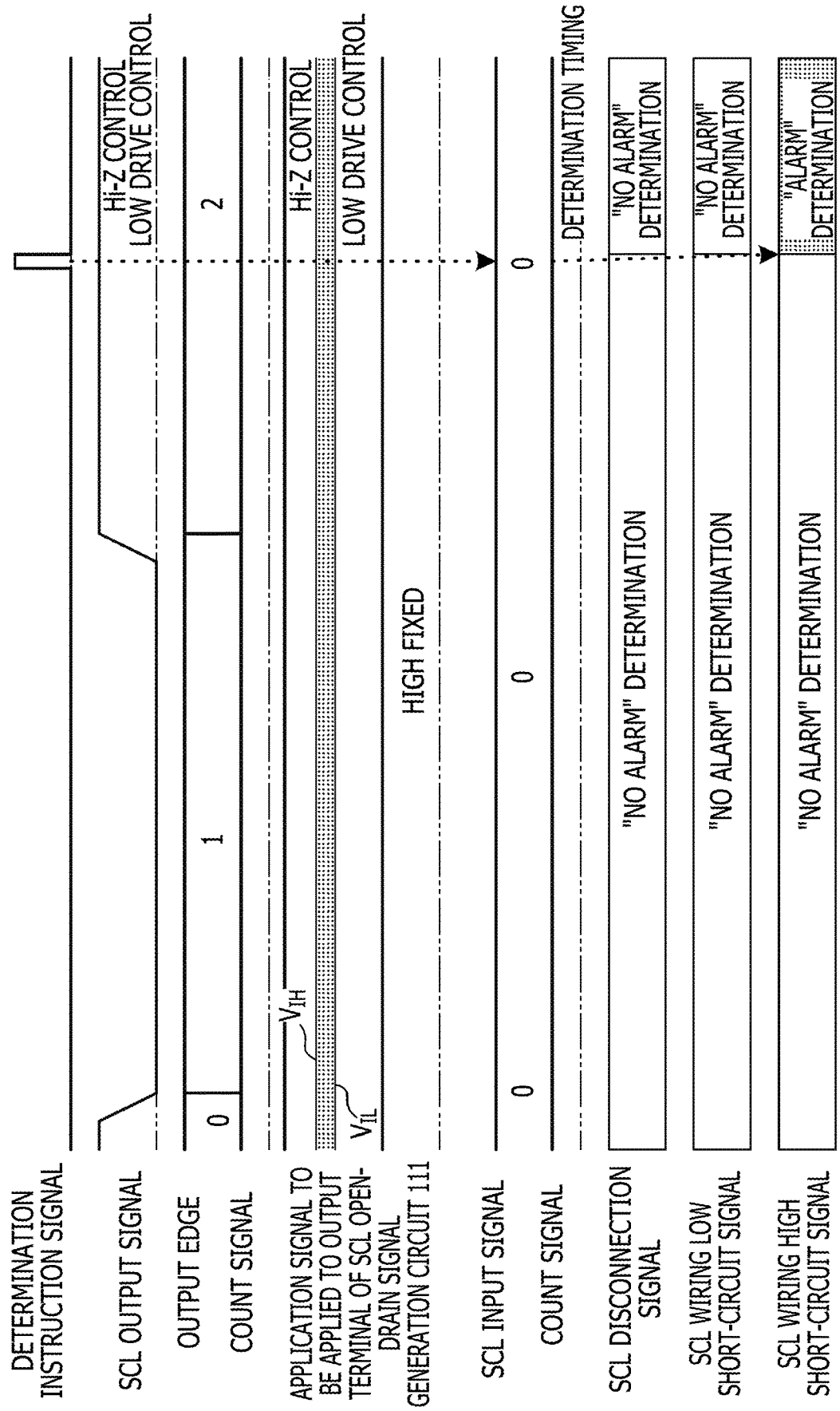
FIG. 40 is a diagram illustrating a timing chart of how the signals change over time in a case where a high short-circuit failure occurs in the SCL transmission path in the sixth embodiment.

FIG. 40 is a diagram illustrating a timing chart of how the signals change over time in a case where a high short-circuit failure occurs in the SCL transmission path in the sixth embodiment.

The output edge waveform information obtaining circuit 73 sets the output edge count signal at "1" in response to a transition of the SCL output signal from "0" to "1". Meanwhile, since a high short-circuit failure occurs in the SCL transmission path, the input edge waveform information obtaining circuit 78 holds the edge count signal representing the counted number of rising edges of the SCL input signal at "0". Since the counted number of edges is "0" and the SCL input signal is at "1", the failure determination circuit 80 determines that a high short-circuit failure occurs in the SCL transmission path, and outputs an SCL wiring high short-circuit signal.

The SDA transmission path failure determination circuit 18 has the same configuration as the SCL transmission path failure determination circuit 17, and detailed descriptions are omitted herein.

(Working and Effects of Transmission Apparatuses According to Embodiments)

The transmission apparatuses according to the embodiments are each capable of detecting a failure in each transmission path by determining whether there is a failure in the transmission path based on a state of an open-drain output signal in the transmission path in a communication method of transmitting and receiving the open-drain output signal.

The transmission apparatuses according to the embodiments are each capable of determining whether there is a failure in each transmission path without generating a signal dedicated to a failure detection, because of their use of the edge waveform information about the waveform of the changing edge of the application signal applied to the output terminal from which to output an open-drain output signal.

The transmission apparatuses according to the first to fourth embodiments are each capable of determining whether there is a failure in each transmission path by counting the number of changes in the edge of the application signal applied to the output terminal from which to output an open-drain output signal. This makes it possible to simplify the circuit configuration of failure determination circuit.

The transmission apparatuses according to the fifth and sixth embodiments each determine whether there is a failure in each transmission path by counting the number of changes in the edge of a signal which is transmitted from or received by the transmission apparatus. Accordingly, the transmission apparatuses according to the fifth and sixth embodiments are each capable of making the length of each period of performing the failure determination process longer than the transmission apparatuses according to the first to fourth embodiments. For this reason, the transmission apparatuses according to the fifth and sixth embodiments are each capable of making the power consumption for the failure determination process smaller than the transmission apparatuses according to the first to fourth embodiments.

(Modifications of Transmission Apparatuses According to Embodiments)

In the above discussed transmission apparatus according to each embodiment, the transmission path failure determination circuits are installed in the master device. In the transmission apparatus according to each embodiment, the transmission path failure determination circuits do not necessarily have to be installed in the master device. However, in a case where the transmission path failure determination circuits are not installed in the master device, it is difficult to determine where a failure occurs in the transmission paths between the master device and the transmission path failure determination circuits, in the SCL transmission path, or in the SDA transmission path. For this reason, it is desirable that the transmission path failure determination circuits are installed in the master device.

The circuits installed in the transmission apparatus according to any one of the embodiments are not limited to those in the transmission apparatus according to the foregoing embodiment. For example, the failure determination circuit 30 may be replaced with a different circuit which realizes the same working as the failure determination circuit 30.

Figure 41:
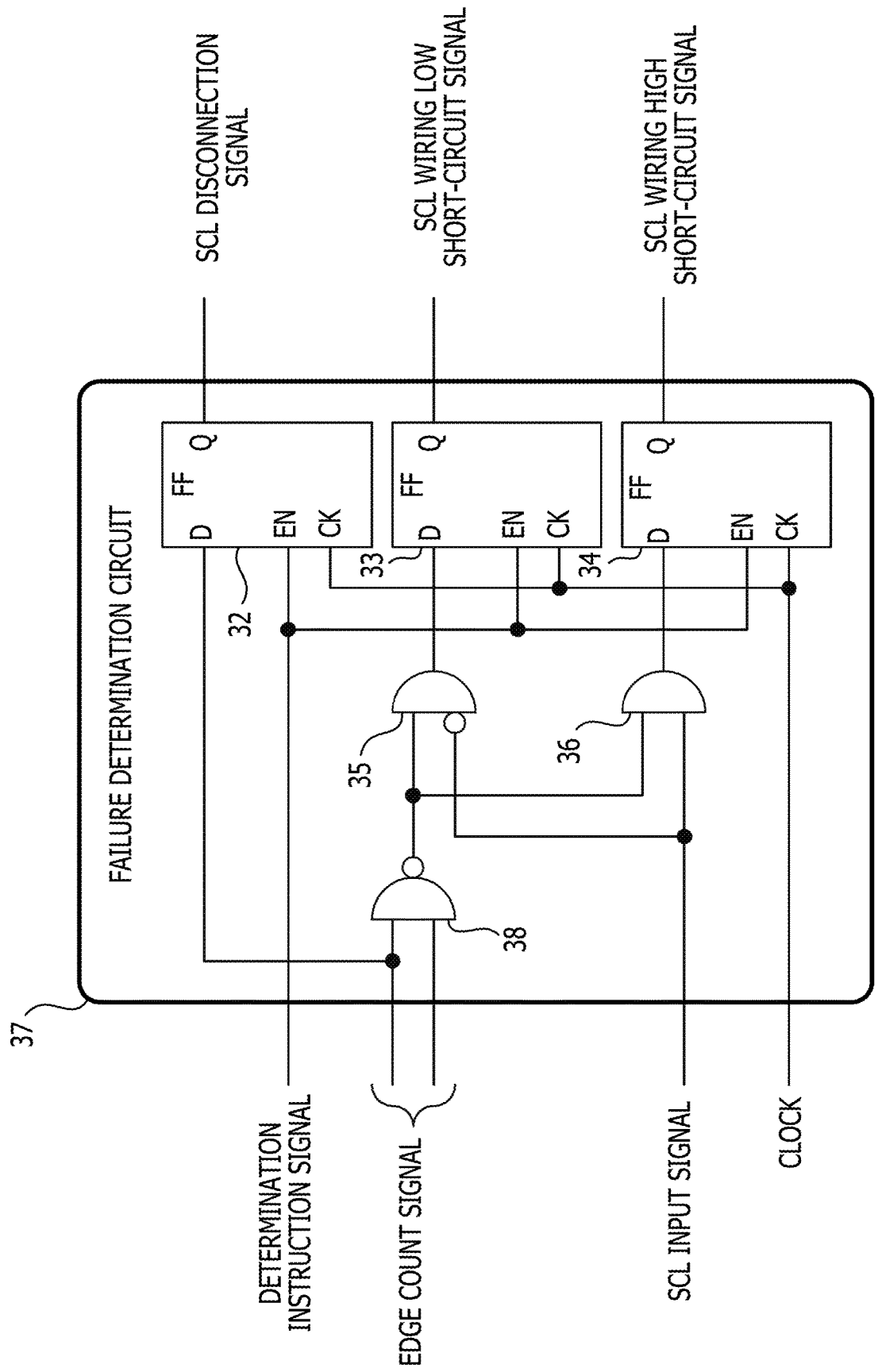
FIG. 41 is a diagram illustrating a modification of the failure determination circuit illustrated in FIG. 3.

FIG. 41 is a diagram illustrating a modification of the failure determination circuit 30.

A failure determination circuit 37 is different from the failure determination circuit 30 in that the failure determination circuit 37 includes a third determination NAND element 38 instead of the comparator 31. Upper bits of the edge count signal are inputted into the data input terminal of the first determination flip-flop 32.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transmission apparatus comprising:
    a logic circuit configured to perform a predetermined process, and output a logic output signal depending on the process;
    an open-drain signal generation circuit connectable at an input terminal to the logic circuit and at an output terminal to a pull-up resistor and configured to output an output signal representing "0" when the logic output signal representing "0" is inputted into the input terminal from the logic circuit, and output an output signal representing Hi-Z when the logic output signal representing "1" is inputted into the input terminal from the logic circuit;
    a signal line coupled to the open-drain signal generation circuit and a transmission path which transmits the output signal to another transmission apparatus; and
    a transmission path failure determination circuit configured to determine whether there is a failure in the transmission path, wherein the transmission path failure determination circuit includes an edge waveform information obtaining circuit for obtaining edge waveform information indicating a waveform of at least one of a rising edge and a falling edge of an application signal which is applied to the output terminal of the open-drain signal generation circuit, and a failure determination circuit for determining whether the edge waveform information satisfies a predetermined condition, and outputting a failure signal indicating that there is a failure in the transmission path when determining that the edge waveform information does not satisfy the predetermined condition.

2. The transmission apparatus according to claim 1, wherein the edge waveform information obtaining circuit includes an edge counter for counting at least one of the number of rising edges and the number of falling edges of the application signal, and obtaining the counted number as the edge waveform information.

3. The transmission apparatus according to claim 2, wherein the failure determination circuit obtains the counted number as the edge waveform information, in response to at least one of a rising edge and a falling edge of the logic output signal, determines whether the counted number is equal to "1", and outputs the failure signal when the failure determination circuit determines that the counted number is not equal to "1".

4. The transmission apparatus according to claim 1, wherein the edge waveform information obtaining circuit includes a first edge counter for counting at least one of the number of rising edges and the number of falling edges of the logic output signal, and obtaining the counted number as first edge waveform information, and a second edge counter for counting at least one of the number of rising edges and the number of falling edges of the application signal, and obtaining the counted number as second edge waveform information, and the failure determination circuit obtains the first edge waveform information and the second edge waveform information, determines whether the counted number corresponding to the first edge waveform information is equal to the counted number corresponding to the second edge waveform information, and outputs the failure signal when the edge waveform information obtaining circuit determines that the counted number corresponding to the first edge waveform information is not equal to the counted number corresponding to the second edge waveform information.

5. The transmission apparatus according to claim 1, wherein the transmission path failure determination circuit further includes a determination instruction signal generation circuit including an edge detection circuit for detecting at least one of a rising edge and a falling edge of the logic output signal, and outputting an edge detection signal, and a delay circuit for outputting a determination instruction signal by delaying the edge detection signal, and the failure determination circuit determines whether the edge waveform information satisfies the predetermined condition, in response to input of the determination instruction signal into the failure determination circuit.

6. A transmission method comprising:
performing, by a logic circuit in a transmission apparatus, a predetermined process to output a logic output signal depending on the process;
outputting, by an open-drain signal generation circuit connectable at an input terminal to the logic circuit and at an output terminal to a pull-up resistor, an output signal representing "0" when the logic output signal representing "0" is inputted into the input terminal from the logic circuit, and outputting an output signal representing Hi-Z when the logic output signal representing "1" is inputted into the input terminal from the logic circuit, the output signal being transmitted in a signal line coupled to the open-drain signal generation circuit and a transmission path which transmits the output signal to another transmission apparatus; and
determining, by a transmission path failure determination circuit, whether there is a failure in the transmission path,
wherein the determining includes:
obtaining edge waveform information indicating a waveform of at least one of a rising edge and a falling edge of an application signal which is applied to the output terminal of the open-drain signal generation circuit;
deciding whether the edge waveform information satisfies a predetermined condition; and
outputting a failure signal indicating that there is a failure in the transmission path when deciding that the edge waveform information does not satisfy a predetermined condition.

7. The transmission method according to claim 6, wherein the determining includes:
counting at least one of the number of rising edges and the number of falling edges of the application signal; and
obtaining the counted number as the edge waveform information.

8. The transmission method according to claim 7, wherein the determining includes:
obtaining the counted number as the edge waveform information, in response to at least one of a rising edge and a falling edge of the logic output signal;
detecting whether the counted number is equal to "1"; and
outputting the failure signal when detecting that the counted number is not equal to "1".

9. The transmission method according to claim 6, wherein the determining includes:
counting at least one of the number of rising edges and the number of falling edges of the logic output signal;
obtaining the counted number as first edge waveform information;
counting at least one of the number of rising edges and the number of falling edges of the application signal;
obtaining the counted number as second edge waveform information;
determining whether the counted number corresponding to the first edge waveform information is equal to the counted number corresponding to the second edge waveform information; and
outputting the failure signal when determining that the counted number corresponding to the first edge waveform information is not equal to the counted number corresponding to the second edge waveform information.

10. The transmission method according to claim 6, wherein the determining includes:
detecting at least one of a rising edge and a falling edge of the logic output signal;
outputting an edge detection signal;
outputting a determination instruction signal by delaying the edge detection signal; and
determining whether the edge waveform information satisfies the predetermined condition, in response to input of the determination instruction signal.

* * * * *